(12) United States Patent
Amano et al.

(10) Patent No.: US 11,935,784 B2
(45) Date of Patent: Mar. 19, 2024

(54) THREE-DIMENSIONAL MEMORY DEVICE CONTAINING SELF-ALIGNED BIT LINE CONTACTS AND METHODS FOR FORMING THE SAME

(71) Applicant: SANDISK TECHNOLOGIES LLC, Addison, TX (US)

(72) Inventors: Fumitaka Amano, Yokkaichi (JP); Yusuke Osawa, Yokkaichi (JP); Kensuke Ishikawa, Yokkaichi (JP); Mitsuteru Mushiga, Yokkaichi (JP); Motoki Kawasaki, Yokkaichi (JP); Shinsuke Yada, Yokkaichi (JP); Masato Miyamoto, Yokkaichi (JP); Syo Fukata, Yokkaichi (JP); Takashi Kashimura, Yokkaichi (JP); Shigehiro Fujino, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 400 days.

(21) Appl. No.: 17/345,315

(22) Filed: Jun. 11, 2021

(65) Prior Publication Data

US 2022/0399232 A1    Dec. 15, 2022

(51) Int. Cl.
*H01L 21/768*   (2006.01)
*H01L 23/00*    (2006.01)
(Continued)

(52) U.S. Cl.
CPC ...... *H01L 21/76897* (2013.01); *H01L 23/535* (2013.01); *H01L 24/08* (2013.01);
(Continued)

(58) Field of Classification Search
CPC ........ H10B 43/27; H10B 41/27; H10B 43/50; H10B 41/35; H10B 43/35; H10B 43/10;
(Continued)

(56) References Cited

U.S. PATENT DOCUMENTS 9,484,296 B2    11/2016   Takahashi et al.
9,515,085 B2    12/2016   Rabkin et al.
(Continued)

OTHER PUBLICATIONS

Hou, L. et al., "Bonded Assembly Containing Bonding Pads Spaced Apart by Polymer Material, and Methods of Forming the Same," U.S. Appl. No. 17/357,040, filed Jun. 24, 2021.
(Continued)

*Primary Examiner* — Telly D Green
(74) *Attorney, Agent, or Firm* — THE MARBURY LAW GROUP PLLC

(57) ABSTRACT

A vertical layer stack including a bit-line-level dielectric layer and an etch stop dielectric layer can be formed over an array region. Bit-line trenches are formed through the vertical layer stack. Bit-line-trench fill structures are formed in the bit-line trenches. Each of the bit-line-trench fill structures includes a stack of a bit line and a capping dielectric strip. At least one via-level dielectric layer can be formed over the vertical layer stack. A bit-line-contact via cavity can be formed through the at least one via-level dielectric layer and one of the capping dielectric strips. A bit-line-contact via structure formed in the bit-line-contact via cavity includes a stepped bottom surface including a top surface of one of the bit lines, a sidewall segment of the etch stop dielectric layer, and a segment of a top surface of the etch stop dielectric layer.

20 Claims, 42 Drawing Sheets

(51) Int. Cl.
| | |
|---|---|
| *H01L 23/535* | (2006.01) |
| *H01L 25/065* | (2023.01) |
| *H01L 25/18* | (2023.01) |
| *H10B 41/27* | (2023.01) |
| *H10B 43/27* | (2023.01) |

(52) U.S. Cl.
CPC .......... *H01L 25/0657* (2013.01); *H01L 25/18* (2013.01); *H10B 41/27* (2023.02); *H10B 43/27* (2023.02); *H01L 2224/08145* (2013.01); *H01L 2924/1431* (2013.01); *H01L 2924/14511* (2013.01)

(58) Field of Classification Search
CPC ........ H10B 43/40; H10B 41/41; H10B 41/10; H10B 41/50; H10B 41/60; H10B 43/20; H01L 21/76816; H01L 21/76834; H01L 23/5226; H01L 21/76807; H01L 23/528; H01L 25/18; H01L 21/0217; H01L 21/02271; H01L 21/0228; H01L 21/7682; H01L 21/76849; H01L 21/76885; H01L 21/76897; H01L 2224/08145; H01L 23/5283; H01L 23/5286; H01L 23/5329; H01L 23/535; H01L 24/08; H01L 25/0657; H01L 29/0649; H01L 29/40117; H01L 29/4234; H01L 2924/1431; H01L 2924/14511
See application file for complete search history.

(56) References Cited

U.S. PATENT DOCUMENTS

| | | | |
|---|---|---|---|
| 9,613,975 B2 | 4/2017 | Huang et al. | |
| 10,115,459 B1 | 10/2018 | Yamada et al. | |
| 10,192,878 B1 | 1/2019 | Tsutsumi et al. | |
| 10,510,738 B2 | 12/2019 | Kim et al. | |
| 10,707,228 B2 | 7/2020 | Yu et al. | |
| 10,734,400 B1 * | 8/2020 | Fukuo | H01L 23/5329 |
| 10,861,873 B2 * | 12/2020 | Kim | G11C 5/063 |
| 10,872,899 B2 * | 12/2020 | Kim | H10B 41/27 |
| 11,121,149 B2 * | 9/2021 | Tanaka | H10B 43/27 |
| 2008/0017989 A1 | 1/2008 | Lee et al. | |
| 2008/0308942 A1 | 12/2008 | Chanda et al. | |
| 2009/0102052 A1 | 4/2009 | Ryu | |
| 2009/0298281 A1 | 12/2009 | Yang et al. | |
| 2015/0091181 A1 | 4/2015 | Li et al. | |
| 2016/0293621 A1 | 10/2016 | Huang et al. | |
| 2017/0125433 A1 | 5/2017 | Ogawa et al. | |
| 2017/0316970 A1 | 11/2017 | Clevenger et al. | |
| 2018/0182668 A1 | 6/2018 | Xie et al. | |
| 2018/0261557 A1 | 9/2018 | Yu et al. | |
| 2019/0221557 A1 | 7/2019 | Kim et al. | |
| 2019/0312035 A1 | 10/2019 | Takuma et al. | |
| 2019/0341360 A1 | 11/2019 | Yu et al. | |
| 2020/0006131 A1 | 1/2020 | Shimabukuro et al. | |
| 2020/0013671 A1 | 1/2020 | Clevenger et al. | |
| 2020/0051995 A1 * | 2/2020 | Tanaka | H10B 41/50 |
| 2020/0066745 A1 | 2/2020 | Yu et al. | |
| 2020/0350494 A1 | 11/2020 | Dutta et al. | |
| 2020/0357811 A1 * | 11/2020 | Kim | H10B 41/35 |
| 2020/0357814 A1 * | 11/2020 | Kim | H10B 43/10 |
| 2021/0090942 A1 | 3/2021 | Yang et al. | |
| 2021/0098029 A1 | 4/2021 | Kim et al. | |
| 2022/0367487 A1 * | 11/2022 | Zhang | H10B 51/20 |

OTHER PUBLICATIONS

Hou, L. et al., "Bonded Assembly Containing Low Dielectric Constant Bonding Dielectric and Methods of Forming the Same," U.S. Appl. No. 17/357,120, filed Jun. 24, 2021.

Endoh et al., "Novel Ultra High Density Memory with a Stacked-Surrounding Gate Transistor (S-SGT) Structured Cell," IEDM Proc. (2001) 33-36.

U.S. Appl. No. 16/722,824, filed Dec. 20, 2019, SanDisk Technologies LLC.

U.S. Appl. No. 16/984,700, filed Aug. 4, 2020, SanDisk Technologies LLC.

U.S. Appl. No. 17/000,934, filed Aug. 24, 2020, SanDisk Technologies LLC.

ISR—Notification of Transmittal of The International Search Report and Written Opinion of the International Searching Authority for International Patent Application No. PCT/US2022/011032, dated May 9, 2022, 9 pages.

* cited by examiner

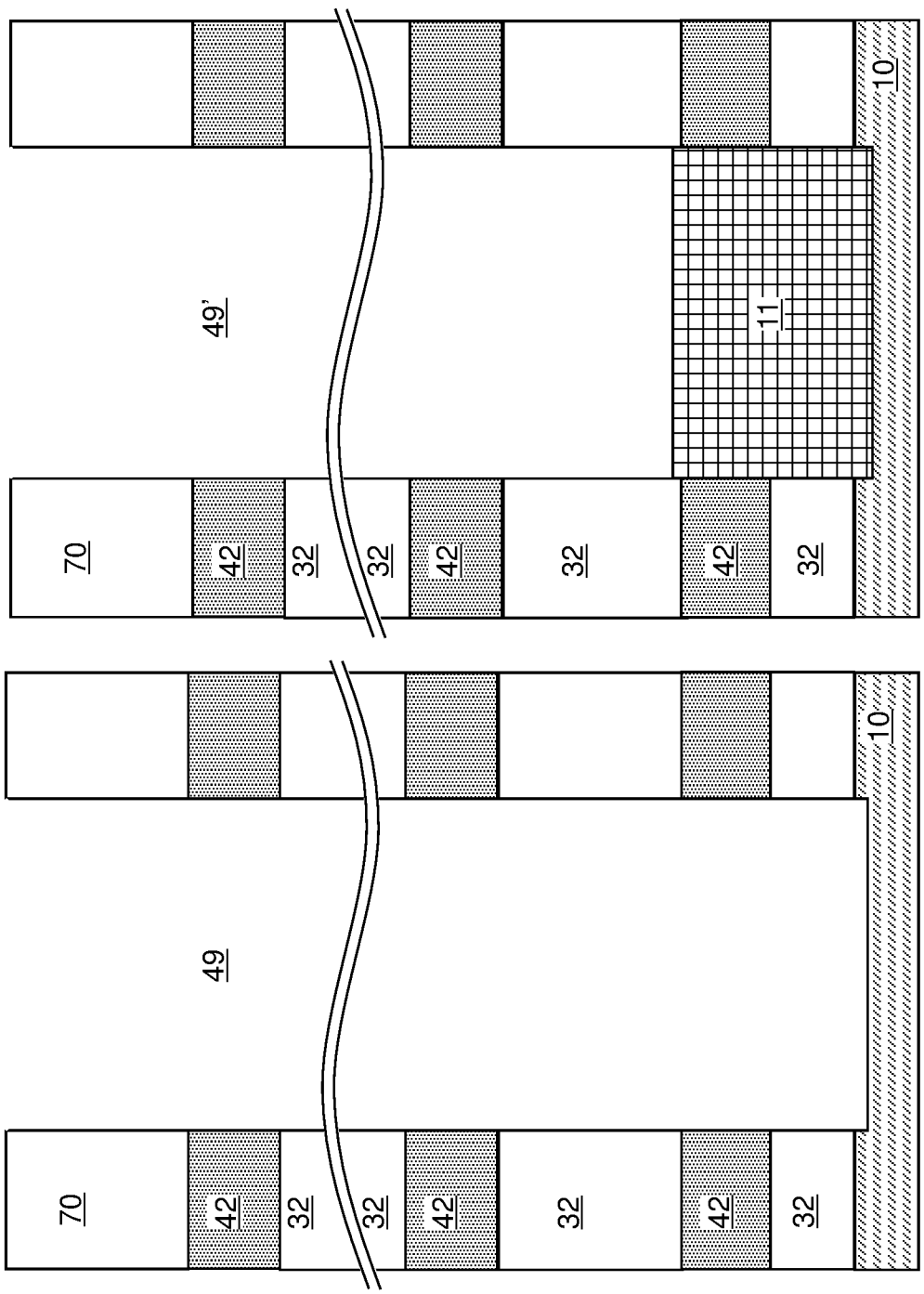

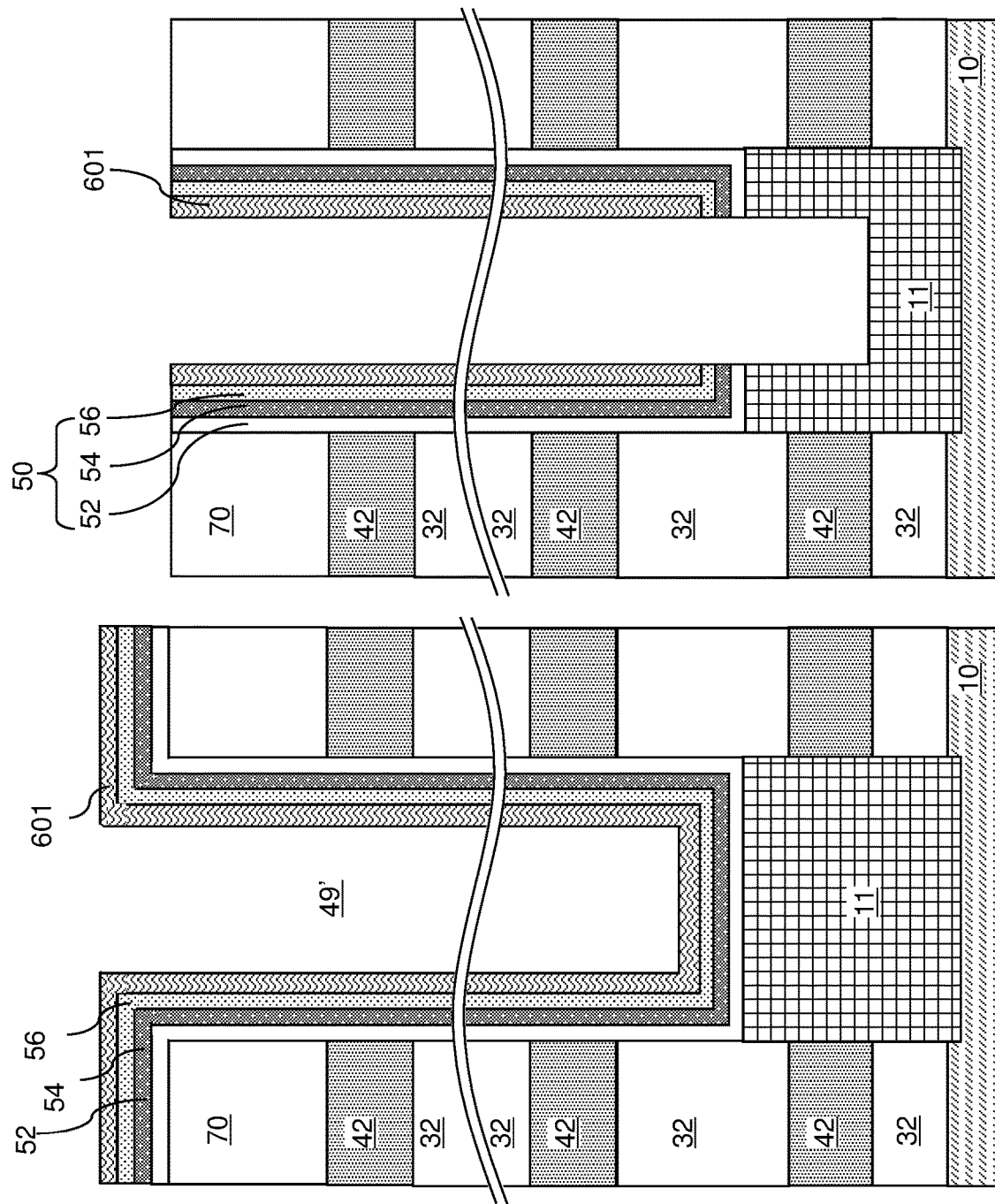

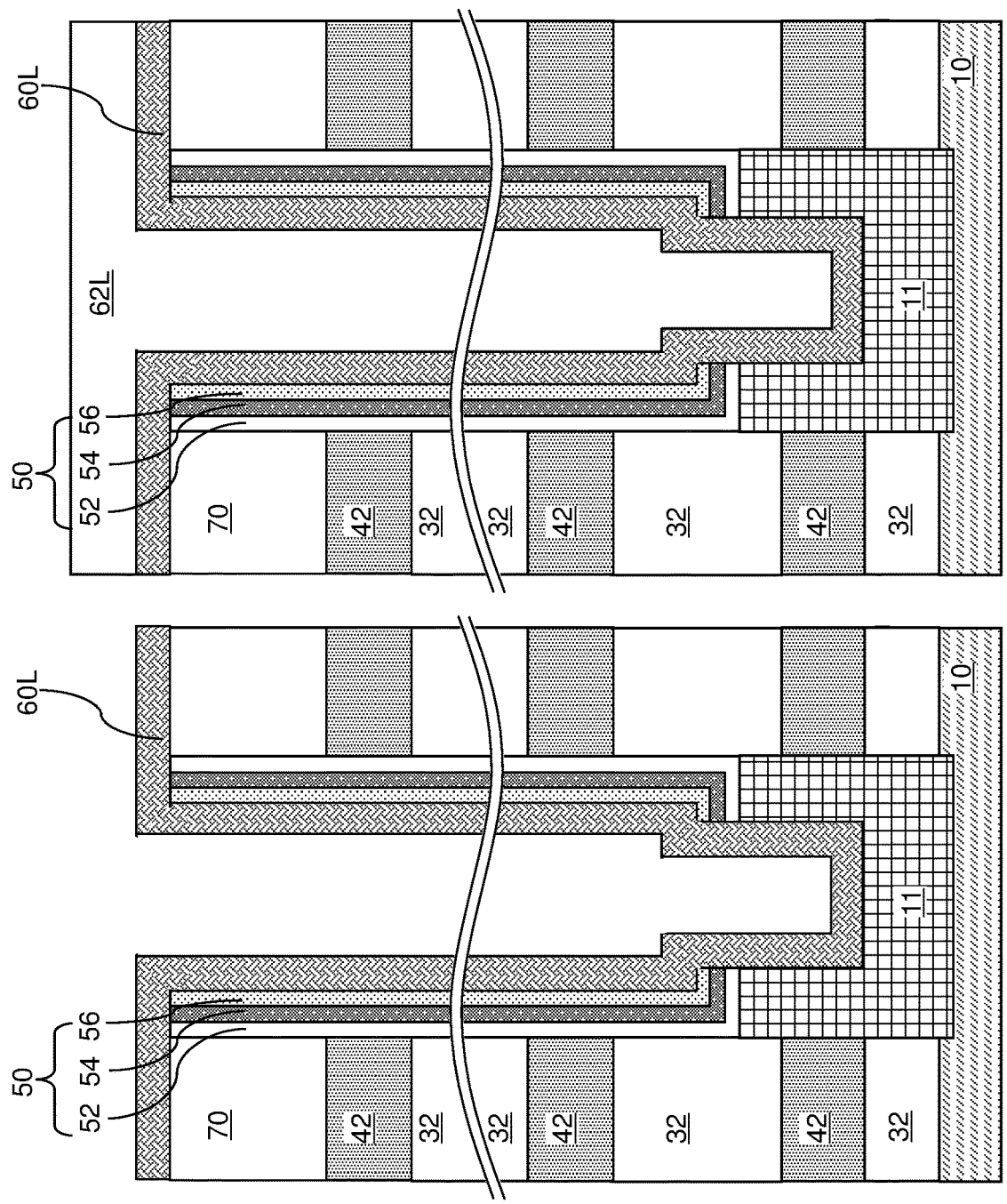

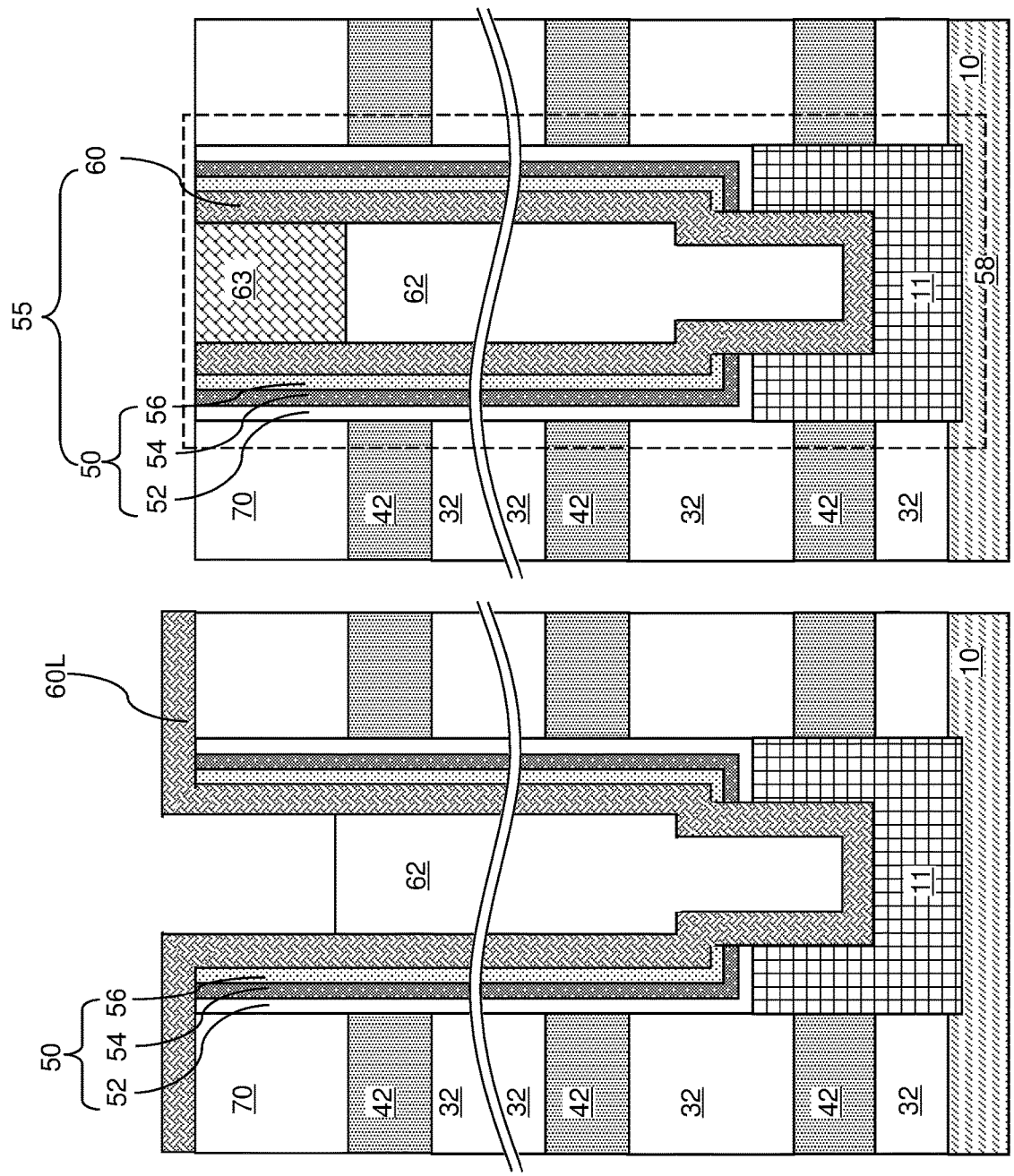

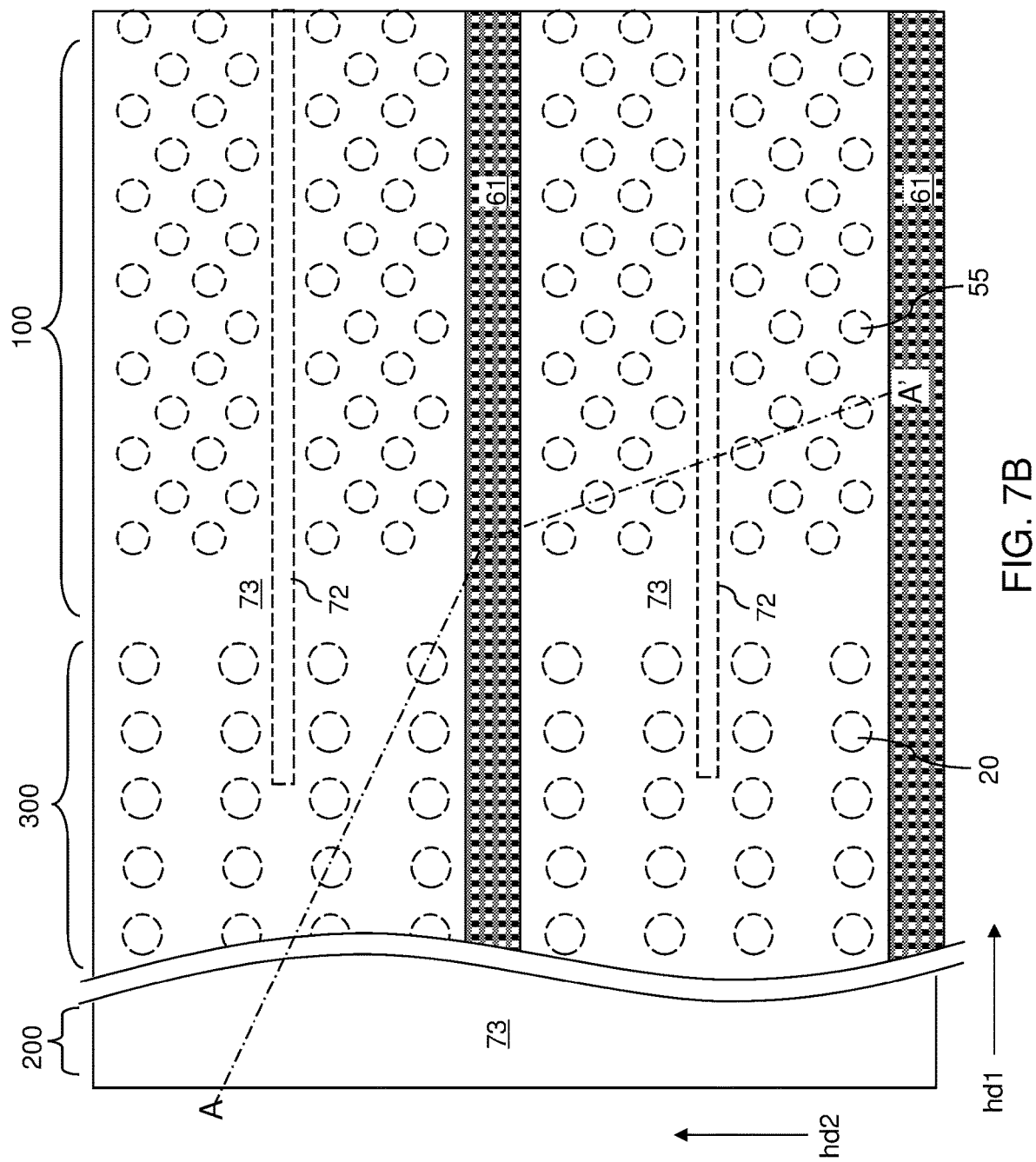

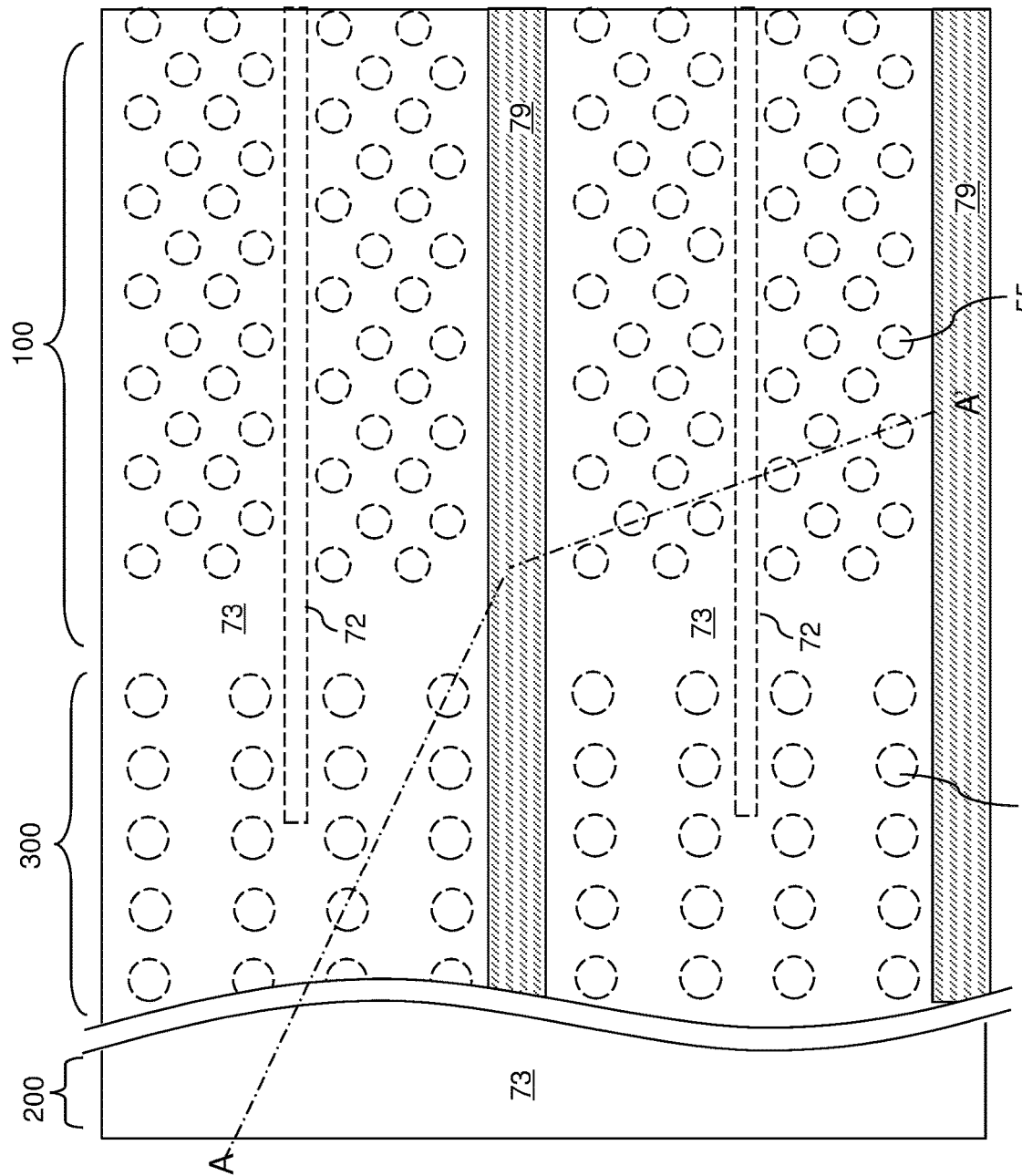

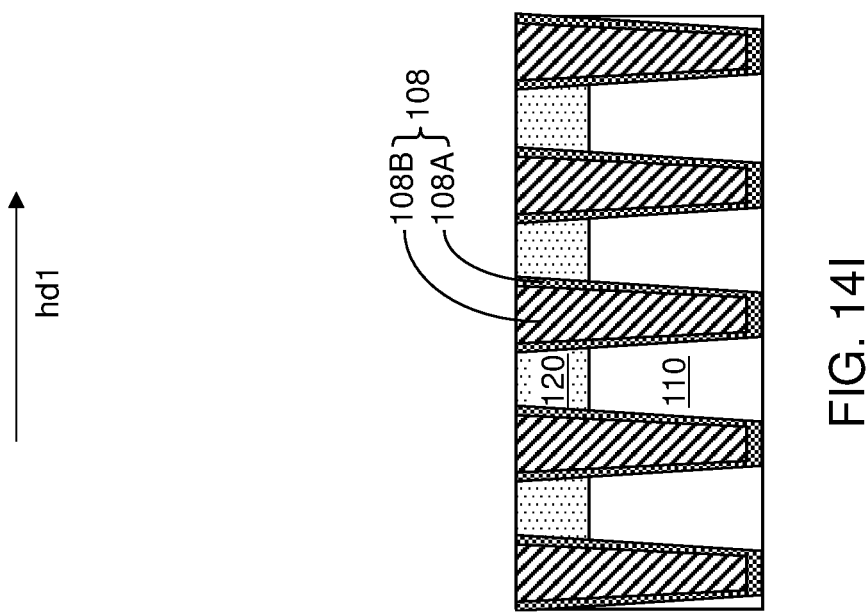

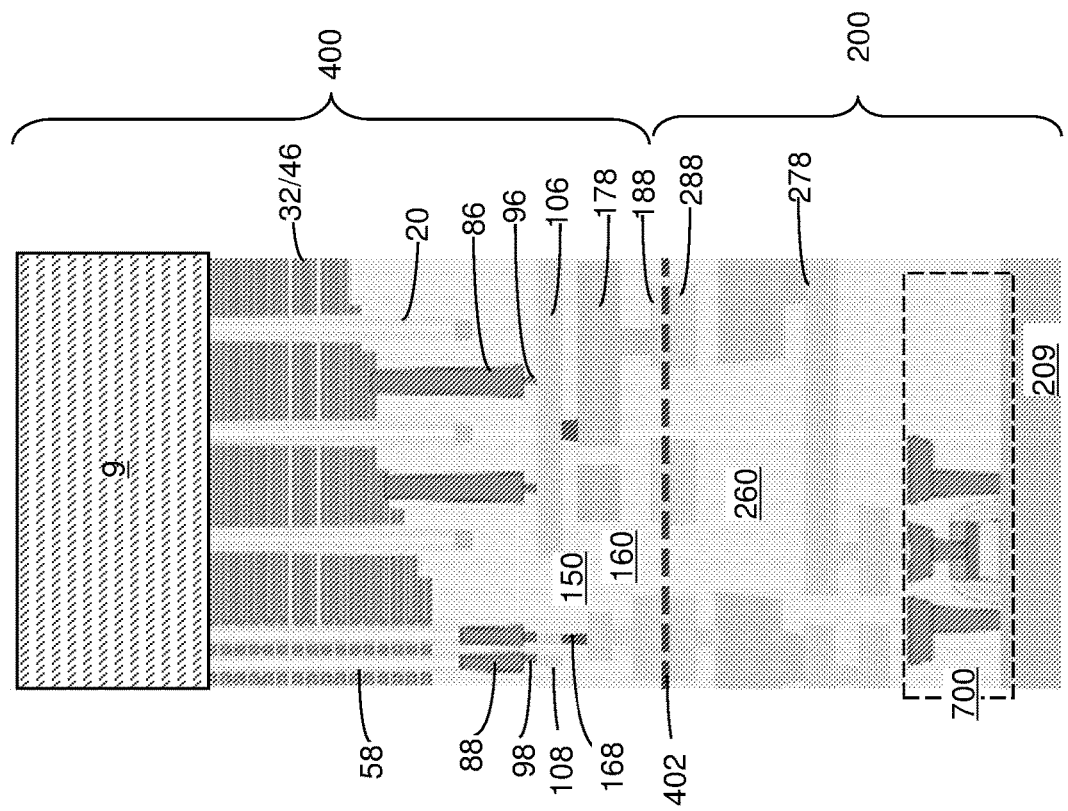

THREE-DIMENSIONAL MEMORY DEVICE CONTAINING SELF-ALIGNED BIT LINE CONTACTS AND METHODS FOR FORMING THE SAME

FIELD

The present disclosure relates generally to the field of semiconductor devices, and particularly to a memory device including self-aligned bit line contacts and methods for forming the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a memory device comprises an alternating stack of insulating layers and word lines; memory opening fill structures extending through the alternating stack, wherein each of the memory opening fill structures comprises a memory element, a vertical semiconductor channel and a drain region connected to an upper end of the semiconductor channel; bit lines electrically connected to a respective subset of the drain regions, wherein the bit lines are embedded within a vertical layer stack including a bit-line-level dielectric layer and an etch stop dielectric layer, wherein each of the bit lines is contacted by a bottom surfaces of a respective capping dielectric strip; at least one via-level dielectric layer overlying the vertical layer stack; and a bit-line-contact via structure vertically extending through the at least one via-level dielectric layer and through one of the capping dielectric strips and contacting a top surface of a respective one of the bit lines, contacting a sidewall segment of the etch stop dielectric layer, and contacting a segment of a top surface of the etch stop dielectric layer.

According to another aspect of the present disclosure, a method of forming a memory device is provided, which comprises: forming a two-dimensional array of semiconductor channels and a two-dimensional array of drain regions connected to an end of a respective one of the semiconductor channels; forming a vertical layer stack including a bit-line-level dielectric layer and an etch stop dielectric layer over the two-dimensional array of drain regions; forming bit-line trenches through the vertical layer stack; forming bit-line-trench fill structures in the bit-line trenches, wherein each of the bit-line-trench fill structures comprises a stack of a bit line and a capping dielectric strip within each of the bit-line trenches, wherein each of the bit lines is electrically connected to a respective subset of drain regions within the two-dimensional array of drain regions; forming at least one via-level dielectric layer over the vertical layer stack; forming a bit-line-contact via cavity through the at least one via-level dielectric layer and one of the capping dielectric strips, wherein the bit-line-contact via cavity comprises a stepped bottom surface including a top surface of one of the bit lines, a sidewall segment of the etch stop dielectric layer, and a segment of a top surface of the etch stop dielectric layer; and forming a bit-line-contact via structure in the bit-line-contact via cavity.

BRIEF DESCRIPTION OF THE DRAWINGS

FIGS. 5A-5H are sequential schematic vertical cross-sectional views of a memory opening within the exemplary structure during formation of a memory stack structure, an optional dielectric core, and a drain region therein according to an embodiment of the present disclosure.

FIG. 7B is a partial see-through top-down view of the exemplary structure of FIG. 7A. The vertical plane A-A' is the plane of the schematic vertical cross-sectional view of FIG. 7A.

FIG. 10B is a partial see-through top-down view of the exemplary structure of FIG. 10A. The vertical plane A-A' is the plane of the schematic vertical cross-sectional view of FIG. 10A.

FIGS. 14A-14I are sequential vertical cross-sectional views of a region of the exemplary structure during formation of a bit-line-level dielectric layer, an etch stop dielectric layer, and bit lines according to an embodiment of the present disclosure.

FIG. 18 is a schematic side cross-sectional view of a bonded assembly according to an embodiment of the present disclosure.

DETAILED DESCRIPTION

Figure 1:
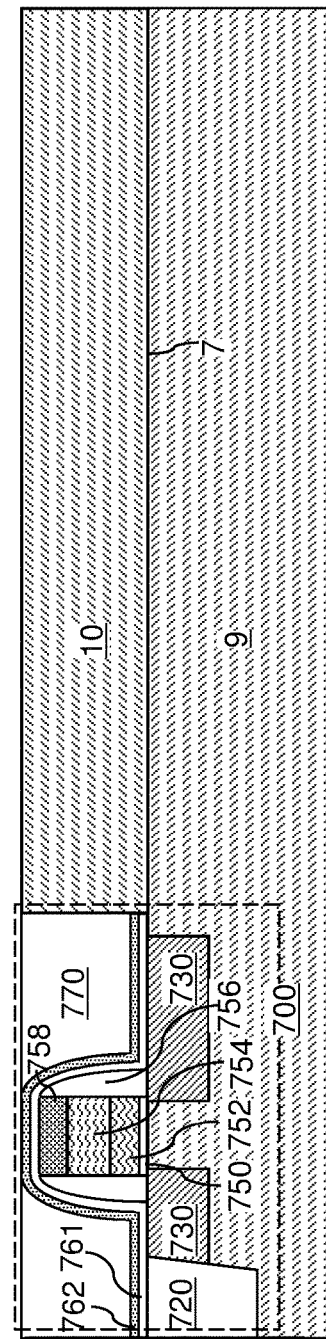
FIG. 1 is a schematic vertical cross-sectional view of an exemplary structure after formation of at least one peripheral device, a semiconductor material layer, and a gate dielectric layer according to an embodiment of the present disclosure.

As discussed above, the present disclosure is directed to a memory device including self-aligned bit line contact via structures and methods for forming the same, the various aspects of which are described below. The embodiments of the disclosure can be employed to form various structures including a multilevel memory structure, non-limiting examples of which include semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

In one alternative embodiment, the peripheral device region 200 containing the at least one semiconductor device 700 for a peripheral circuitry may be located under the memory array region 100 in a CMOS under array configuration. In another alternative embodiment shown in FIG. 18 and described in more detail below, the peripheral device region 200 may be located on a separate substrate 209 which is subsequently bonded to the memory array region 100.

Figure 2:
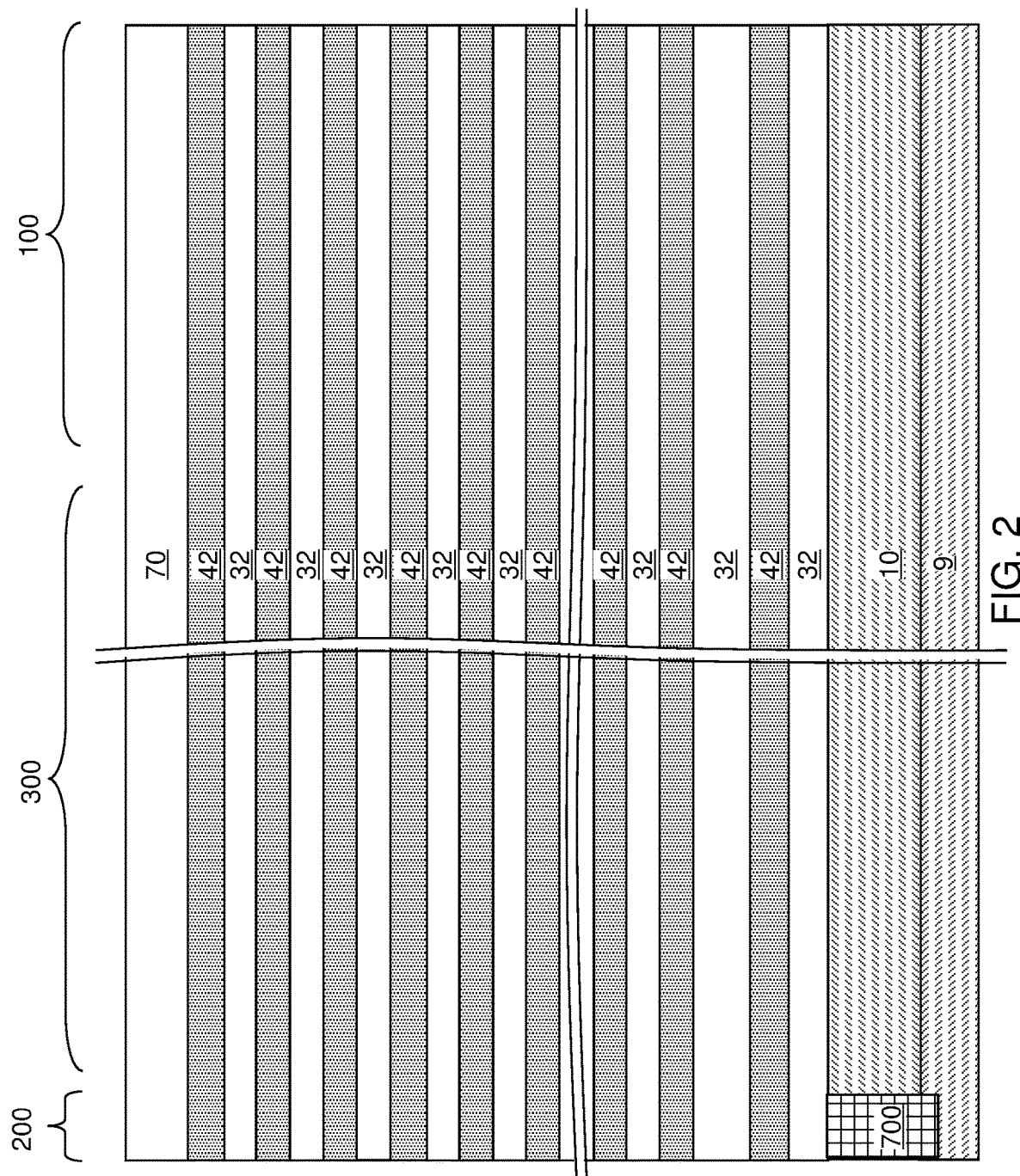
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
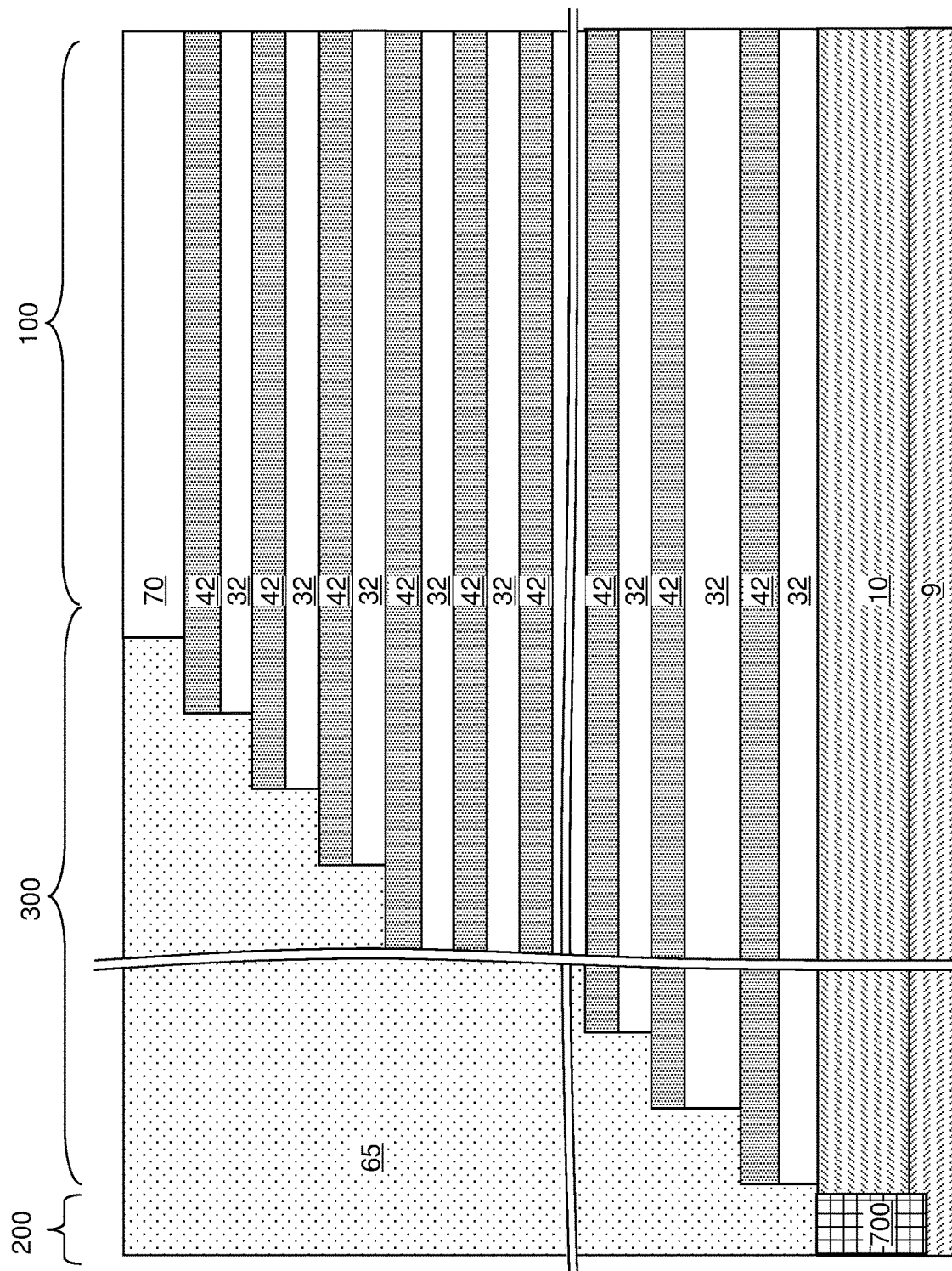
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain-select-level isolation structures 72 can be formed through the insulating cap layer 70 and a subset of the sacrificial material layers 42 located at drain select levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the insulating cap layer 70.

Figure 4A:
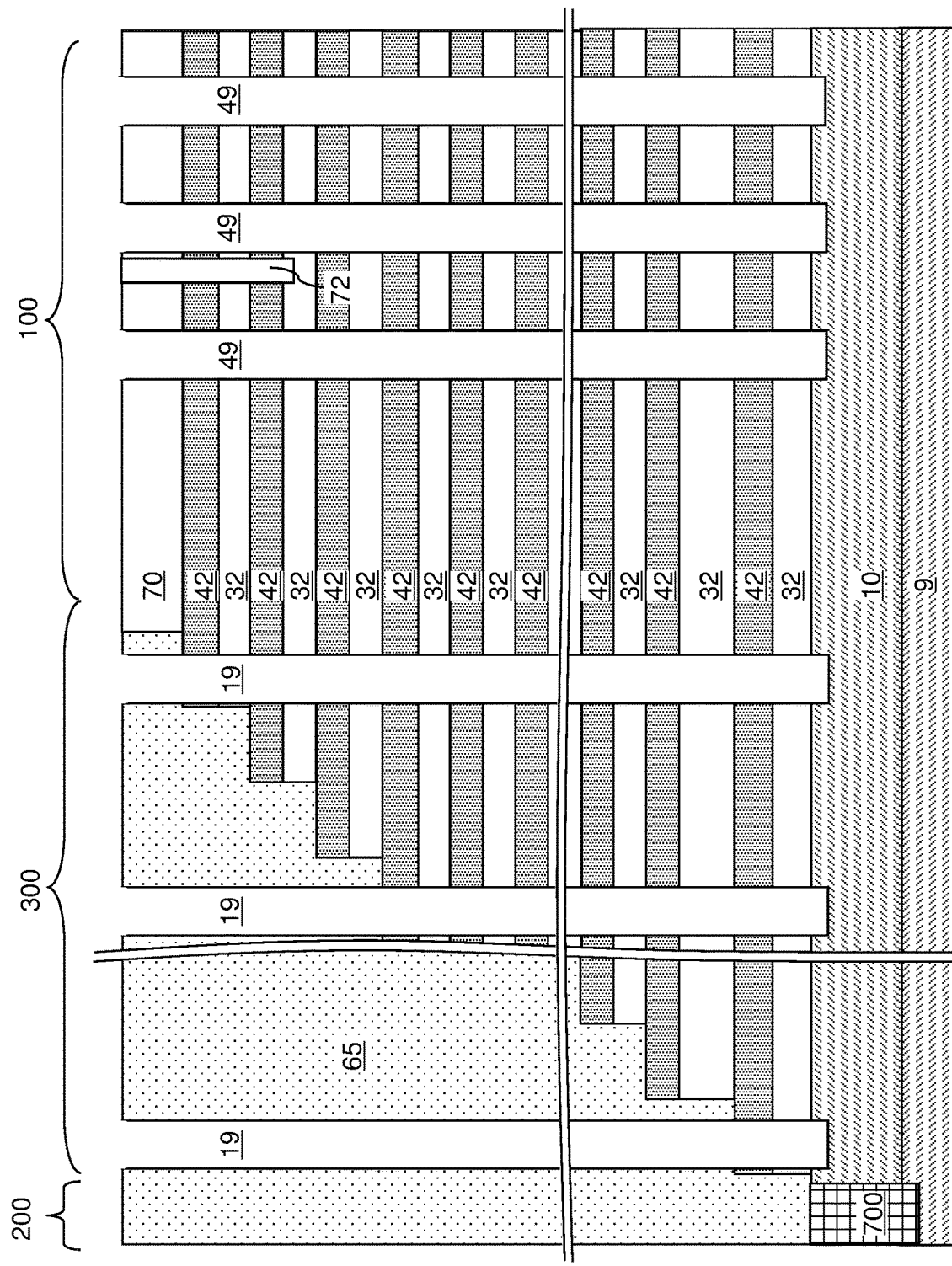
FIG. 4A is a schematic vertical cross-sectional view of the exemplary structure after formation of memory openings and support openings according to an embodiment of the present disclosure.
Figure 4B:
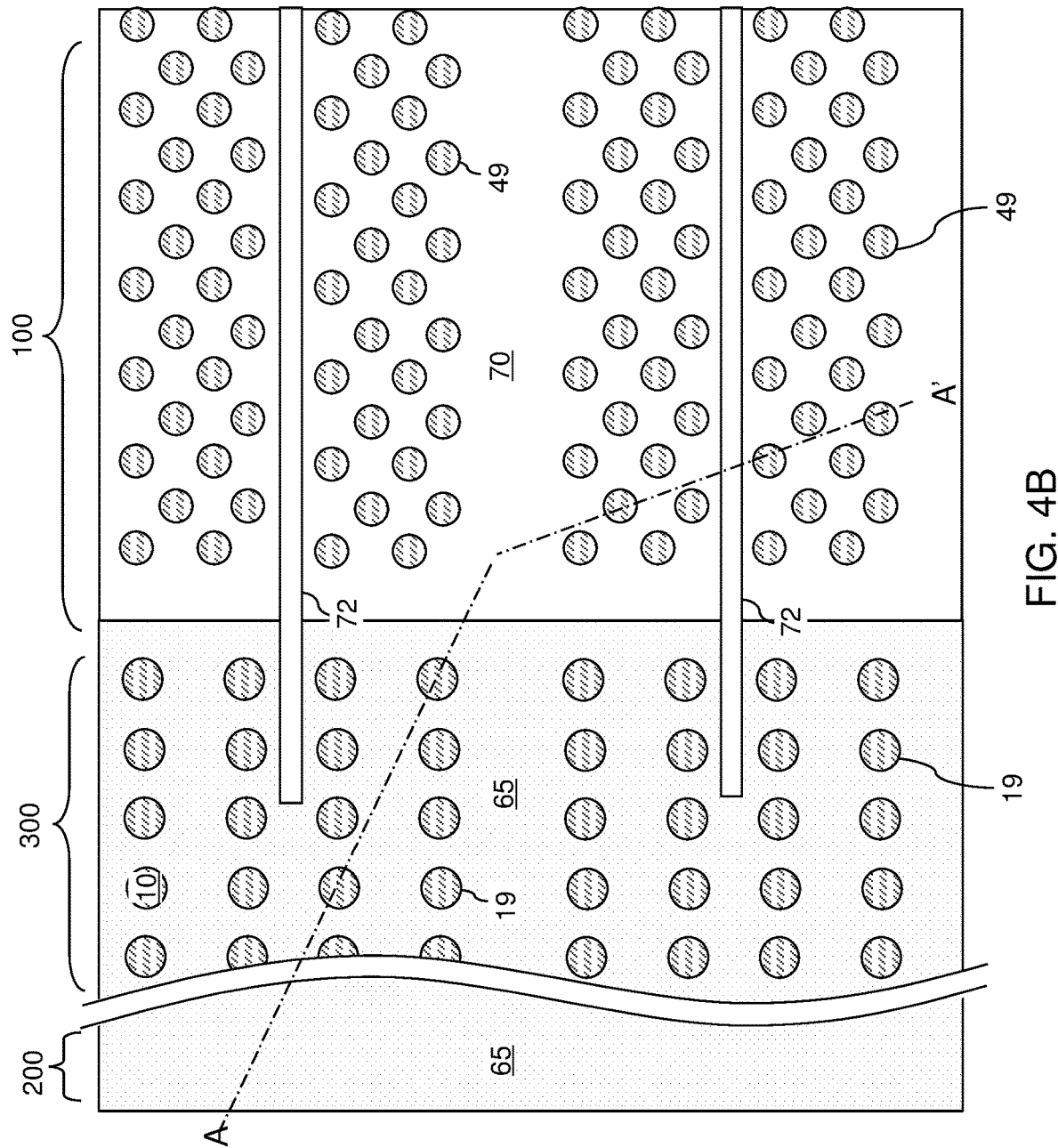
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 5C, a stack of layers including an optional blocking dielectric layer 52, a memory material layer 54, a dielectric material liner 56, and an optional sacrificial cover material layer 601 can be sequentially deposited in the memory openings 49 by a respective conformal deposition process.

The optional blocking dielectric layer 52 can include a single dielectric material layer or a stack of a plurality of dielectric material layers. The blocking dielectric layer 52 can be formed employing a conformal deposition process. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the memory material layer 54 can be deposited as a continuous material layer by a conformal deposition process such as a chemical vapor deposition process or an atomic layer deposition process. The memory material layer 54 includes a memory material, i.e., a material that can store data by selecting a state of the material. For example, the memory material layer 54 may include a charge storage material such as silicon nitride, polysilicon, or a metallic material, a ferroelectric material that can store information in the form of a ferroelectric polarization direction, or any other memory material that can store data by altering its electrical resistivity.

The memory material layer 54 can be formed as a single memory material layer of homogeneous composition, or can include a stack of multiple memory material layers (e.g., floating gates or insulating charge storage regions). In one embodiment, the memory material layer 54 may comprise an insulating charge trapping material, such as one or more silicon nitride segments. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

The dielectric material liner 56 includes a dielectric material. The dielectric material liner 56 can be formed on the memory material layer 54 employing a conformal deposition process. In one embodiment, the dielectric material liner 56 comprises a tunneling dielectric layer through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The dielectric material liner 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the dielectric material liner 56 can include a stack of a first silicon oxide layer, a silicon oxynitride layer, and a second silicon oxide layer, which is commonly known as an ONO stack. In one embodiment, the dielectric material liner 56 can include a silicon oxide layer that is substantially free of carbon or a silicon oxynitride layer that is substantially free of carbon. The thickness of the dielectric material liner 56 can be in a range from 2 nm to 20 nm, although lesser and greater thicknesses can also be employed.

The optional sacrificial cover material layer 601 includes a sacrificial material that can be subsequently removed selective to the material of the dielectric material liner 56. In one embodiment, the sacrificial cover material layer 601 can include a semiconductor material such as amorphous silicon, or may include a carbon-based material such as amorphous carbon or diamond-like carbon (DLC). The sacrificial cover material layer 601 can be formed by a conformal deposition method such as low pressure chemical vapor deposition (LPCVD). The thickness of the sacrificial cover material layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 5D, the optional sacrificial cover material layer 601, the dielectric material liner 56, the memory material layer 54, and the blocking dielectric layer 52 overlying the insulating cap layer 70 are sequentially anisotropically etched employing at least one anisotropic etch process. The portions of the sacrificial cover material layer 601, the dielectric material liner 56, the memory material layer 54, and the blocking dielectric layer 52 located above the top surface of the insulating cap layer 70 can be removed by the at least one anisotropic etch process. Further, the horizontal portions of the sacrificial cover material layer 601, the dielectric material liner 56, the memory material layer 54, and the blocking dielectric layer 52 at a bottom of each memory cavity 49' can be removed to form openings in remaining portions thereof. Each of the sacrificial cover material layer 601, the dielectric material liner 56, the memory material layer 54, and the blocking dielectric layer 52 can be etched by a respective anisotropic etch process employing a respective etch chemistry, which may, or may not, be the same for the various material layers.

Each remaining portion of the sacrificial cover material layer 601 can have a tubular configuration. The memory material layer 54 can comprise a charge trapping material, a floating gate material, a ferroelectric material, or a resistive memory material that can provide at least two different levels of resistivity (such as a phase change material), or any other memory material that can store information by a change in state. In one embodiment, each memory material layer 54 can include a vertical stack of charge storage regions that store electrical charges upon programming. In one embodiment, the memory material layer 54 can be a memory material layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the sacrificial cover material layer 601, the dielectric material liner 56, the memory material layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A dielectric material liner 56 is located over the memory material layer 54. A set of a blocking dielectric layer 52, a memory material layer 54, and a dielectric material liner 56 in a memory opening 49 constitutes a memory film 50, which includes a plurality of charge storage regions (comprising portions of the memory material layer 54) that are insulated from surrounding materials by the blocking dielectric layer 52 and the dielectric material liner 56. In one embodiment, the sacrificial cover material layer 601, the dielectric material liner 56, the memory material layer 54, and the blocking dielectric layer 52 can have vertically coincident sidewalls. The sacrificial cover material layer 601 can be subsequently removed selective to the material of the dielectric material liner 56. In case the sacrificial cover material layer 601 includes a semiconductor material, a wet etch process employing hot trimethyl-2 hydroxyethyl ammonium hydroxide ("hot TMY") or tetramethyl ammonium hydroxide (TMAH) can be performed to remove the sacrificial cover material layer 601. Alternatively, the sacrificial cover material layer 601 may be retained in the final device if it comprises a semiconductor material.

Referring to FIG. 5E, a semiconductor channel layer 60L can be deposited directly on the semiconductor surface of the pedestal channel portion 11 or the semiconductor material layer 10 if the pedestal channel portion 11 is omitted, and directly on the dielectric material liner 56. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can have a doping of a first conductivity type, which is the same as the conductivity type of the semiconductor material layer 10 and the pedestal channel portions 11. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the memory cavity 49' in each memory opening, or may fully fill the cavity in each memory opening.

Referring to FIG. 5F, in case the memory cavity 49' in each memory opening is not completely filled by the semiconductor channel layer 60L, a dielectric core layer 62C can be deposited in the memory cavity 49' to fill any remaining portion of the memory cavity 49' within each memory opening. The dielectric core layer 62C includes a dielectric material such as silicon oxide or organosilicate glass. The dielectric core layer 62C can be deposited by a conformal deposition method such as low pressure chemical vapor deposition (LPCVD), or by a self-planarizing deposition process such as spin coating.

Referring to FIG. 5G, the horizontal portion of the dielectric core layer 62C can be removed, for example, by a recess etch process such that each remaining portions of the dielectric core layer 62C is located within a respective memory opening 49 and has a respective top surface below the horizontal plane including the top surface of the insulating cap layer 70. Each remaining portion of the dielectric core layer 62C constitutes a dielectric core 62.

Referring to FIG. 5H, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0 \times 10^{18}/cm^3$ to $2.0 \times 10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the insulating cap layer 70, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60.

A dielectric material liner 56 is surrounded by a memory material layer 54, and laterally surrounds a portion of the vertical semiconductor channel 60. Each adjoining set of a blocking dielectric layer 52, a memory material layer 54, and a dielectric material liner 56 collectively constitute a memory film 50, which can store electrical charges or electrical polarization with a macroscopic retention time. In some embodiments, a blocking dielectric layer 52 may not be present in the memory film 50 at this step, and a backside blocking dielectric layer may be subsequently formed after formation of backside recesses. Furthermore, if the ferroelectric memory material layer 54 is used, then the tunneling dielectric layer 56 may be omitted. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel, a dielectric material liner, a plurality of memory elements comprising portions of the memory material layer 54, and an optional blocking dielectric layer 52. An entire set of material portions that fills a memory opening 49 is herein referred to as a memory opening fill structure 58. An entire set of material portions that fills a support opening 19 constitutes a support pillar structure.

Generally, a memory opening fill structure 58 can be formed in each memory opening 49. The memory opening fill structure 58 comprises an optional blocking dielectric layer 52, a memory material layer 54, an optional dielectric material liner 56, and a vertical semiconductor channel 60. A dielectric material liner 56 may laterally surround the vertical semiconductor channel 60. The memory material layer 54 can laterally surround the dielectric material liner 56.

In case a blocking dielectric layer 52 is present in each memory opening fill structure 58, the blocking dielectric layer 52 may be formed on a sidewall of a memory opening 49, and the vertical stack of memory elements (which may comprise portions of the memory material layer 54) may be formed on the blocking dielectric layer 52. In one embodiment, the vertical stack of memory elements comprises portions of a charge storage layer (comprising portion of the memory material layer 54) located at the levels of the sacrificial material layers 42. In case a dielectric material liner 56 is present in each memory opening fill structure 58, the dielectric material liner 56 may be formed on the vertical stack of memory elements. In on embodiment, the dielectric material liner 56 may comprise a tunneling dielectric layer. In this case, the vertical semiconductor channel 60 can be formed on the tunneling dielectric layer. The blocking dielectric layer 52 laterally surrounds the charge storage layer and the tunneling dielectric layer can be located between the charge storage layer and the vertical semiconductor channel 60. A vertical NAND string can be formed through each memory opening upon subsequent replacement of the sacrificial material layers 42 with electrically conductive layers.

Figure 6:
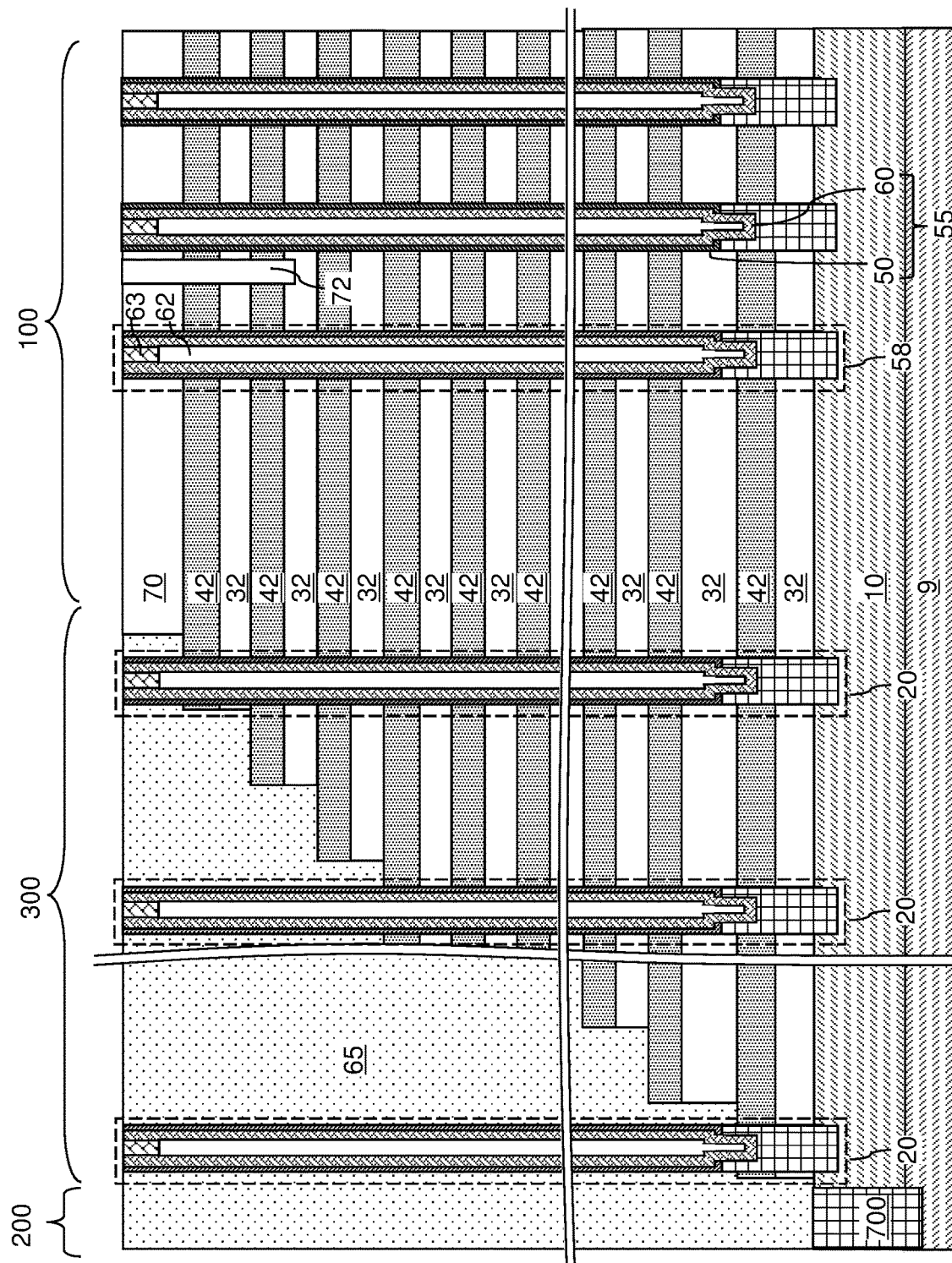
FIG. 6 is a schematic vertical cross-sectional view of the exemplary structure after formation of memory stack structures and support pillar structures according to an embodiment of the present disclosure.

Referring to FIG. 6, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Figure 7A:
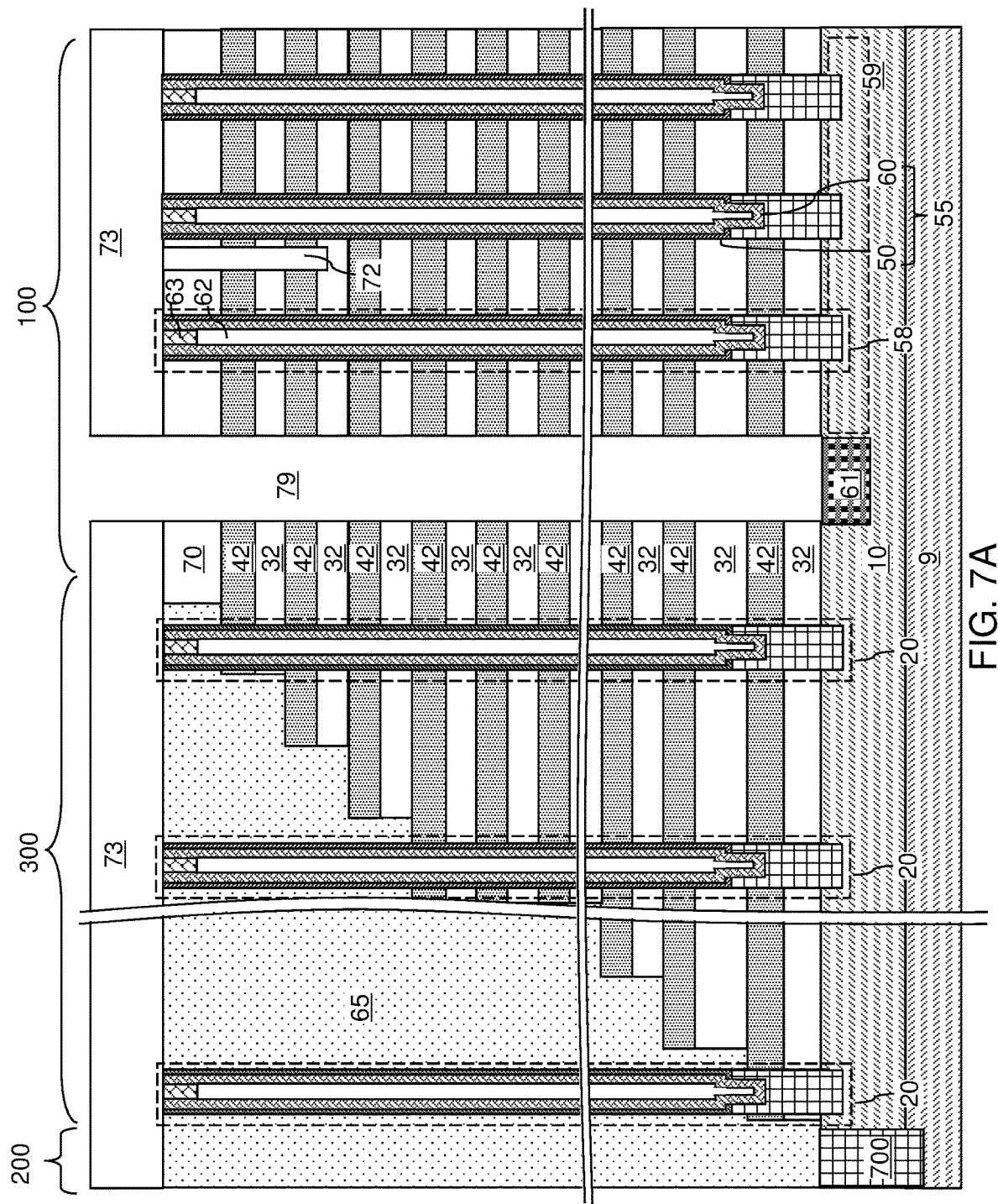
FIG. 7A is a schematic vertical cross-sectional view of the exemplary structure after formation of backside trenches according to an embodiment of the present disclosure.
Figure 7C:
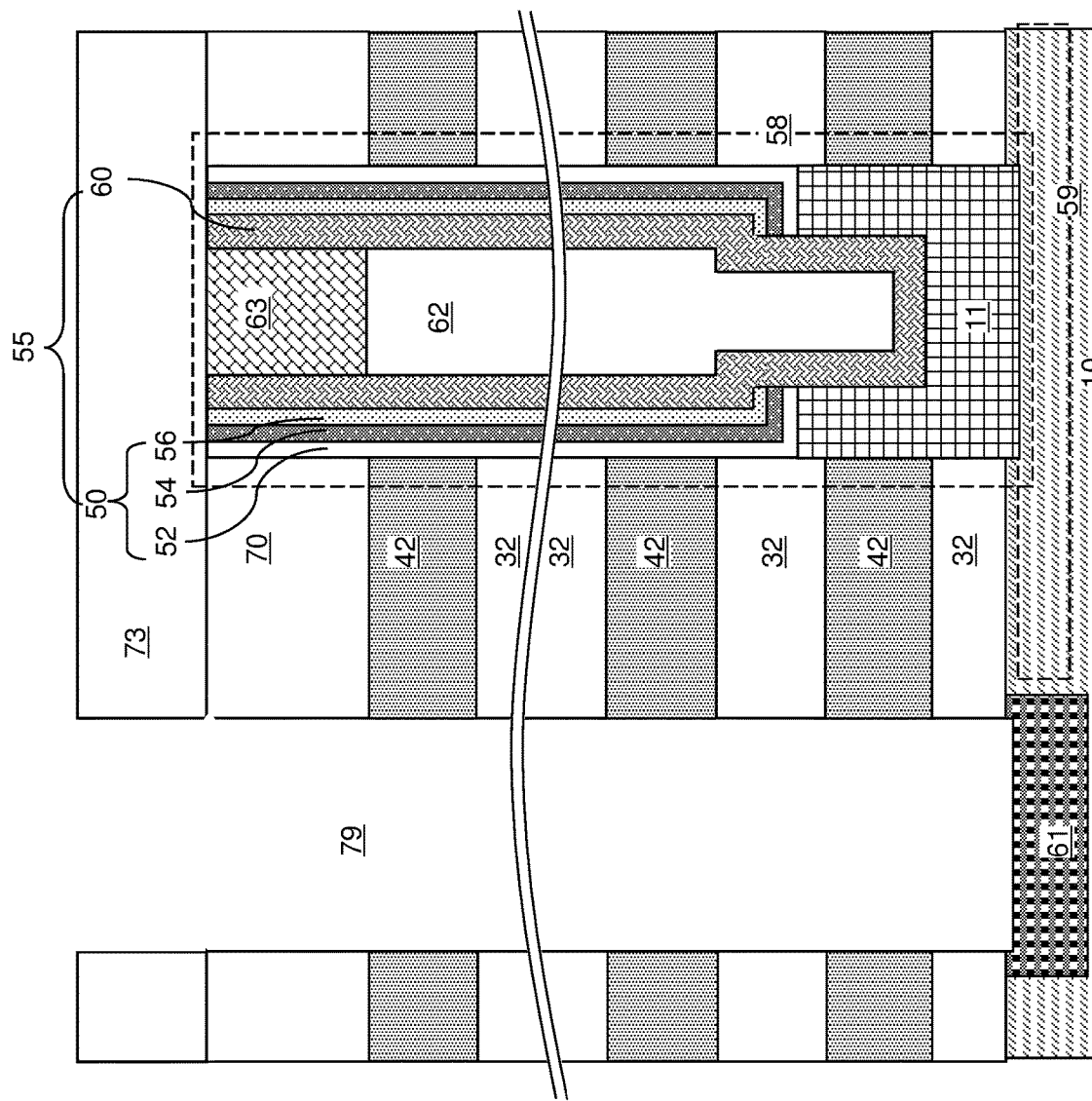
FIG. 7C is a vertical cross-sectional view of a region of the exemplary structure of FIGS. 7A and 7B.

Referring to FIGS. 7A-7C, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the contact region 300.

In one embodiment, the backside trenches 79 can laterally extend along a first horizontal direction (e.g., word line direction) hd1 and can be laterally spaced apart from each other along a second horizontal direction (e.g., word line direction) hd2 that is perpendicular to the first horizontal direction hd1. The memory stack structures 55 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing.

A source region 61 can be formed at a surface portion of the semiconductor material layer 10 under each backside trench 79 by implantation of electrical dopants into physically exposed surface portions of the semiconductor material layer 10. An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11.

Figure 8:
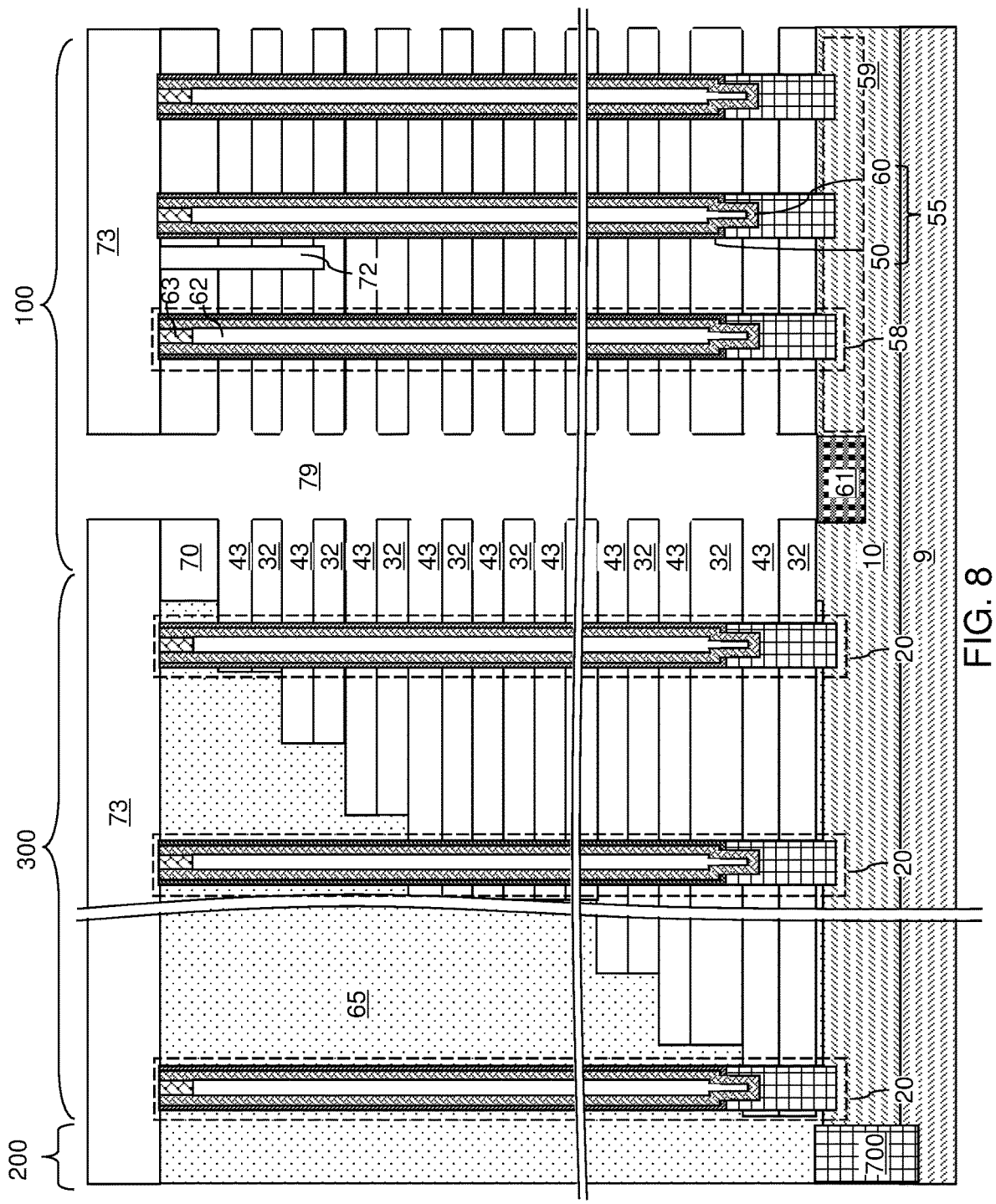
FIG. 8 is a schematic vertical cross-sectional view of the exemplary structure after formation of backside recesses according to an embodiment of the present disclosure.
Figure 9A:
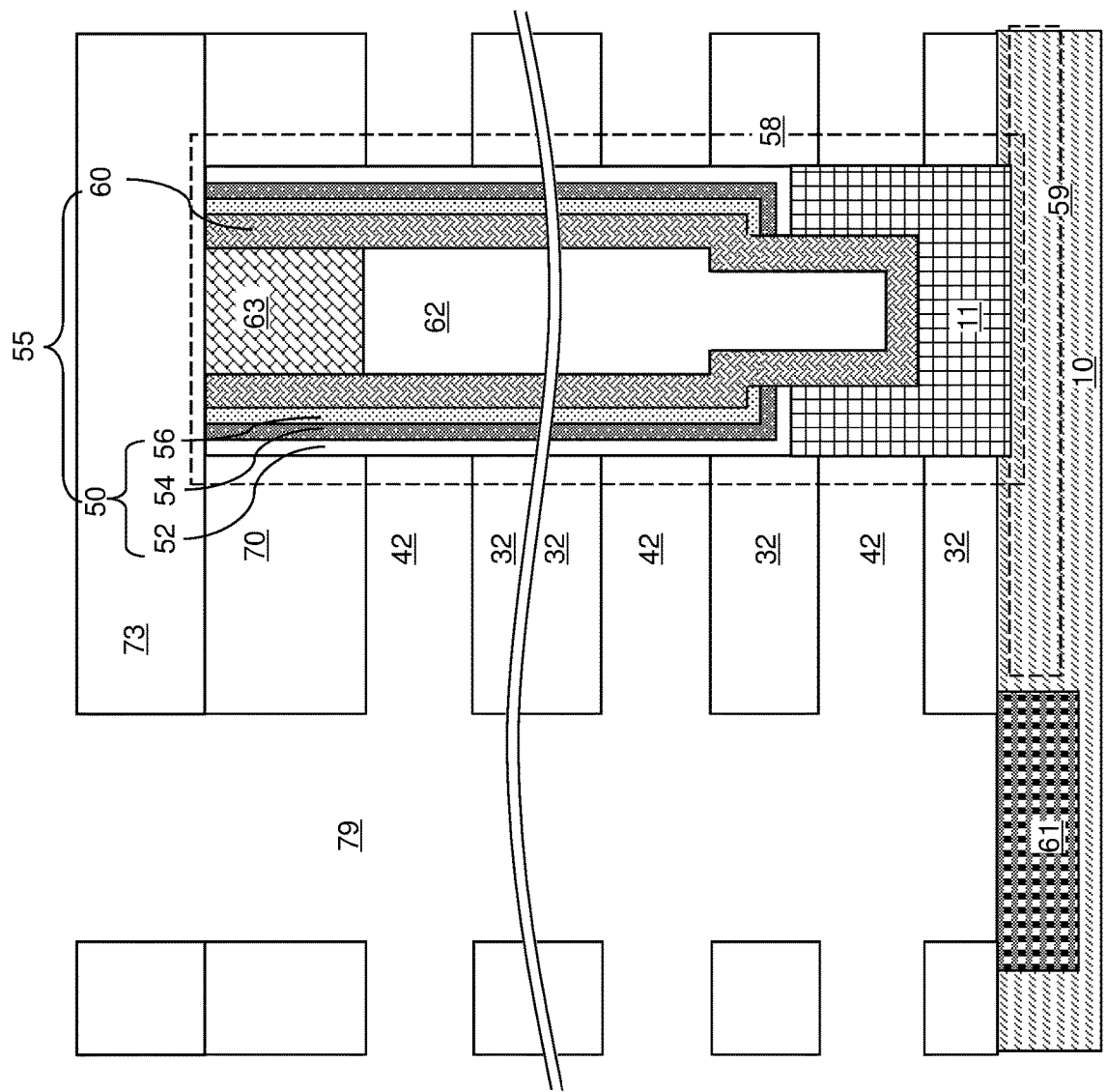
FIGS. 9A-9D are sequential vertical cross-sectional views of a region of the exemplary structure during formation of electrically conductive layers according to an embodiment of the present disclosure.

Referring to FIGS. 8 and 9A, an etchant that selectively etches the second material of the sacrificial material layers 42 with respect to the first material of the insulating layers 32 can be introduced into the backside trenches 79, for example, employing an etch process. FIG. 9A illustrates a region of the exemplary structure of FIG. 8. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43.

In one embodiment, the memory array region 100 comprises an array of c three-dimensional NAND strings having a plurality of device levels disposed above the substrate (9, 10). In this case, each backside recess 43 can define a space for receiving a respective word line of the array of monolithic three-dimensional NAND strings. Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Figure 9B:
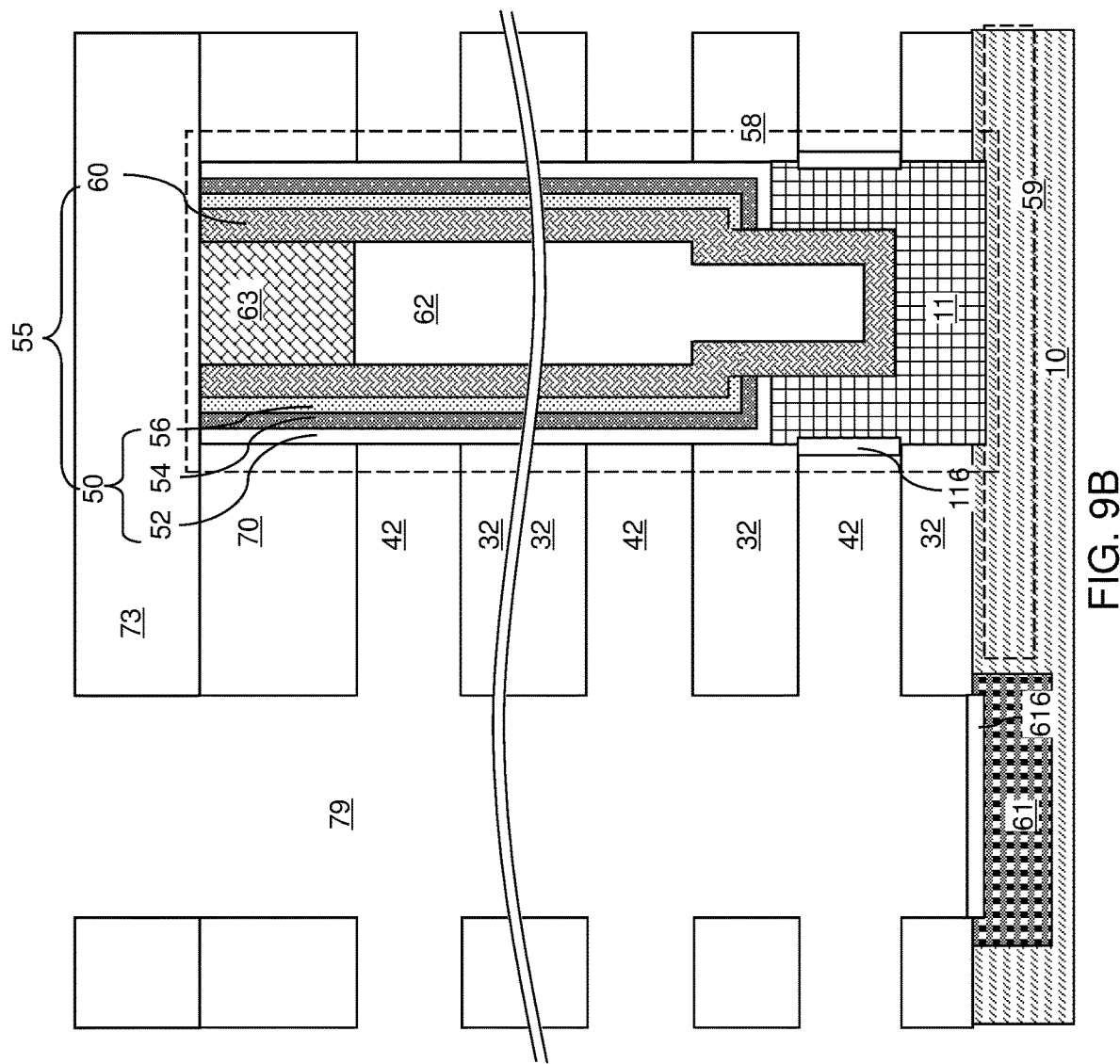

Referring to FIG. 9B, physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Figure 9C:
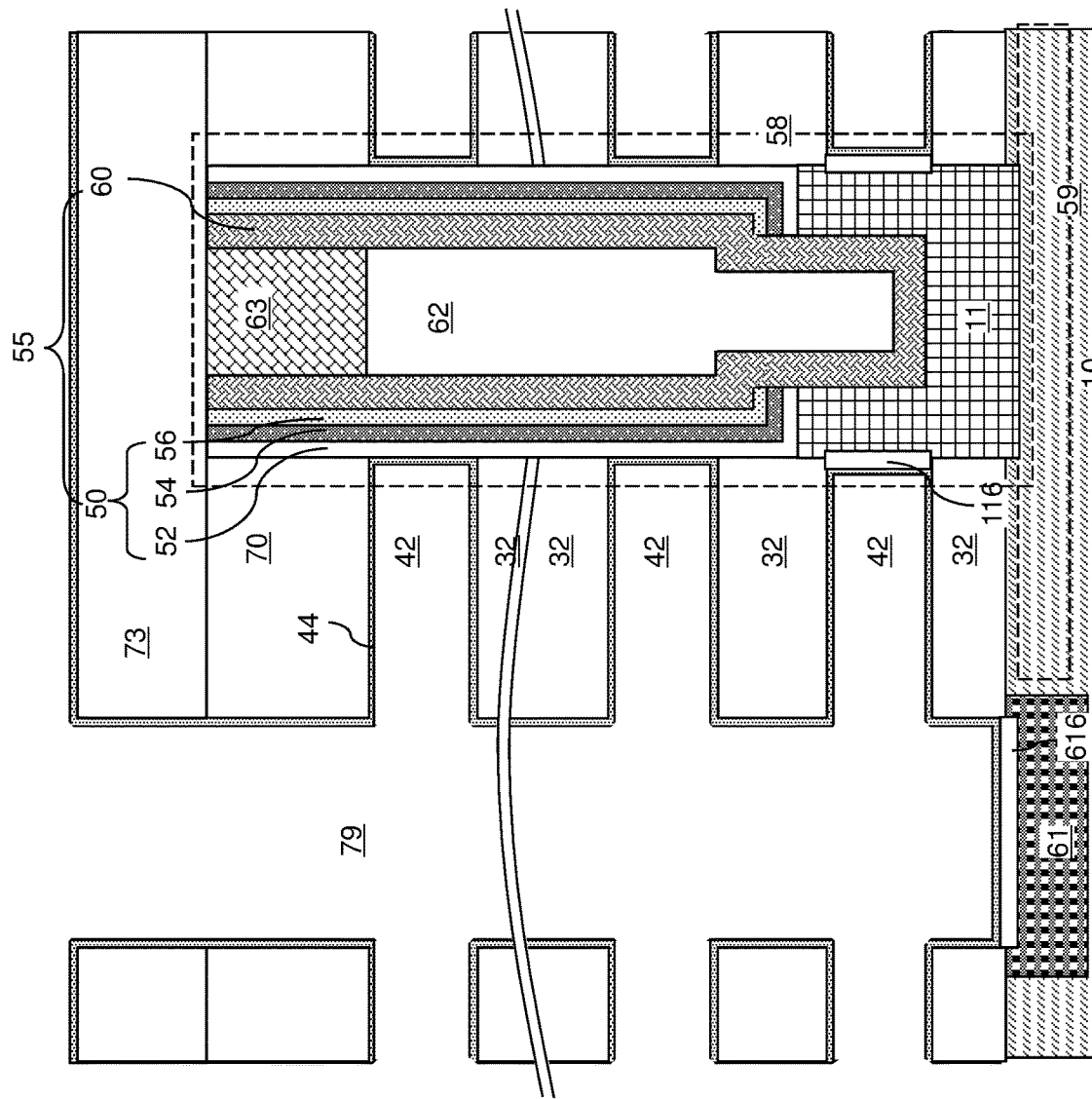

Referring to FIG. 9C, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Figure 9D:
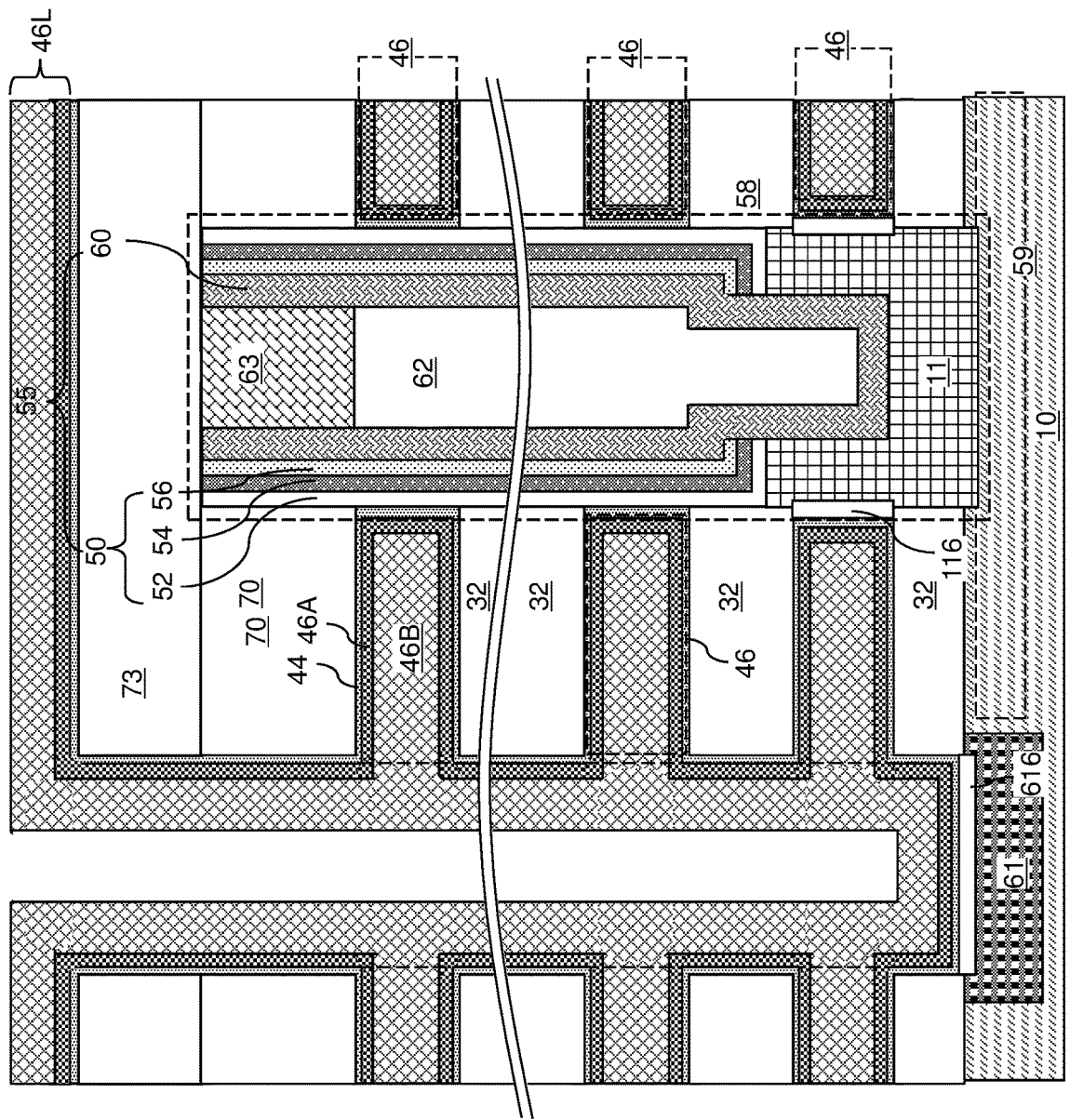

Referring to FIG. 9D, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

A metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer 46L includes a continuous portion of the metallic barrier layer 46A and a continuous portion of the metallic fill material layer 46B that are located in the backside trenches 79 or above the contact level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous metallic material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 10A:
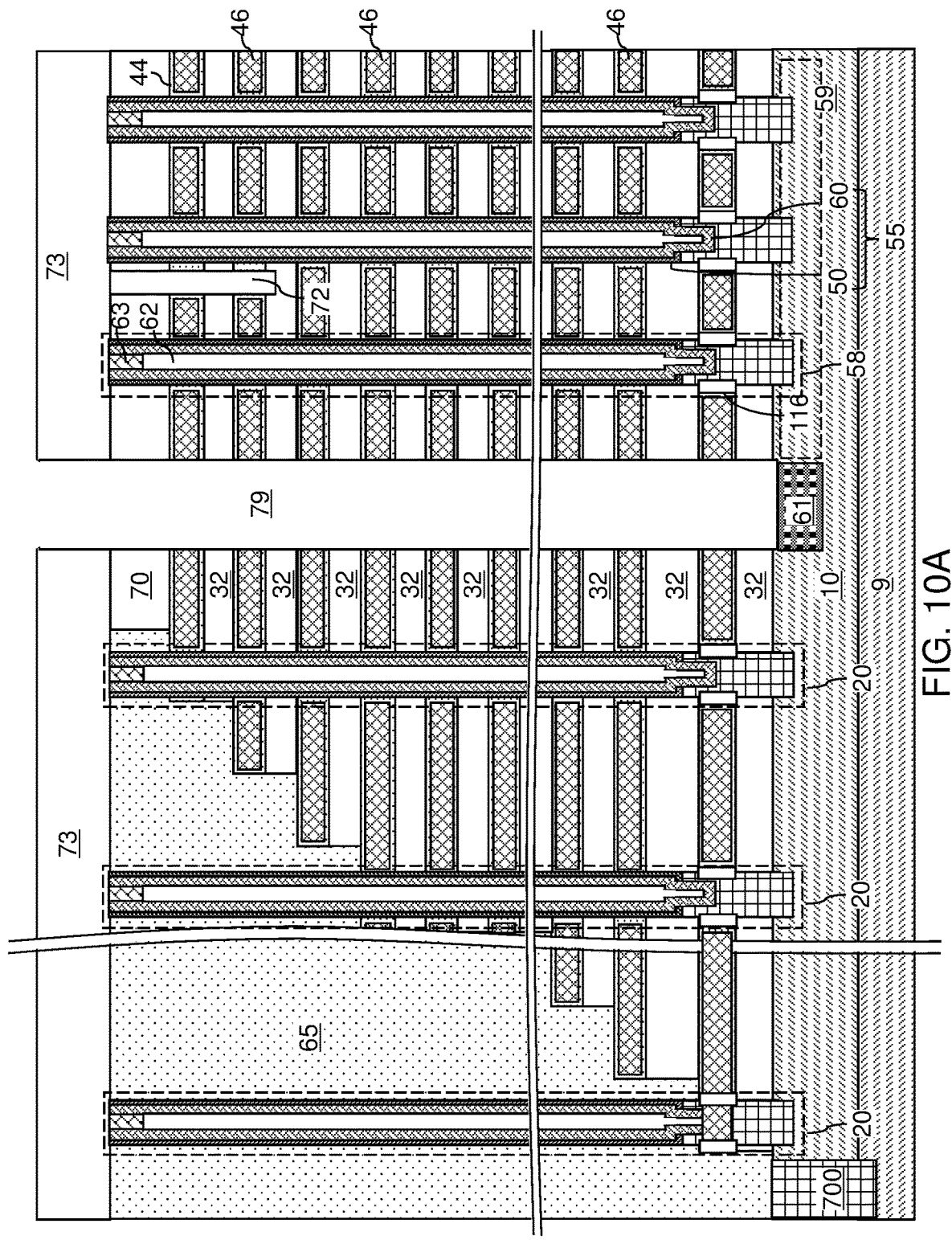
FIG. 10A is a schematic vertical cross-sectional view of the exemplary structure after removal of a deposited conductive material from within the backside trench according to an embodiment of the present disclosure.
Figure 10C:
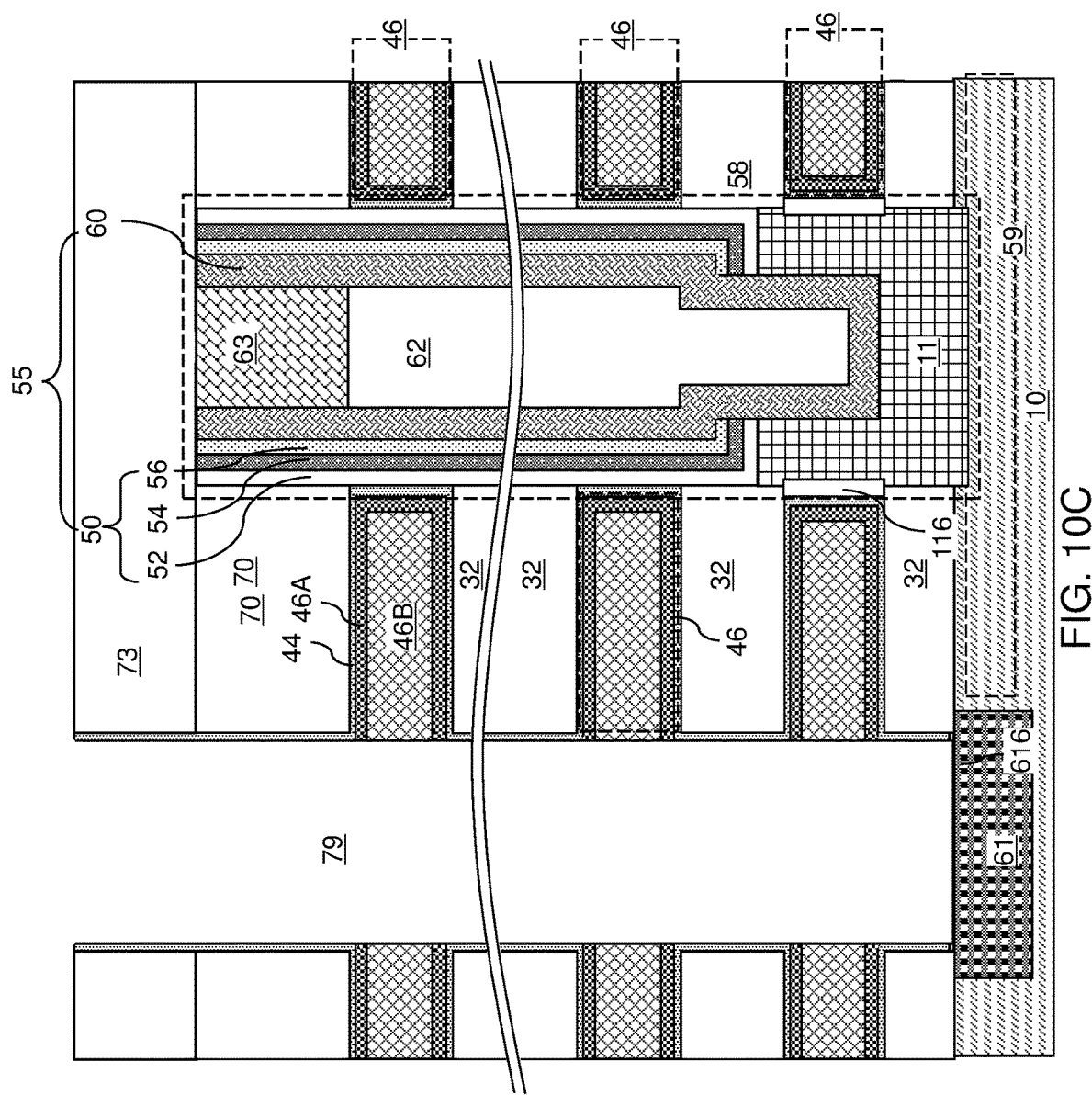
FIG. 10C is a vertical cross-sectional view of a region of the exemplary structure of FIGS. 10A and 10B.

Referring to FIGS. 10A-10C, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79.

At least one bottommost electrically conductive layer 46 provided upon formation of the electrically conductive layers 46 within the alternating stack (32, 46) can comprise a source side select gate electrode for the NAND strings. At least one topmost electrically conductive layer 46 provided upon formation of the electrically conductive layers 46 within the alternating stack (32, 46) can comprise a drain side select gate electrode for the NAND strings. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

Figure 11:
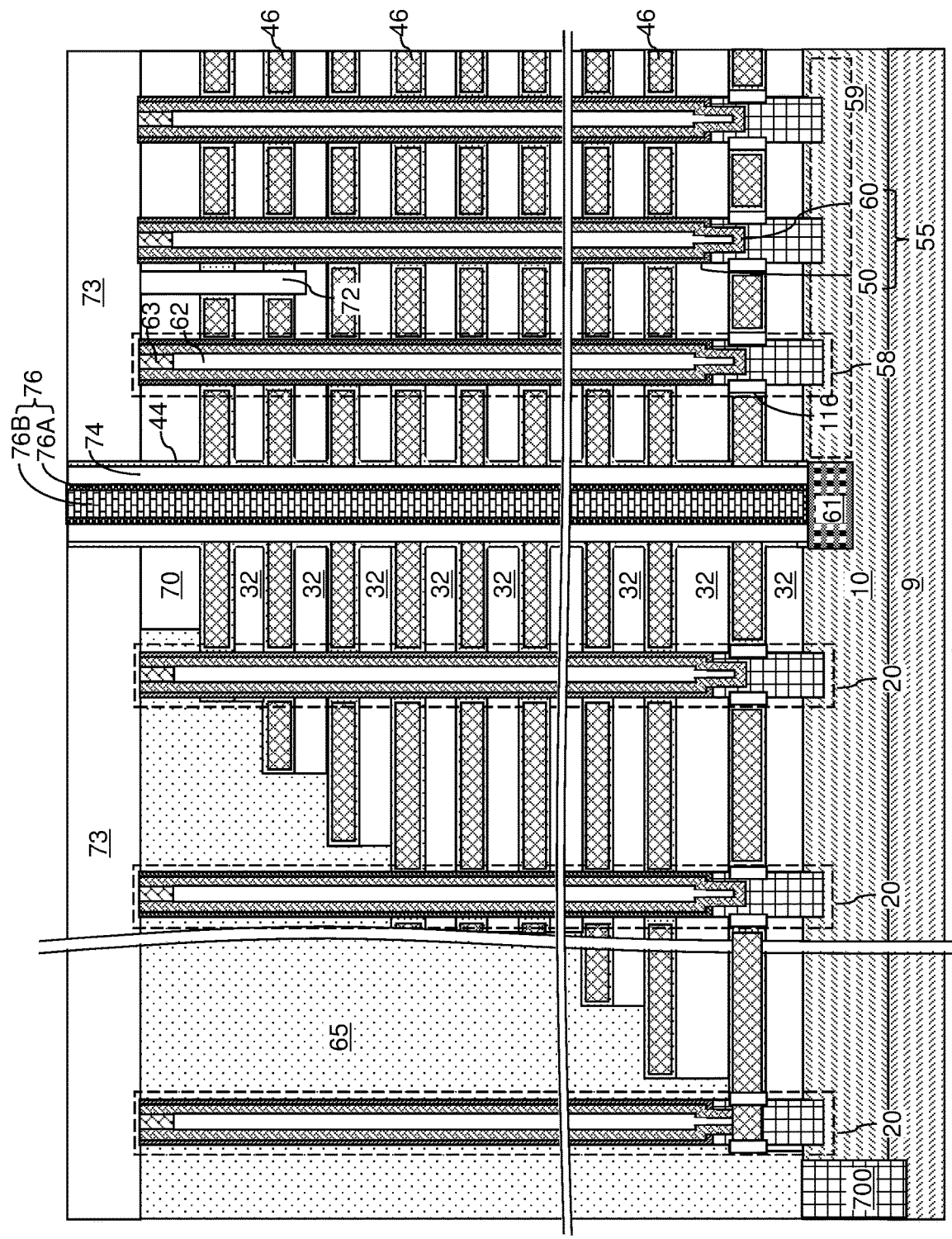
FIG. 11 is a schematic vertical cross-sectional view of the exemplary structure after formation of an insulating spacer and a backside contact structure according to an embodiment of the present disclosure.

Referring to FIG. 11, an insulating material layer can be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Alternatively, the above described insulating material layer can be formed in the backside trenches 79 to completely fill the entire volume of a backside trench 79 and may consist essentially of at least one dielectric material. In this alternative embodiment, the source region 61 and the backside trench via structure 76 may be omitted, and a horizontal source line (e.g., direct strap contact) may contact a side of the lower portion of the semiconductor channel 60.

Figure 12A:
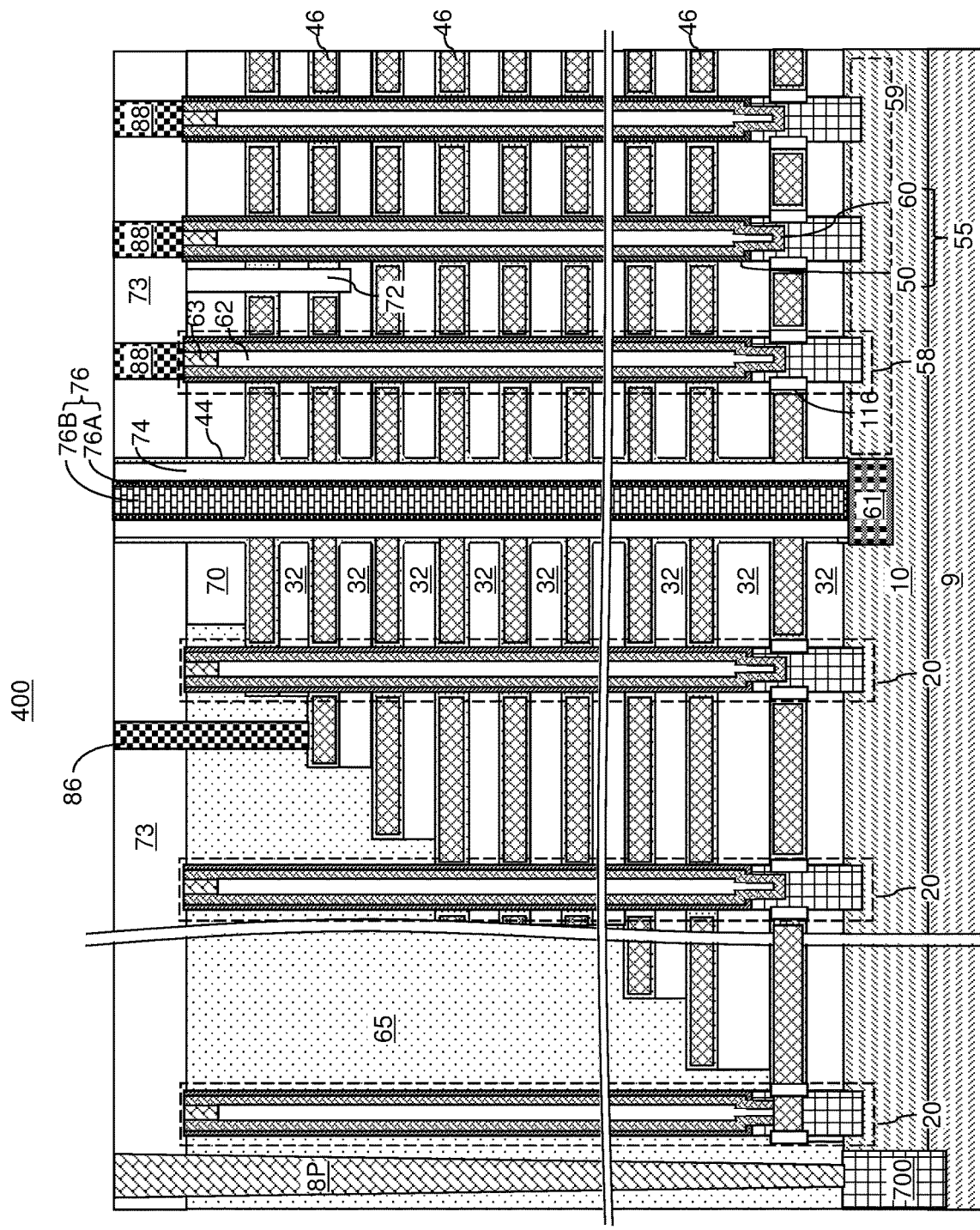
FIG. 12A is a schematic vertical cross-sectional view of the exemplary structure after formation of additional contact via structures according to an embodiment of the present disclosure.
Figure 12B:
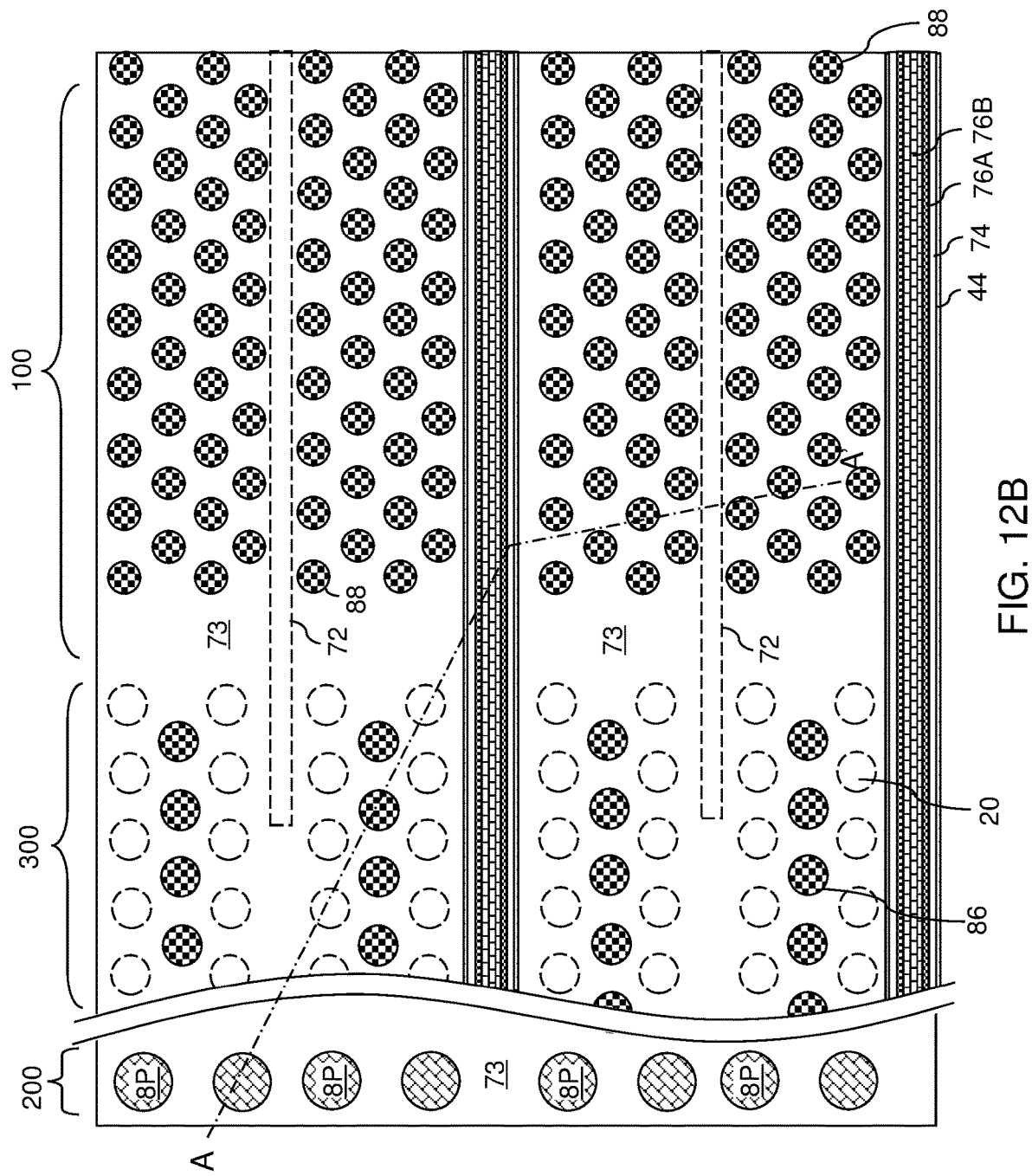
FIG. 12B is a top-down view of the exemplary structure of FIG. 12A. The vertical plane A-A' is the plane of the schematic vertical cross-sectional view of FIG. 12A.
Figure 12C:
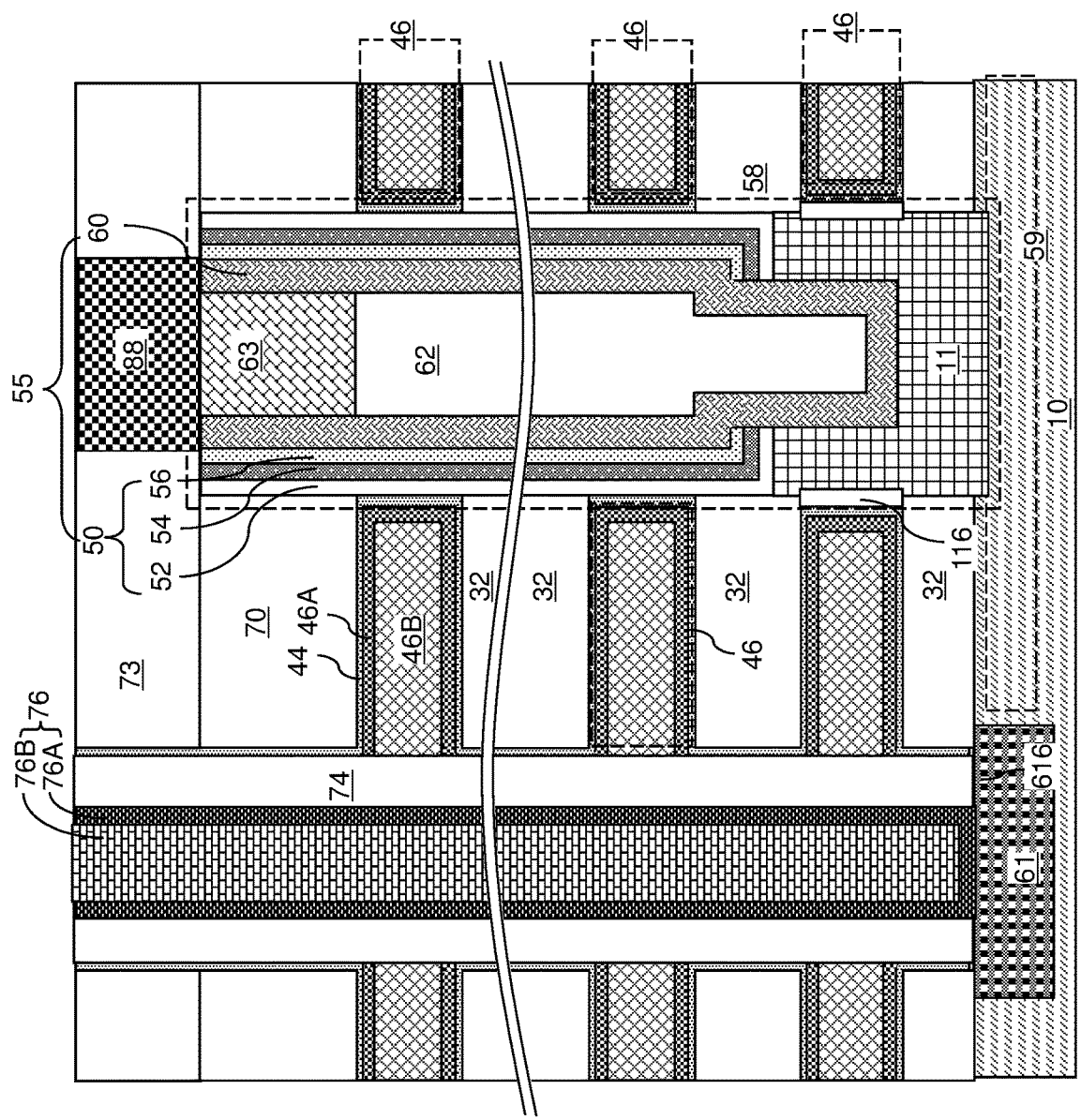
FIG. 12C is a vertical cross-sectional view of a region of the exemplary structure of FIGS. 12A and 12B.

Referring to FIGS. 12A-12C, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

The exemplary structure can include a three-dimensional memory device 400. In one embodiment, the three-dimensional memory device 400 comprises a three-dimensional NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (comprising a portion of a charge storage layer 54 at a level of an electrically conductive layer 46) in a first device level of the array of monolithic three-dimensional NAND strings can be located over another memory cell (comprising another portion of the charge storage layer 54 at a level of another electrically conductive layer 46) in a second device level of the array of monolithic three-dimensional NAND strings. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10) and comprising a respective one of the vertical semiconductor channels 60; and a plurality of charge storage elements (comprising portions of the memory films 50, i.e., portions of the charge storage layer 54). Each charge storage element can be located adjacent to a respective one of the plurality of semiconductor channels (59, 11, 60). Generally, a two-dimensional array of semiconductor channels 60 and a two-dimensional array of drain regions 63 connected to an end of a respective one of the semiconductor channels 60 may be formed over a substrate (9, 10).

Figure 13A:
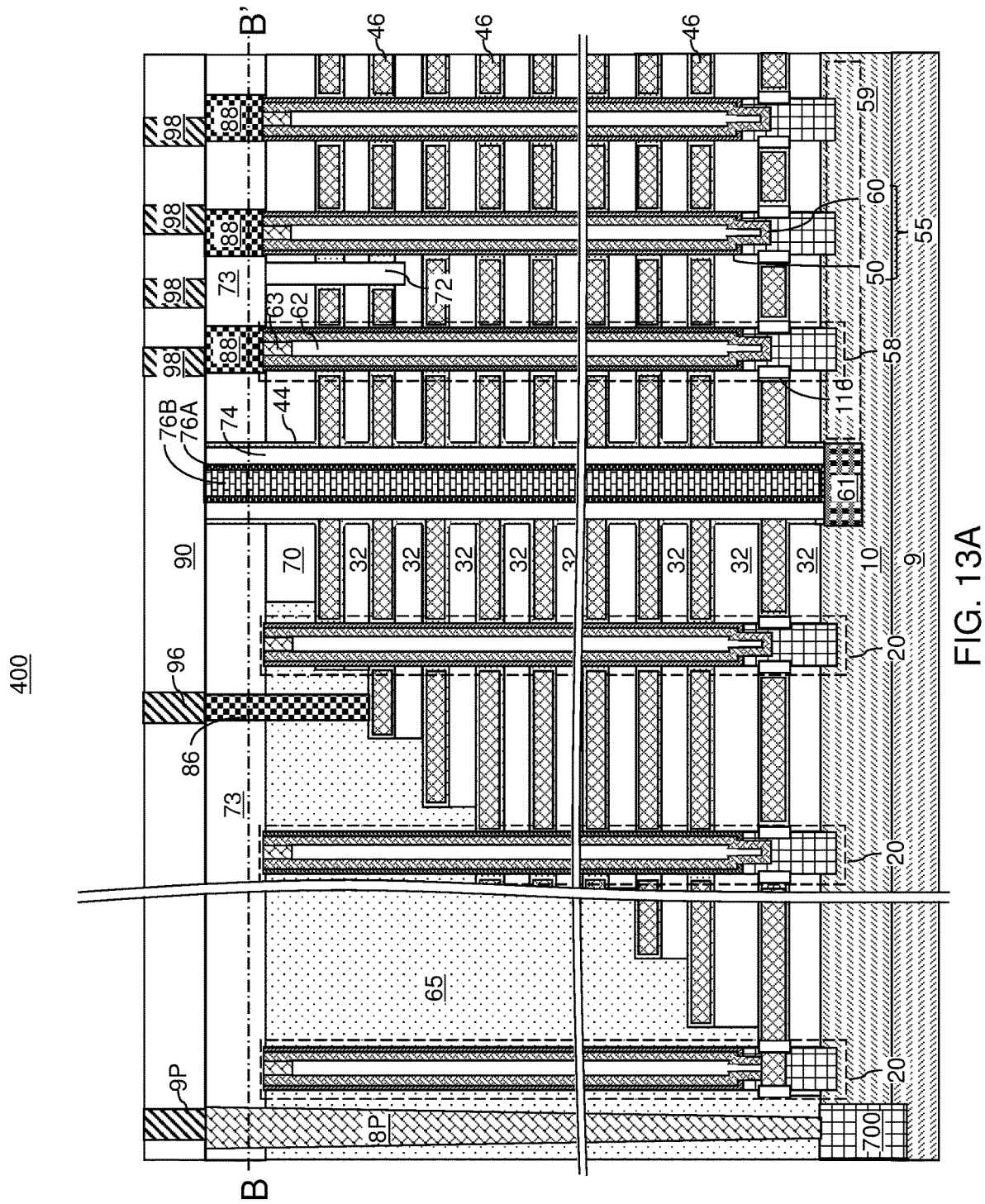
FIG. 13A is schematic vertical cross-sectional view of the exemplary structure after formation of a connection-level dielectric layer and connection-level via structures according to an embodiment of the present disclosure.
Figure 13B:
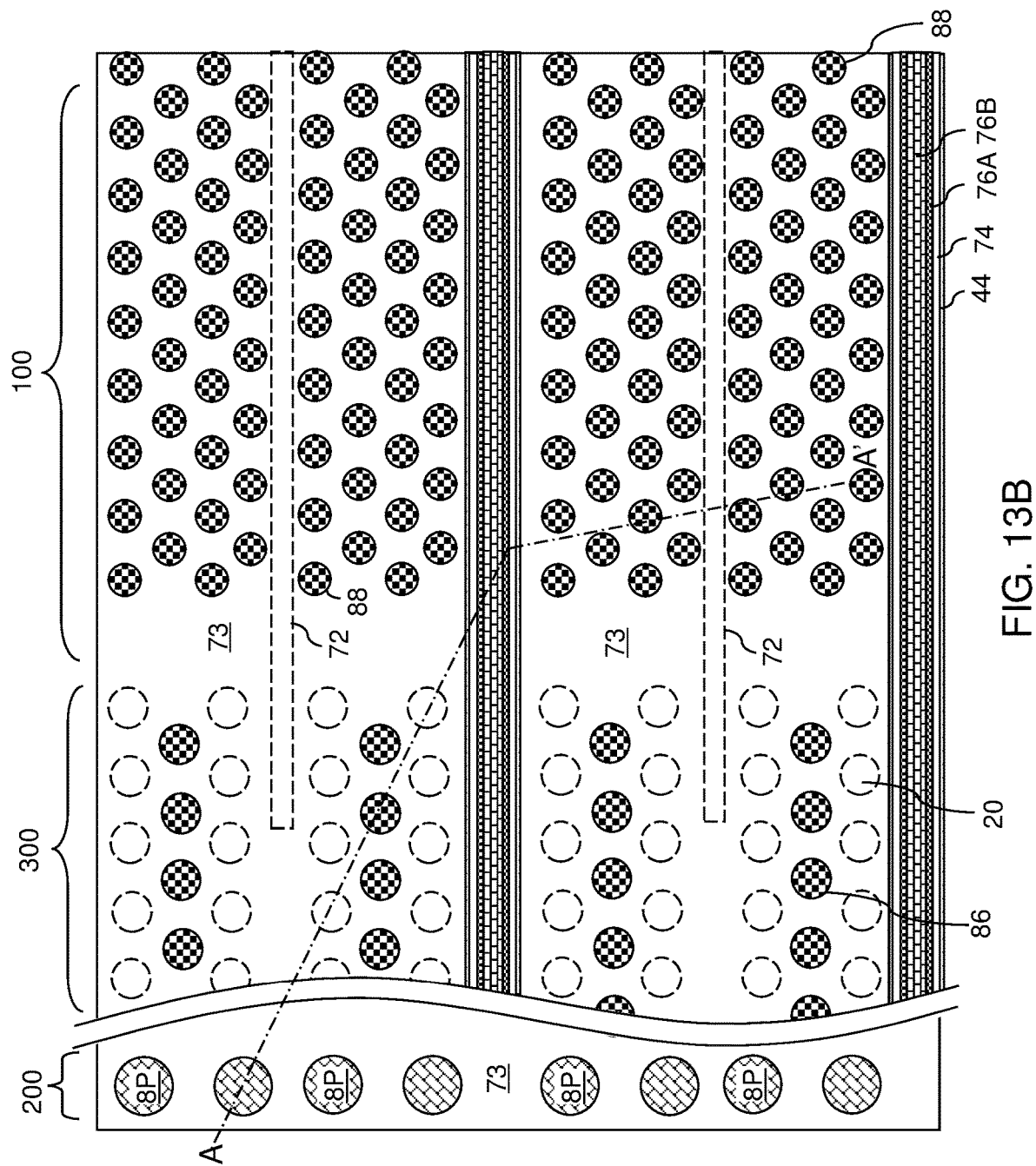
FIG. 13B is a horizontal cross-sectional view along the plane B-B' of the exemplary structure of FIG. 13A. The vertical plane A-A' is the plane of the schematic vertical cross-sectional view of FIG. 13A.
Figure 13C:
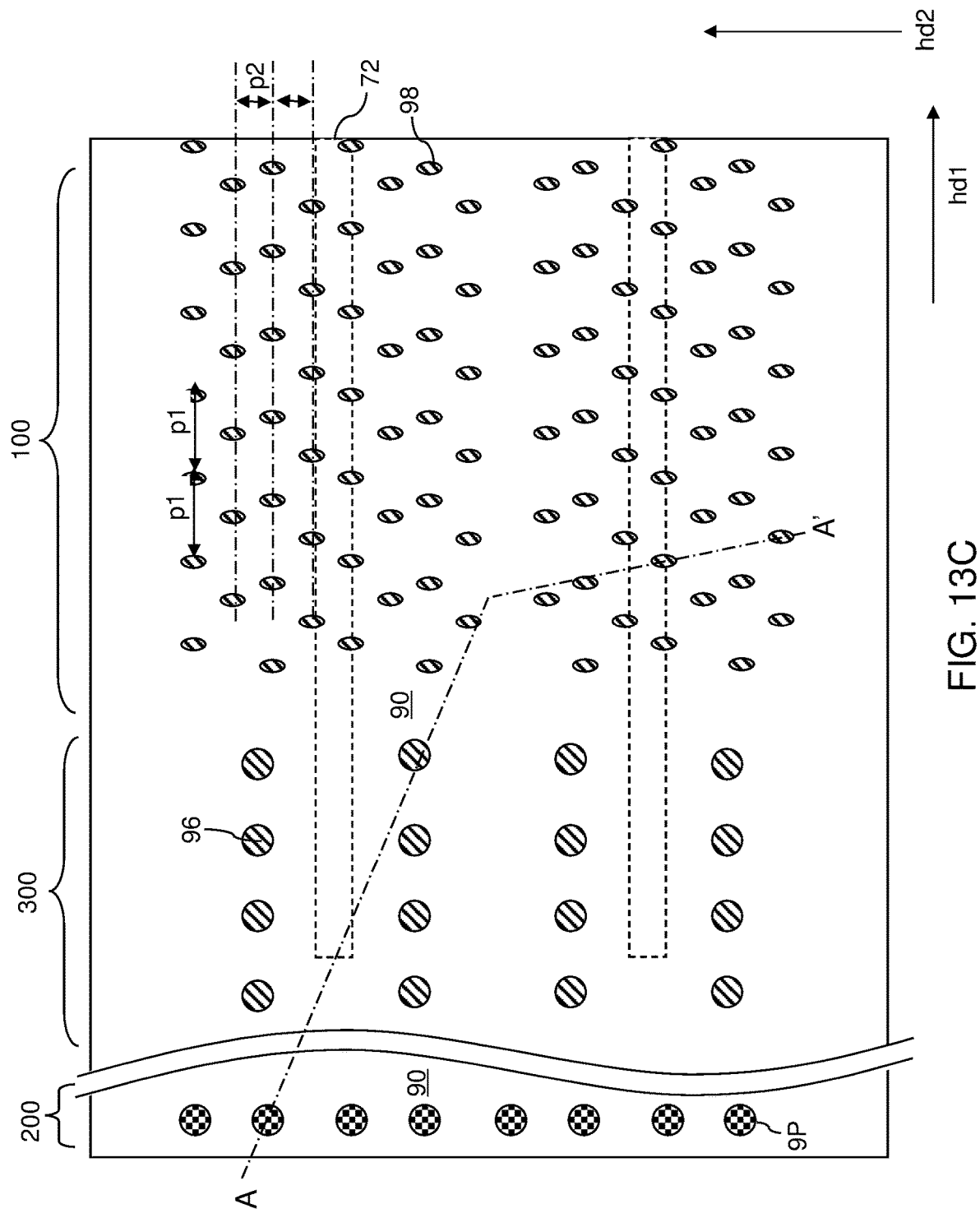
FIG. 13C is a top-down view of the exemplary structure of FIG. 13A. The vertical plane A-A' is the plane of the schematic vertical cross-sectional view of FIG. 13A.

Referring to FIGS. 13A-13C, a connection-level dielectric layer 90 can be formed over the contact-level dielectric layer 73, or any underlying layer embedding contact via structures, such as drain contact via structures 88 that contact the drain regions 63. The connection-level dielectric layer 90 may include an interconnect-level dielectric material such as undoped silicate glass, a doped silicate glass, or organosilicate glass. The thickness of the connection-level dielectric layer 90 can be in a range from 100 nm to 1,000 nm, such as from 200 nm to 500 nm, although lesser and greater thicknesses may also be employed.

Connection via cavities can be formed through the connection-level dielectric layer 90 by depositing and lithographically patterning a photoresist layer over the connection-level dielectric layer 90, and transferring the pattern of openings in the photoresist layer through the connection-level dielectric layer 90 employing an anisotropic etch process. The photoresist layer can be subsequently removed, for example, by ashing.

At least one electrically conductive material can be deposited in the connection via cavities, and excess portions of the at least one electrically conductive material can be removed from above the horizontal plane including the top surface of the connection-level dielectric layer by a planarization process, which may include a chemical mechanical planarization process and/or a recess etch process. Each remaining portion of the at least one electrically conductive material located within a respective one of the connection via cavities comprise connection-level via structures (98, 96, 9P). The connection-level via structures (98, 96, 9P) can comprise drain-side connection-level via structures 98 contacting a top surface of a respective one of the drain contact via structures 88, word-line-side connection-level via structures 96 contacting a top surface of a respective one of the word line contact via structures 86, source-side connection via structures (not illustrated) contacting the backside contact via structures 76, and peripheral-region connection via structures 9P contacting a top surface of a respective one of the peripheral device contact via structures 8P.

Generally, a combination of a connection-level material layer (such as the connection-level dielectric layer 90) and a two-dimensional array of connection via structures (such as the drain-side connection-level via structures 98) embedded in the connection-level material layer can be formed over the semiconductor device array. Each of the connection via structures within the two-dimensional array of connection via structures (such as the drain-side connection-level via structures 98) overlies, and is electrically connected to, a respective one of the doped semiconductor material regions (such as the drain regions 63). In one embodiment, the drain-side connection-level via structures 98 can be laterally elongated along a horizontal direction that is perpendicular to the lengthwise direction of the backside trenches 79. For example, the drain-side connection-level via structures 98 can be laterally elongated along the second horizontal direction hd2, which is the lengthwise direction of bit lines to be subsequently formed.

FIGS. 14A-14I are sequential vertical cross-sectional views of a region of the exemplary structure during formation of a bit-line-level dielectric layer, an etch stop dielectric layer, and bit lines according to an embodiment of the present disclosure.

Figure 14B:
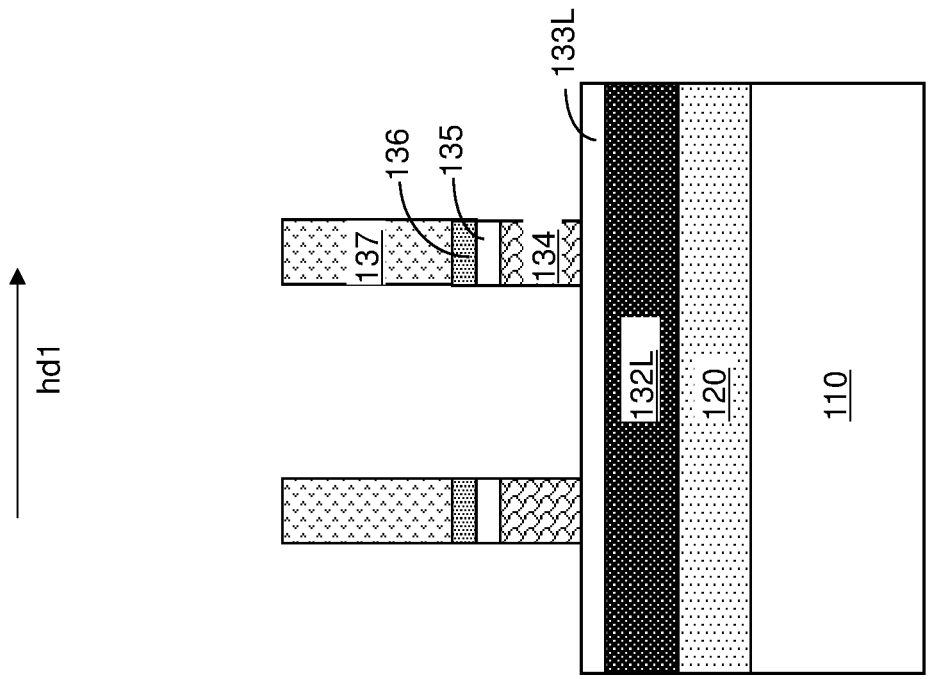
Figure 14A:
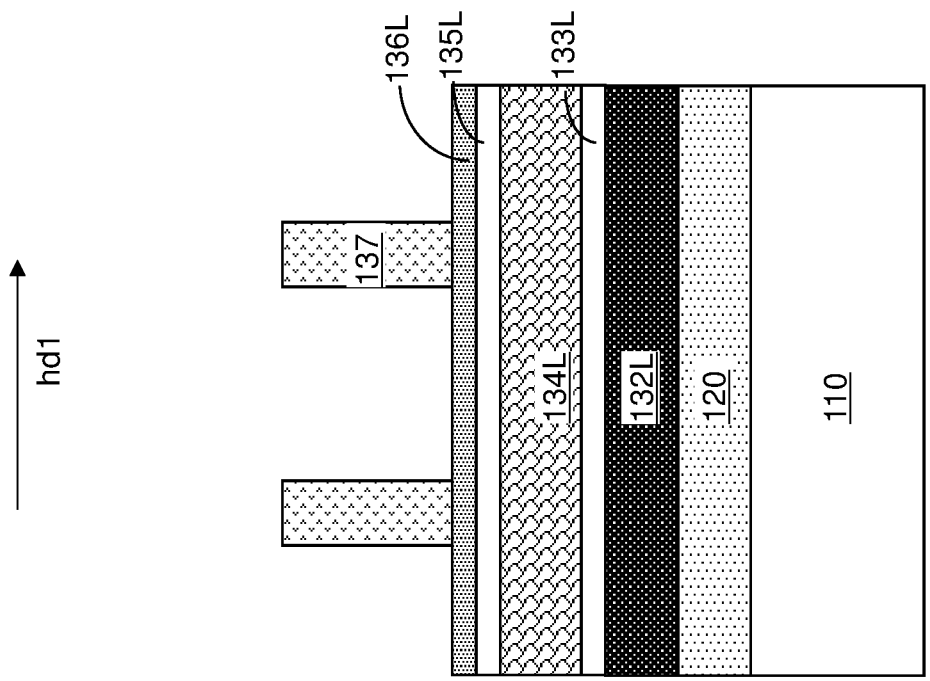

Referring to FIG. 14A, a vertical layer stack including a bit-line-level dielectric layer 110, an etch stop dielectric layer 120, and lithographic material layers (132L, 133L, 134L, 135L, 136L, 137) can be formed over the drain-side connection-level via structures 98. The vertical layer stack (110, 120, 132L, 133L, 134L, 135L, 136L, 137) may be formed directly on the two-dimensional array of drain-side connection-level via structures 98 and directly on the connection-level dielectric layer 90.

The bit-line-level dielectric layer 110 includes a dielectric material such as undoped silicate glass, a doped silicate glass, organosilicate glass, and/or silicon nitride. The bit-line-level dielectric layer 110 may be deposited, for example, by chemical vapor deposition, and may have a thickness in a range from 50 nm to 500 nm, such as from 80 nm to 300 nm, although lesser and greater thicknesses may also be employed.

The etch stop dielectric layer 120 includes a dielectric material that may function as an etch stop layer during a subsequent anisotropic etch process. Generally, the etch stop dielectric layer 120 includes a material that can provide higher etch resistivity than the dielectric material(s) of at least one via-level dielectric layer to be subsequently formed thereupon in a subsequent processing step. The etch stop dielectric layer 120 may have a thickness in a range from 10 nm to 100 nm, such as from 20 nm to 50 nm, although lesser and greater thicknesses may also be employed. In one embodiment, the etch stop dielectric layer 120 has a dielectric constant below 3.9 (i.e., the dielectric constant of silicon oxide), such as 1.5 to 3.5. For example, the etch stop dielectric layer 120 may include, or may consist essentially of, a material selected from nitrogen-doped organosilicate glass (i.e., carbon doped silicon oxynitride), silicon carbide nitride (i.e., silicon carbonitride), and carbon-doped silicon oxide (e.g., silicon oxycarbide or porous carbon doped glass), or other low-k materials that can act as an etch stop during etching of silicon oxide or silicon nitride.

The lithographic material layers (132L, 133L, 134L, 135L, 136L, 137) includes at least a photoresist layer 137 and optionally includes additional temporary material layers that can be employed form a high-density line and space pattern for forming bit lines, i.e., a line and space pattern having a small pitch. In an illustrative example, the lithographic material layers (132L, 133L, 134L, 135L, 136L, 137) may include, from bottom to top, a carbon hard mask layer 132L, a first dielectric hard mask layer 133L, an amorphous silicon layer 134L, a second dielectric hard mask layer 135L, a bottom anti-reflective coating (BARC) layer 136L, and the photoresist layer 137. The carbon hard mask layer 132L can include amorphous carbon or diamond-like carbon, and can have a thickness in a range from 30 nm to 200 nm, although lesser and greater thicknesses may also be employed. The first dielectric hard mask layer 133L can include silicon oxide, silicon nitride, or silicon oxynitride, and can have a thickness in a range from 10 nm to 100 nm, although lesser and greater thicknesses may also be employed. The amorphous silicon layer 134L can include amorphous silicon, and can have a thickness in a range from 30 nm to 200 nm, although lesser and greater thicknesses may also be employed. The second dielectric hard mask layer 135L can include silicon oxide, silicon nitride, or silicon oxynitride, and can have a thickness in a range from 10 nm to 100 nm, although lesser and greater thicknesses may also be employed. The BARC layer 136L can include amorphous silicon, and can have a thickness in a range from 10 nm to 100 nm, although lesser and greater thicknesses may also be employed. The photoresist layer 137 can include a photoresist material such as an extreme ultraviolet (EUV) photoresist material or a deep ultraviolet (DUV) photoresist material.

The photoresist layer 137 may be photolithographically patterned with a line and space pattern that extends along the second horizontal direction hd2, and has a periodicity (i.e., a pitch) along the first horizontal direction hd1 that is twice the periodicity (i.e., double the pitch) of bit lines to be subsequently formed. For example, if the bit lines to be subsequently formed has a pitch of 10 nm along the first horizontal direction hd1, the pitch of the line and space pattern in the patterned photoresist layer 137 may be 20 nm. In one embodiment, the spacing between neighboring pairs of line patterns in the patterned photoresist layer 137 may be about three times the width of each line pattern in the patterned photoresist layer 137.

Referring to FIG. 14B, an anisotropic etch process can be performed to transfer the pattern in the photoresist layer 137 through the BARC layer 136L, the second dielectric hard mask layer 135L, and the amorphous silicon layer 134L. Patterned portions of the BARC layer 136L, the second dielectric hard mask layer 135L, and the amorphous silicon layer 134L include a one-dimensional array of rail structures (136, 135, 134) including, from top to bottom, a BARC strip 136, a second dielectric hard mask strip 135, and an amorphous silicon strip 134. The photoresist layer 137 can be subsequently removed, for example, by ashing.

Figure 14D:
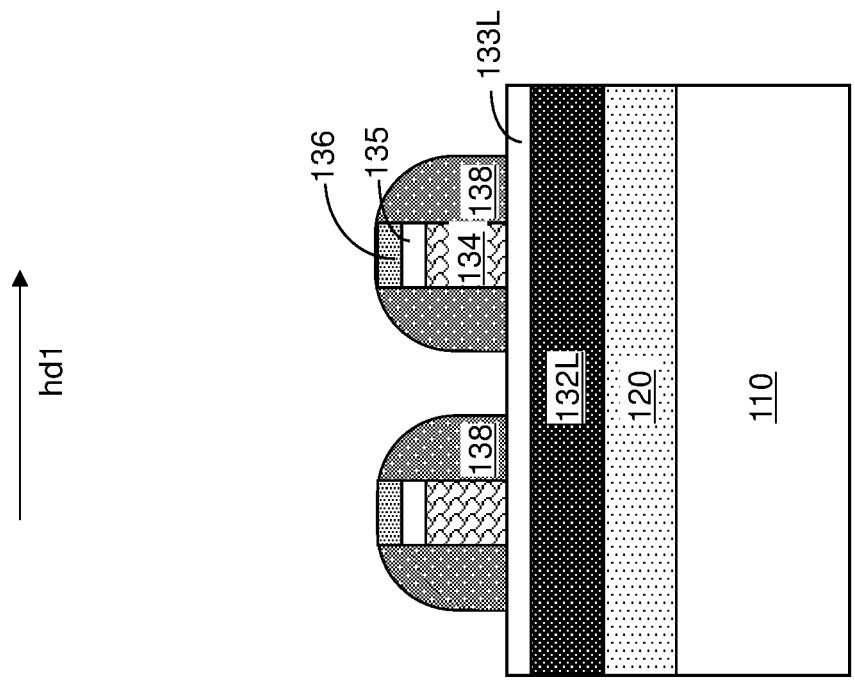
Figure 14C:
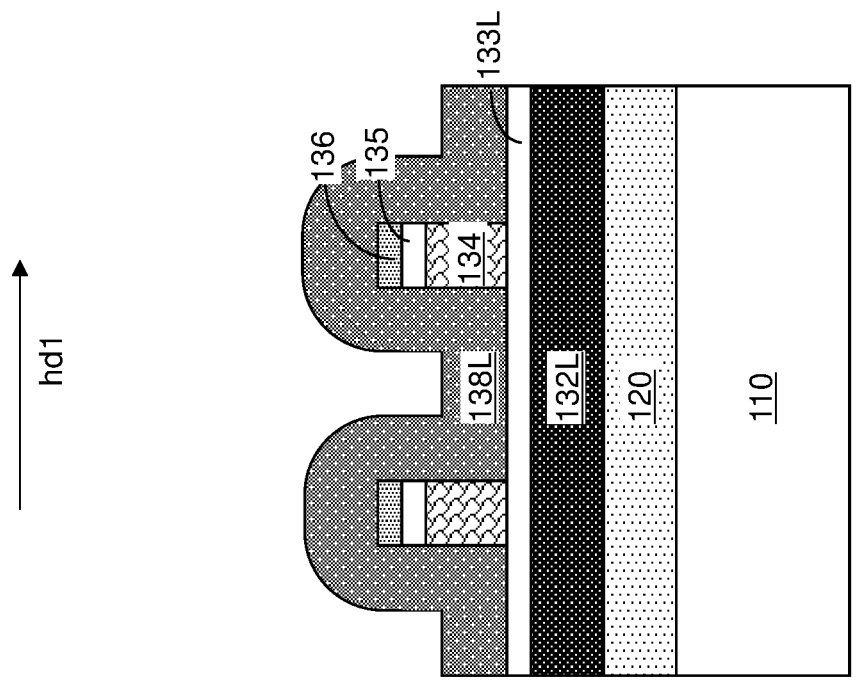

Referring to FIG. 14C, a dielectric mask material layer 138L can be deposited over the one-dimensional array of rail structures (136, 135, 134) by a conformal deposition process such as a chemical vapor deposition process. The dielectric mask material layer 138L includes a dielectric material such as silicon nitride or silicon oxide. The thickness of the dielectric mask material layer 138L can be the same as, or about the same as, the width of each bit line to be subsequently formed.

Referring to FIG. 14D, an anisotropic sidewall spacer etch process can be performed to remove horizontally-extending portions of the dielectric mask material layer 138L. Each remaining portion of the dielectric mask material layer 138L comprises a dielectric spacer 138. The dielectric spacers 138 can have a uniform pitch along the first horizontal direction hd1, which is the same as the pitch of bit lines to be subsequently formed. In one embodiment, a top surface of rail structure (136, 135, 134) or a top surface of a first dielectric hard mask layer 133L may be physically exposed between each neighboring pair of dielectric spacers 138. The dielectric spacers 138 can laterally extend straight along the second horizontal direction hd2.

Figure 14F:
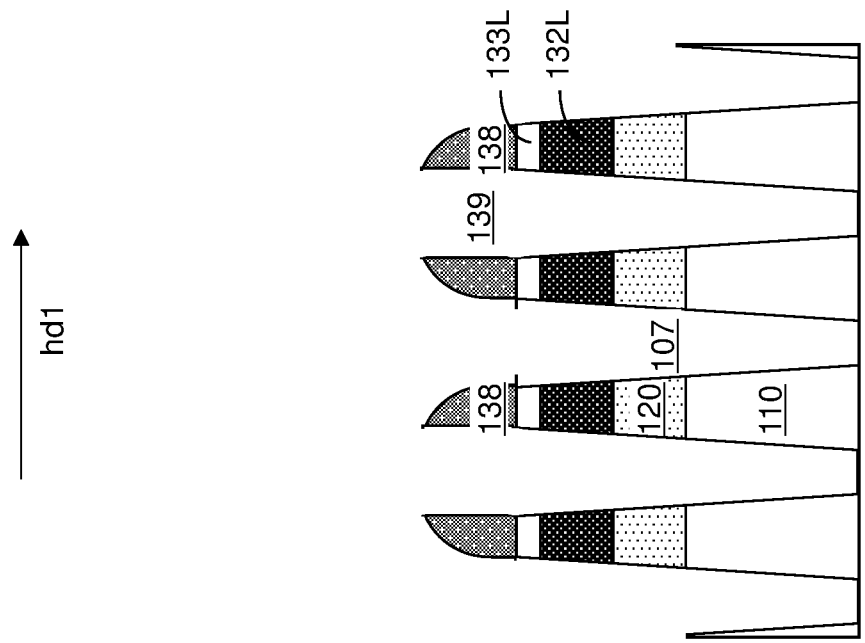
Figure 14E:
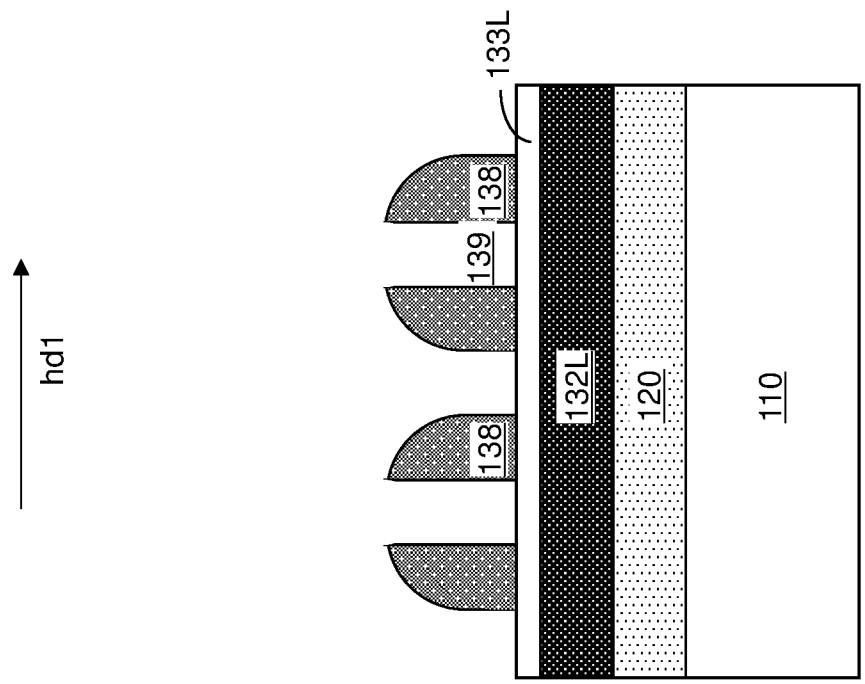

Referring to FIG. 14E, at least one etch process can be performed to remove the rail structures (136, 135, 134) selective to the dielectric spacers 138. The at least one etch process may comprise at least one isotropic etch process (such as a wet etch process) and/or at least one anisotropic etch process (such as a reactive ion etch process). In some embodiments, physically exposed portions of the first dielectric hard mask layer 133L may be partially or fully collaterally removed.

Referring to FIG. 14F, an anisotropic etch process can be performed to etch the materials of the first dielectric hard mask layer 133L, the carbon hard mask layer 132L, the etch stop dielectric layer 120, and the bit-line-level dielectric layer 110. The dielectric spacers 138 can be employed as an etch mask layer during the anisotropic etch process. In some embodiments, the dielectric spacers 138 may be consumed during the anisotropic etch process and the patterned portions of the carbon hard mask layer 132L may be employed as an etch mask layer during a terminal step of the anisotropic etch process. Alternatively, at least a portion of the dielectric spacers 138 may remain after the anisotropic etch process. In this case, the carbon hard mask layer 132L may be employed to increase the pattern fidelity in the etch stop dielectric layer 120, and the bit-line-level dielectric layer 110.

Bit-line trenches 107 can be formed through the carbon hard mask layer 132L, the etch stop dielectric layer 120, and the bit-line-level dielectric layer 110. In one embodiment, the bit-line trenches 107 can be formed as a one-dimensional periodic pattern of trenches having a bit line pitch along the first horizontal direction hd1 and laterally extending straight along the second horizontal direction hd2. In one embodiment, each of the bit-line trenches 107 may have a respective vertical cross-sectional profile of an inverted trapezoid (i.e., a trapezoid having a lesser bottom width than a top width). The bit line pitch can be selected such that the periodicity of the memory opening fill structures 58 along the first horizontal direction hd1 is commensurate with the bit line pitch. In one embodiment, the periodicity of the memory opening fill structures 58 along the first horizontal direction hd1 maybe an integer multiple of the bit line pitch.

Figure 14H:
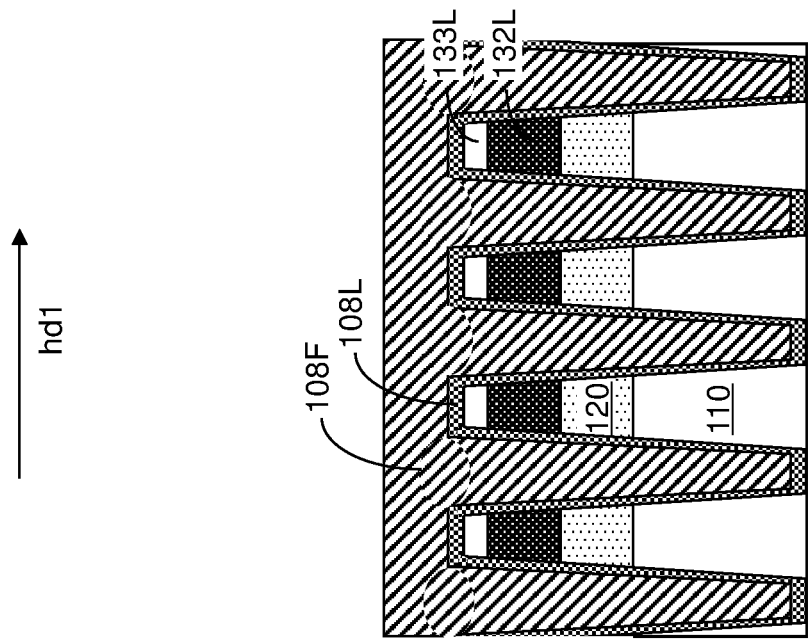
Figure 14G:
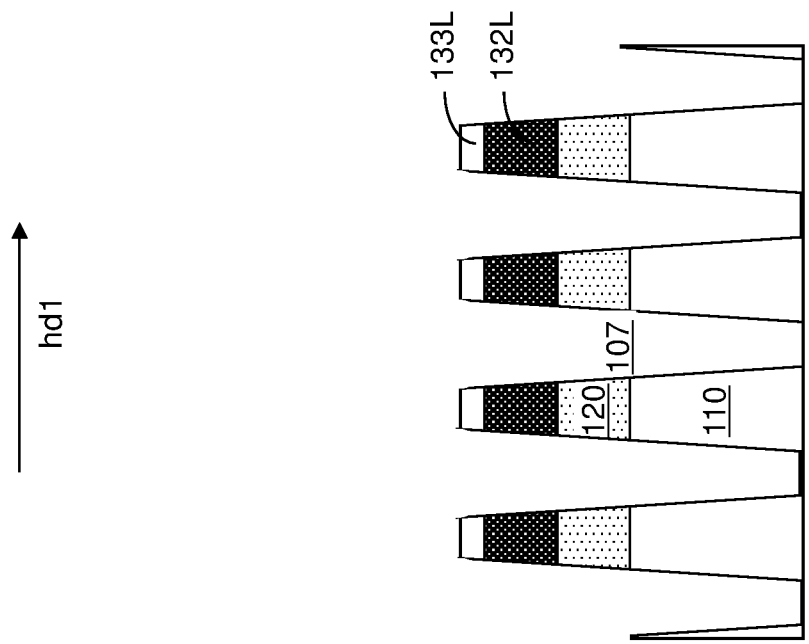
Figure 15A:
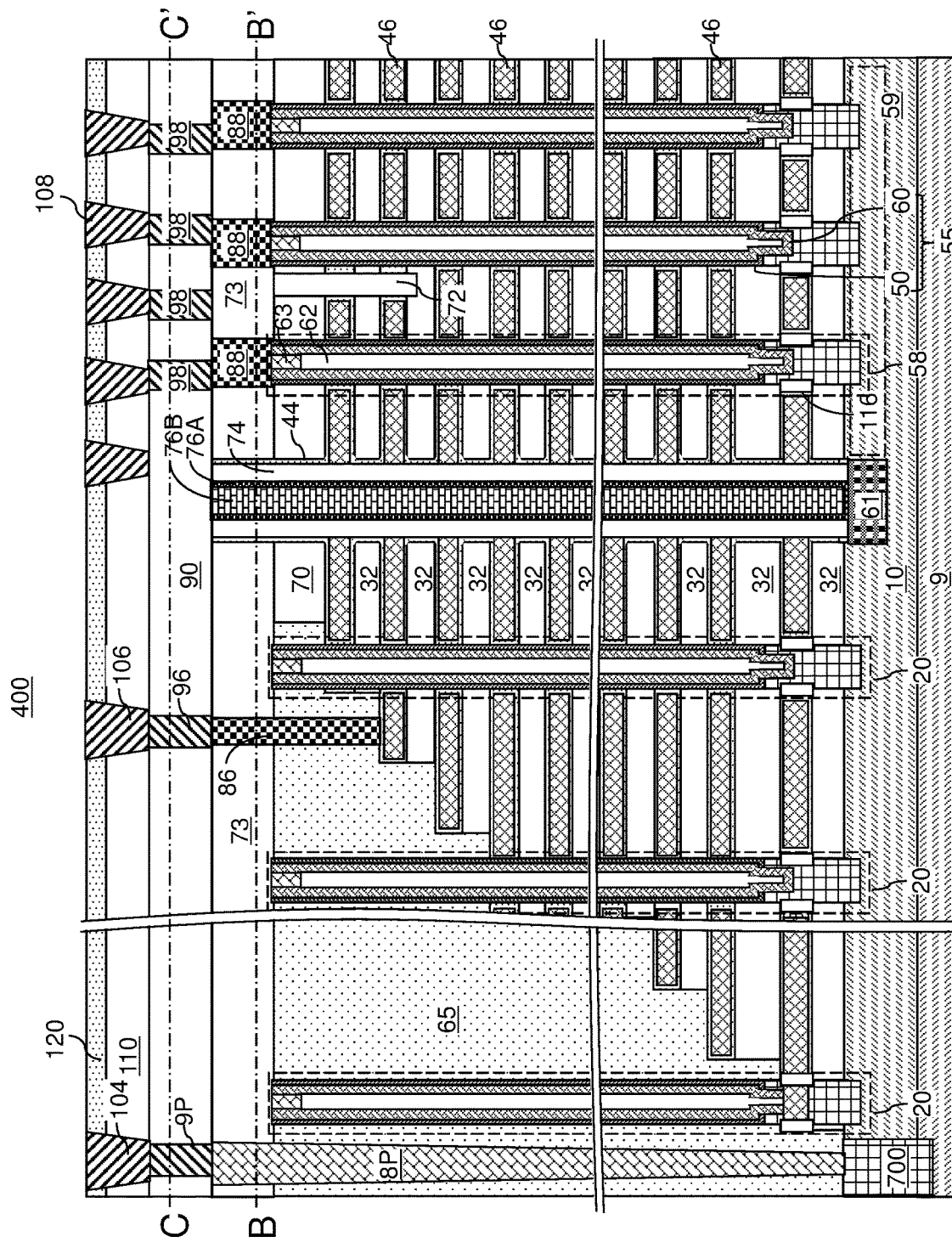
FIG. 15A is schematic vertical cross-sectional view of the exemplary structure after formation of bit lines according to an embodiment of the present disclosure.
Figure 15B:
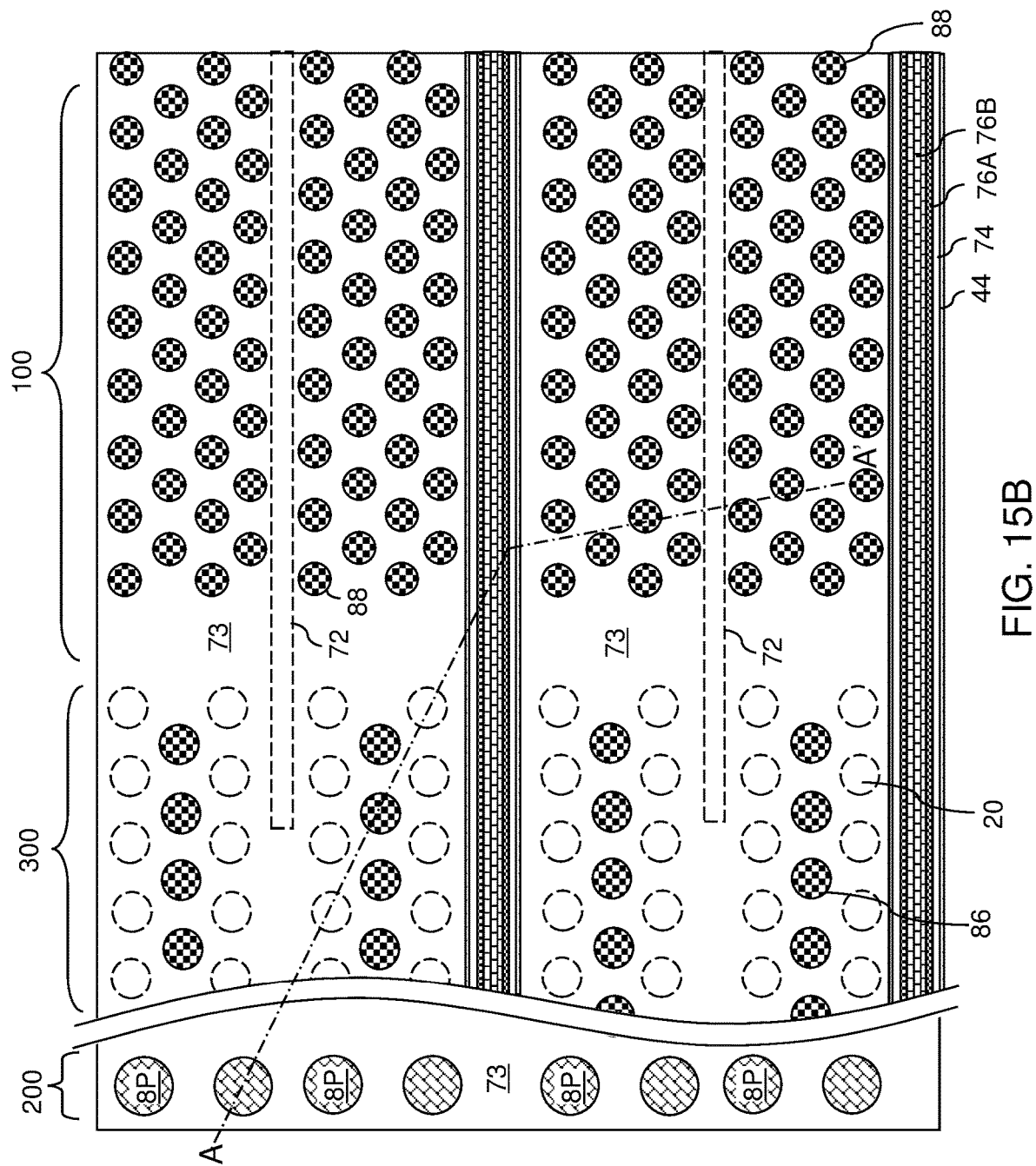
FIG. 15B is a horizontal cross-sectional view along the plane B-B' of the exemplary structure of FIG. 15A. The vertical plane A-A' is the plane of the schematic vertical cross-sectional view of FIG. 15A.
Figure 15C:
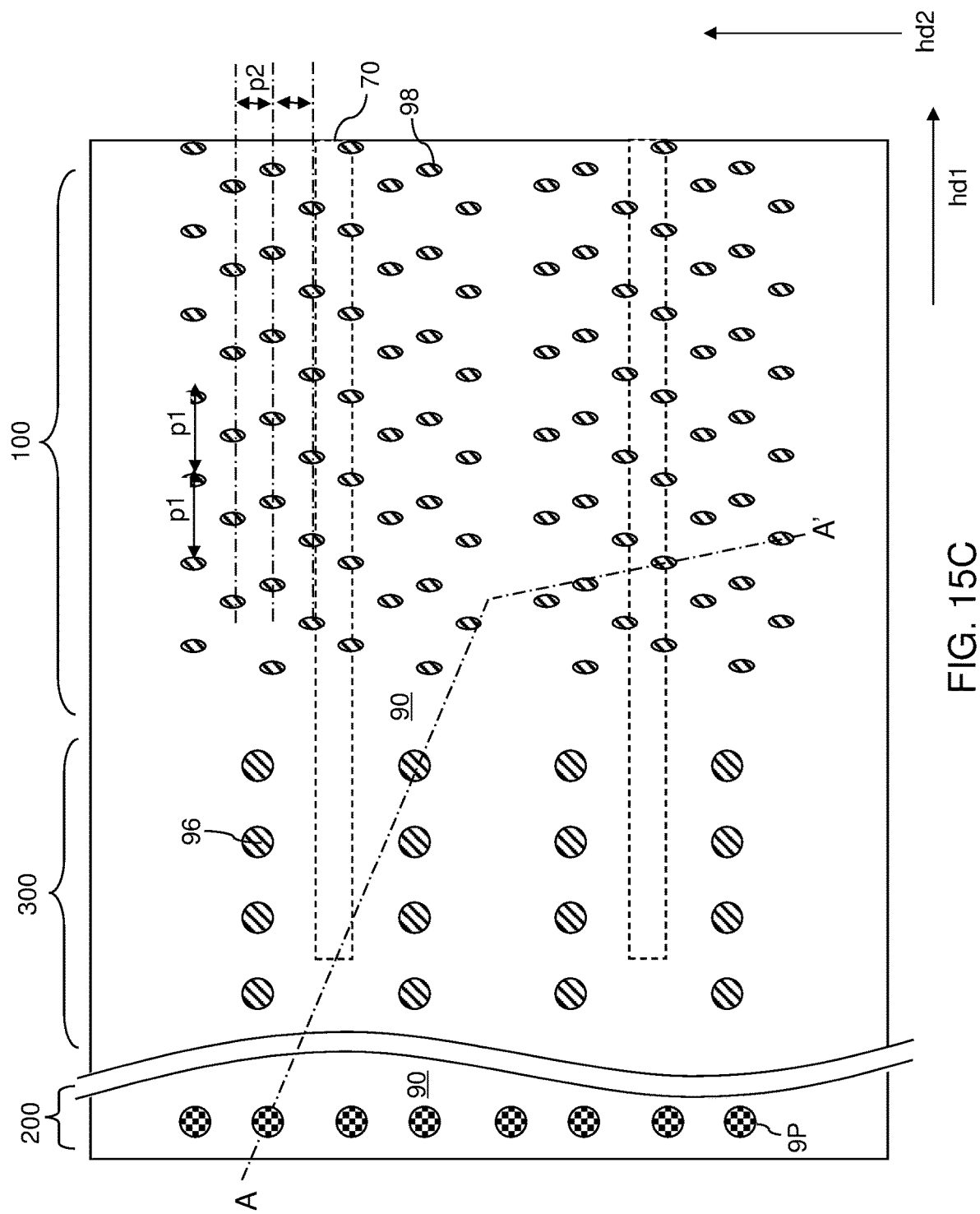
FIG. 15C is a horizontal cross-sectional view along the plane C-C' of the exemplary structure of FIG. 15A. The vertical plane A-A' is the plane of the schematic vertical cross-sectional view of FIG. 15A.
Figure 15D:
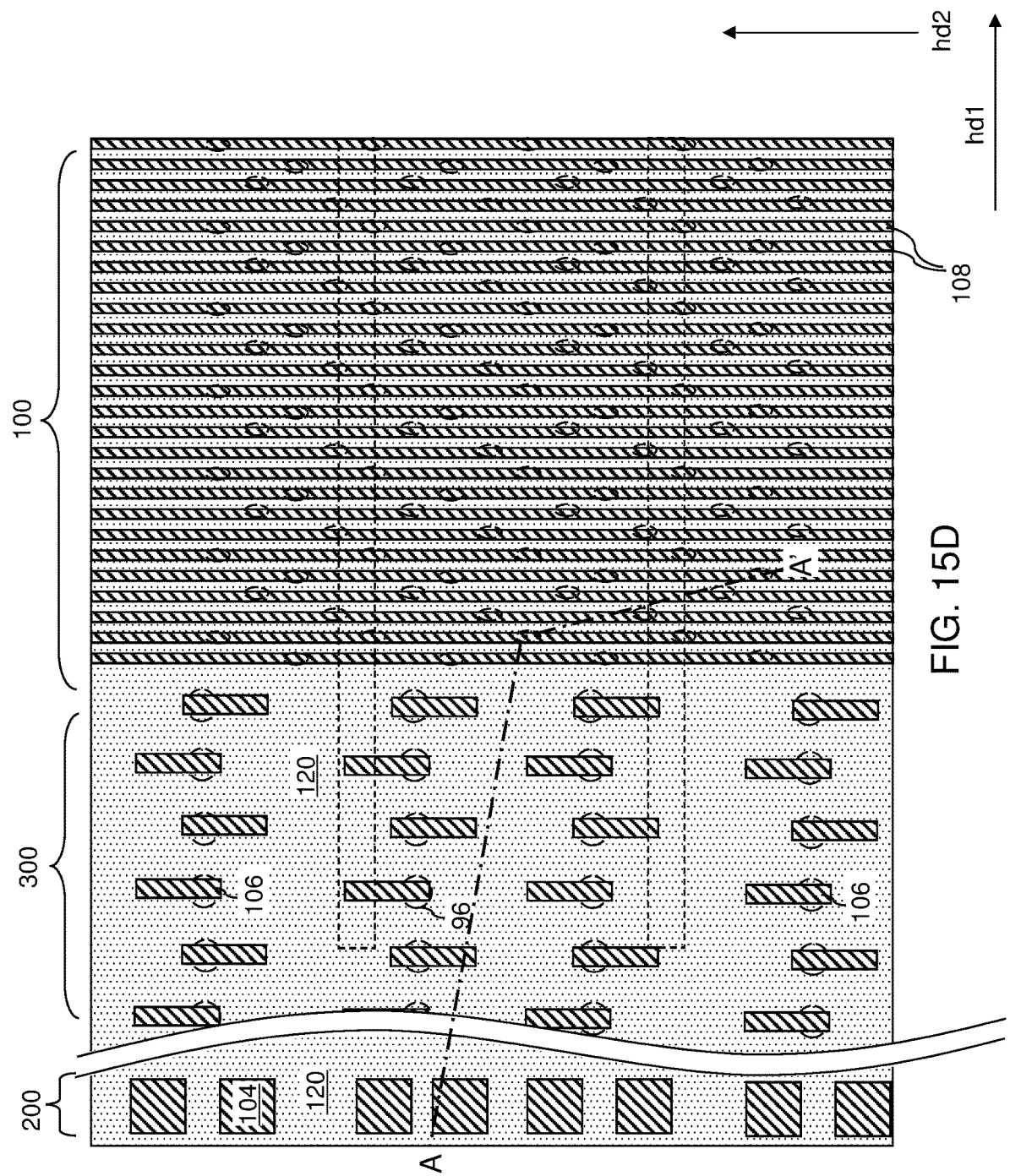
FIG. 15D is a top-down view of a region of the exemplary structure of FIG. 15A.

Referring to FIG. 14G, in case any portion of the dielectric spacers 138 remain after the processing steps of FIG. 14F, such remaining portions of the dielectric spacers 138 can be removed selective to the materials of the carbon hard mask layer 132L, the etch stop dielectric layer 120, and the bit-line-level dielectric layer 110, for example, by performing an isotropic etch process such as a wet etch process.

Referring to FIG. 14H, a continuous metallic liner 108L comprising a metal, a metallic nitride material or a metallic carbide material can be deposited on physically exposed sidewalls of the bit-line-level dielectric layer 110, the etch stop dielectric layer 120, the carbon hard mask layer 132L, and the first dielectric hard mask layer 133L if present). For example, the continuous metallic liner 108L may include, and/or may consist essentially of, ruthenium, cobalt, nickel, titanium, tantalum, titanium nitride, tantalum nitride, tungsten nitride, titanium carbide, tantalum carbide, and/or tungsten carbide. The continuous metallic liner 108L can be deposited by chemical vapor deposition or physical vapor deposition. The lateral thickness of portions of the continuous metallic liner 108L over sidewalls of the bit-line-level dielectric layer 110, the etch stop dielectric layer 120, and the carbon hard mask layer 132L may be in a range from 2 nm to 20 nm, such as from 4 nm to 10 nm, although lesser and greater thicknesses may also be employed.

A metallic fill material layer 108F can be deposited over the continuous metallic liner 108L. The metallic fill material layer 108F comprises, and/or consists essentially of, a material selected from tungsten, titanium, tantalum, molybdenum, ruthenium, cobalt, nickel, aluminum, copper or alloys thereof. The metallic fill material layer 108F can be deposited by electroplating, electroless plating, physical vapor deposition, and/or chemical vapor deposition. The metallic fill material layer 108F can fill remaining unfilled volumes of the bit-line trenches 107.

Referring to FIG. 14I, a chemical planarization process can be performed to remove portions of the metallic fill material layer 108F and the continuous metallic liner 108L, the first dielectric hard mask layer 133L, and the carbon hard mask layer 132L from above the horizontal plane including the top surface of the etch stop dielectric layer 120. Each remaining portion of the continuous metallic liner 108L comprises a metallic liner 108A. Each remaining portion of the metallic fill material layer 108F comprises a metallic fill material portion 108B. Each contiguous combination of a metallic liner 108A and a metallic fill material portion 108B located within a same bit-line trench 107 constitutes a bit line 108. A one-dimensional array of bit lines 108 can be formed within a layer stack including the bit-line-level dielectric layer 110 and the etch stop dielectric layer 120. The bit lines 108 can have top surfaces within the horizontal plane including the top surface of the etch stop dielectric layer 120.

In one embodiment, each bit line 108 within the one-dimensional array of bit lines 108 comprises a metallic liner 108A comprising a metal, metallic nitride material or a metallic carbide material and contacting sidewalls of the bit-line-level dielectric layer 110 and sidewalls of the etch stop dielectric layer 120, and a metallic fill material portion 108B embedded within the metallic liner 108A and laterally spaced from the bit-line-level dielectric layer 110 and the etch stop dielectric layer 120. In one embodiment, bottom surface of the bit lines 108 within the one-dimensional array of bit lines 108 can be located within a horizontal plane including a bottom surface of the bit-line-level dielectric layer 110.

Referring to FIGS. 15A-15D, the exemplary structure 400 is illustrated after the processing steps of FIG. 14I. The one-dimensional array of bit lines 108 can be formed in the memory array region 100 and additional bit-line-level metal interconnect structures (106, 104) may be formed in the contact region 300 and in the peripheral device region 200 (if present). The additional bit-line-level metal interconnect structures (106, 104) can include, for example, word-line-side connection line structures 106 contacting the word-line-side connection-level via structures 96, source-side connection line structures (not illustrated) contacting the source-side connection via structures (not illustrated), and optional peripheral connection line structures 104 contacting the peripheral-region connection via structures 9P.

In one embodiment, the bit lines 108 can be formed as a one-dimensional periodic array of bit lines 108 over the connection-level dielectric layer 90. In one embodiment, the sidewalls of the bit lines 108 can have a non-zero taper angle as measured from a vertical direction. The non-zero-taper angle may be in a range from 0.01 degree to 5 degrees, such as from 0.1 degree to 2 degrees. In one embodiment, each of the bit lines 108 can have an inverted trapezoidal vertical cross-sectional shape within vertical planes that are parallel to the first horizontal direction hd1 and perpendicular to the second horizontal direction hd2. The inverted trapezoidal vertical cross-sectional shape can be invariant along the second horizontal direction hd2.

A one-dimensional array of bit lines 108 is formed such that each of the bit lines 108 contacts top surfaces of a respective subset of the connection via structures 98. The connection-level dielectric layer 90 laterally surrounds a lower portion of each of the connection via structures 98. The connection-level dielectric layer 90 comprises a topmost surface contacting the bottom surface of the bit-line-level dielectric layer 110 and bottom surfaces of the bit lines 108.

Figure 16A:
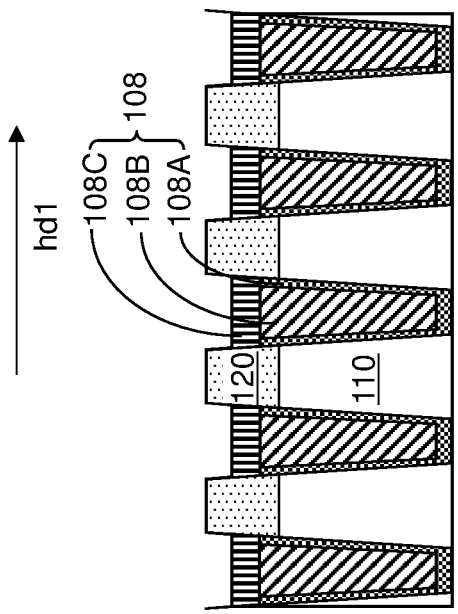
FIGS. 16A-16C are sequential vertical cross-sectional views of a region of the exemplary structure during formation of capping dielectric strips according to an embodiment of the present disclosure.
Figure 16B:
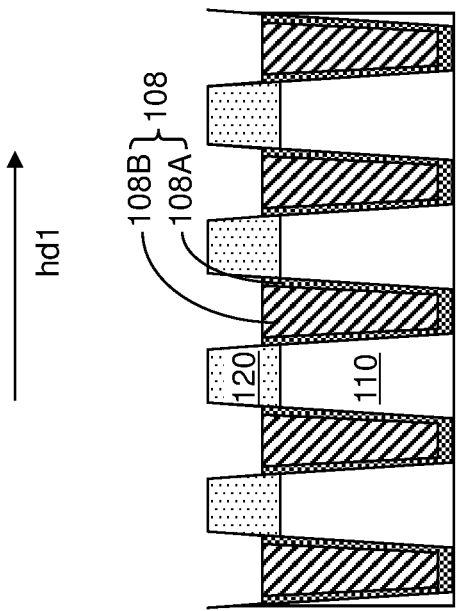
Figure 16C:
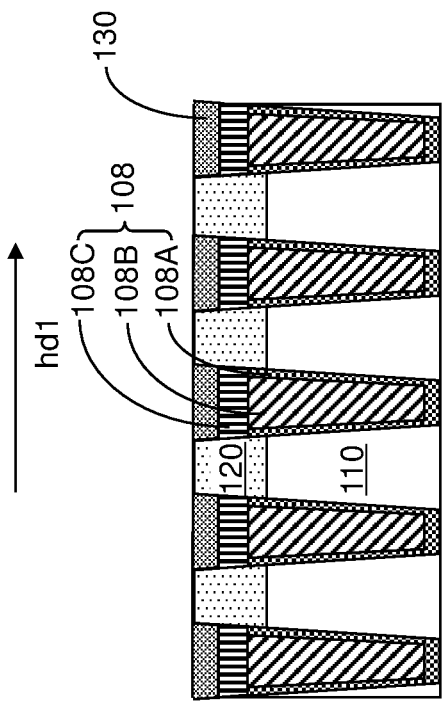

FIGS. 16A-16C are sequential vertical cross-sectional views of a region of the exemplary structure during formation of capping dielectric strips 130 according to an embodiment of the present disclosure.

Referring to FIG. 16A, a recess etch process can be performed to vertically recess the metallic materials of the metallic fill material portions 108B and the metallic liners 108A selective to the dielectric material of the etch stop dielectric layer 120. The recess etch process may comprise an isotropic etch process such as a wet etch process, and/or an anisotropic etch process such as a reactive ion etch process. The top surfaces of the bit lines 108 can be recessed below the horizontal plane including the top surface of the etch stop dielectric layer 120. In one embodiment, the vertical recess distance of the recess etch process may be in a range from 20% to 90%, such as from 40% to 80%, of the thickness of the etch stop dielectric layer 120. In one embodiment, the vertical recess distance may be in a range from 3 nm to 90 nm, such as from 5 nm to 80 nm, although lesser and greater thicknesses may also be employed.

Generally, the recessed top surfaces of the bit lines 108 can be formed below the horizontal plane including the top surface of the etch stop dielectric layer 120. A respective metallic liner 108A and a respective metallic fill material portion 108B have top surfaces below a horizontal plane including a top surface of the etch stop dielectric layer 120. In one embodiment, the recessed top surfaces of the bit lines 108 may be formed above the horizontal plane including the bottom surface of the etch stop dielectric layer 120. Thus, the metallic liner 108A and the metallic fill material portion 108B of each bit line 108 comprise a respective top surface located above the horizontal plane including the bottom surface of the etch stop dielectric layer 120. Top surfaces of the additional bit-line-level metal interconnect structures (106, 104) can be vertically recessed in the same manner concurrently with the vertical recessing of the bit lines 108.

Referring to FIG. 16B, an optional selective deposition process can be performed to grow an optional metallic capping material from physically exposed surfaces of the bit lines 108 and the additional bit-line-level metal interconnect structures (106, 104) while suppressing growth of the metallic capping material from the physically exposed dielectric surfaces of the etch stop dielectric layer 120. Metallic capping material strips 108C can be formed on the top surfaces of the metallic liners 108A and the metallic fill material portions 108B, and can be incorporated into a respective one of the bit lines 108. Thus, each bit line 108 may comprise a metallic liner 108, a metallic fill material portion 108B, and a metallic capping material strip 108C. Likewise, each additional bit-line-level metal interconnect structures (106, 104) may comprise a respective metallic liner 108, a respective metallic fill material portion 108B, and a respective metallic capping material portion.

In one embodiment, the selective deposition process may comprise an area selective deposition process such as a selective chemical vapor deposition process. Alternatively, the selective deposition process may comprise a selective electroless or electroplating process. The metallic capping material strips 108C comprise a metal that can be selectively deposited (such as Co, W, Mo, Ru, Ni, NiAl, CoW or CoWP). The thickness of the metallic capping material strips 108C can be selected such that the top surfaces of the metallic capping material strips 108C is formed below the horizontal plane including the top surface of the etch stop dielectric layer 120. The thickness of the metallic capping material strips 108C may be in a range from range from 1 nm to 70 nm, such as from 2 nm to 40 nm, although lesser and greater thicknesses may also be employed.

Each bit line 108 within the one-dimensional array of bit lines 108 comprises a metallic capping material strip 108C contacting top surfaces of a metallic liner 108A and a metallic fill material portion 108B and contacting sidewalls of the etch stop dielectric layer 120. Alternatively, the metallic capping material strip 108C may be omitted. Each bit line 108 within the one-dimensional array of bit lines 108 has a respective top surface located above a horizontal plane including the bottom surface of the etch stop dielectric layer 120 and located below a horizontal plane including the top surface of the etch stop dielectric layer 120.

Referring to FIG. 16C, a dielectric material is deposited in volumes of the bit-line trenches 107 that remain after formation of the bit lines 108. The dielectric material can comprise silicon oxide, silicon nitride, silicon oxynitride, or organosilicate glass. In one embodiment, the dielectric material may comprise the same material as a via-level dielectric layer to be subsequently formed above the etch stop dielectric layer 120. The deposited dielectric material can be subsequently planarized by removing portions of the deposited dielectric material from above the horizontal plane including the top surface of the etch stop dielectric layer 120. In one embodiment, a chemical mechanical polishing process can be performed to remove the portions of the deposited dielectric material from above the horizontal plane including the top surface of the etch stop dielectric layer 120. Each remaining portion of the deposited dielectric material constitutes a capping dielectric strip 130. In one embodiment, each of the capping dielectric strips 130 can have a top surface located within the horizontal plane including the top surface of the etch stop dielectric layer 120.

Generally, the capping dielectric strips 130 comprise a dielectric material providing a higher etch rate during a subsequent anisotropic etch process than the etch stop dielectric layer 120. In one embodiment, the capping dielectric strips 130 may comprise a dielectric material selected from silicon oxide, silicon nitride, or silicon oxynitride, and the etch stop dielectric layer 120 may comprise a material selected from nitrogen-doped organosilicate glass, silicon carbide nitride, and carbon-doped silicon oxide. The thickness of the capping dielectric strips 130 may be in a range from 1 nm to 60 nm, such as from 3 nm to 30 nm, although lesser and greater thicknesses may also be employed.

In one embodiment, each of the capping dielectric strips 130 may have a bottom surface located above the horizontal plane including the bottom surface of the etch stop dielectric layer 120, and may have a top surface located within the horizontal plane including the top surface of the etch stop dielectric layer 120. The combination of all structures filling a bit-line trench 107 constitutes a bit-line-trench fill structure (108, 130). Each of the bit-line-trench fill structures (108, 130) comprises a stack of a bit line 108 and a capping dielectric strip 130. Each of the bit lines is electrically connected to a respective subset of drain regions 63 within the two-dimensional array of drain regions 63. Generally, a one-dimensional array of bit lines 108 can be electrically connected to a respective subset of drain regions 63 within the two-dimensional array of drain regions 63. The one-dimensional array of bit lines 108 is embedded within a vertical layer stack including the bit-line-level dielectric layer 110 and the etch stop dielectric layer 120. Each of the bit lines 108 is contacted by a bottom surfaces of a respective capping dielectric strip 130.

FIGS. 17A-17D are sequential vertical cross-sectional views of a region of the exemplary structure during formation of at least one via-level dielectric layer 150 and bit-line-contact via structures 168 according to an embodiment of the present disclosure. While a region including a single bit-line-contact via structure 168 is illustrated, it is understood that a bit-line-contact via structure 168 can be formed on each bit line 108. Further, it is understood that additional contact via structures (not shown) can be formed through the at least one via-level dielectric layer 150 on the additional bit-line-level metal interconnect structures (106, 104).

Figure 17A:
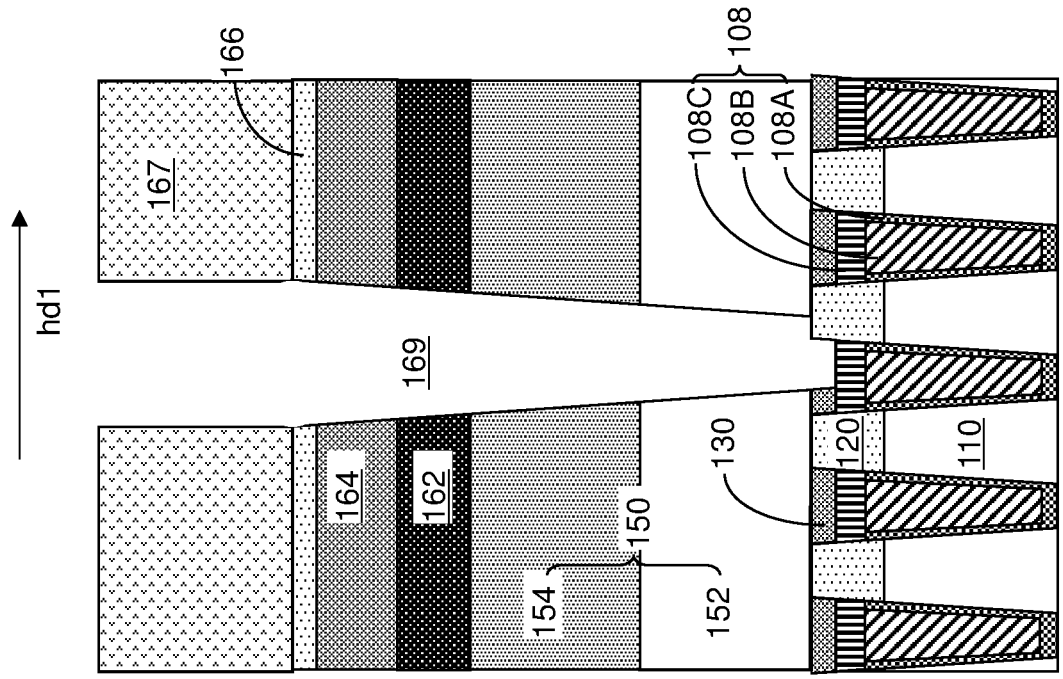
FIGS. 17A-17D are sequential vertical cross-sectional views of a region of the exemplary structure during formation of at least one via-level dielectric layer and bit-line-contact via structures according to an embodiment of the present disclosure.

Referring to FIG. 17A, at least one via-level dielectric layer 150 can be formed over the vertical layer stack of the bit-line-level dielectric layer 110 and the etch stop dielectric layer 120. In one embodiment, the at least one via-level dielectric layer 150 may comprise a first via-level dielectric layer 152 and a second via-level dielectric layer 154. Alternatively, the at least one via-level dielectric layer 150 may include only one via-level dielectric layer. In one embodiment, the first via-level dielectric layer 152 may include silicon nitride and the second via-level dielectric layer 154 may include silicon oxide. In another embodiment, the first via-level dielectric layer 152 may include silicon oxide and the second via-level dielectric layer 154 may include silicon nitride. The thickness of the first via-level dielectric layer 152 may be in a range from 30 nm to 600 nm, such as from 600 nm to 300 nm, although lesser and greater thicknesses may also be employed. The thickness of the second via-level dielectric layer 154 may be in a range from 30 nm to 600 nm, such as from 600 nm to 300 nm, although lesser and greater thicknesses may also be employed.

In one embodiment, the capping dielectric strips 130 comprise a same material as one of the at least one via-level dielectric layer 150, and the etch stop dielectric layer 120 comprises a material that is different from any material within the at least one via-level dielectric layer 150. Generally, each of the at least one via-level dielectric layer 150 may comprise, and/or may consist essentially of, at least one dielectric material selected from silicon oxide, silicon nitride, or silicon oxynitride, and the etch stop dielectric layer 120 comprises a material selected from nitrogen-doped organosilicate glass, silicon carbide nitride, and carbon-doped silicon oxide.

Lithographic material layers (162, 164, 166, 167) may be formed over the at least one via-level dielectric layer 150. In one embodiment, the lithographic material layers (162, 164, 166, 167) includes at least a photoresist layer 167 and optionally includes additional temporary material layers that can be employed to enable printing of a high-density via patterns. In an illustrative example, the lithographic material layers (162, 164, 166, 167) may include, from bottom to top, a carbon hard mask layer 162, a dielectric hard mask layer 164, a bottom anti-reflective coating (BARC) layer 166, and the photoresist layer 167. The carbon hard mask layer 162 can include amorphous carbon or diamond-like carbon, and can have a thickness in a range from 30 nm to 200 nm, although lesser and greater thicknesses may also be employed. The dielectric hard mask layer 164 can include silicon oxide, silicon nitride, or silicon oxynitride, and can have a thickness in a range from 10 nm to 100 nm, although lesser and greater thicknesses may also be employed. The BARC layer 166 can include amorphous silicon, and can have a thickness in a range from 10 nm to 100 nm, although lesser and greater thicknesses may also be employed. The photoresist layer 167 can include a photoresist material such as an extreme ultraviolet (EUV) photoresist material or a deep ultraviolet (DUV) photoresist material.

The photoresist layer 167 can be lithographically patterned to form discrete openings such that each opening overlies a respective one of the bit lines 108. Generally, a patterned photoresist layer 167 can be formed over the at least one via-level dielectric layer 150. The pattern of the openings in the photoresist layer 167 can be selected such that each opening in the photoresist layer 167 overlies a respective one of the bit lines 108 and does not overlie any adjacent bit line 108. A non-zero overlay error may be introduced during the alignment of the pattern of the openings in the photoresist layer 167 with the bit lines 108.

Figure 17B:
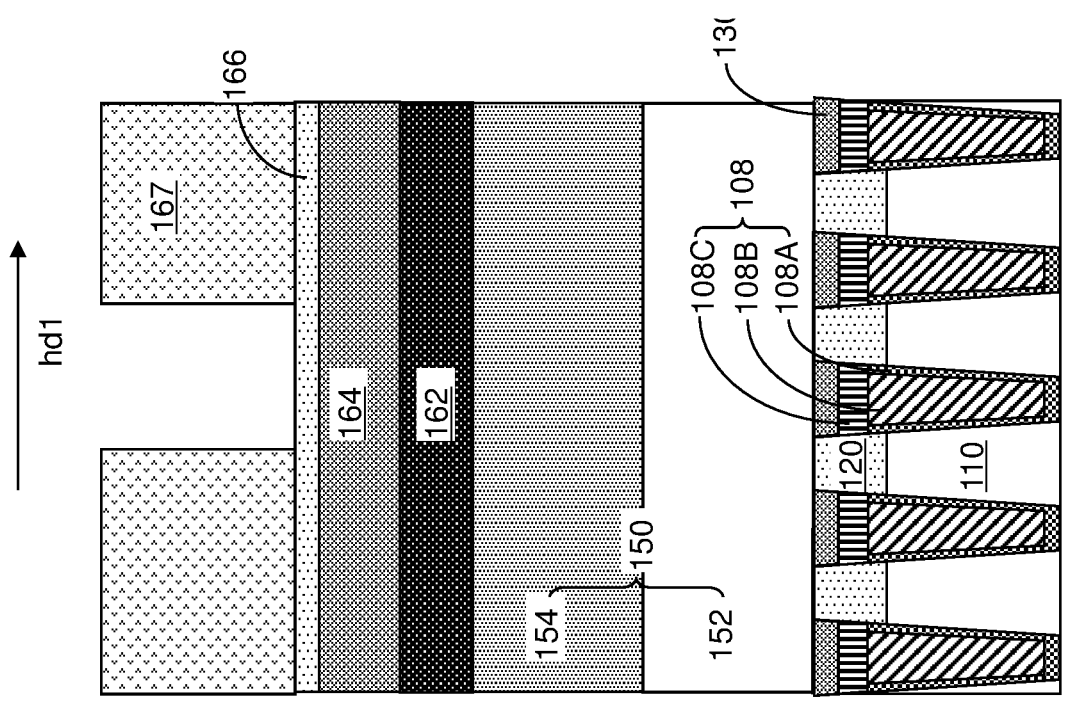

Referring to FIG. 17B, an anisotropic etch process can be performed to anisotropically etch a region of the at least one via-level dielectric layer 150 and a region of the one of the capping dielectric strips 130 that are located underneath each opening in the patterned photoresist layer 167. In one embodiment, the anisotropic etch process has an etch chemistry that etches each material within the at least one via-level dielectric layer 150 and a material within the capping dielectric strips 130 selective to the material of the etch stop dielectric layer 120. In one embodiment, the anisotropic etch process may have an etch chemistry based on hydrofluorocarbons and/or hydrochlorocarbons.

Discrete via cavities are formed through the at least one via-level dielectric layer 150 and a region of the one of the capping dielectric strips 130 that underlie the openings in the photoresist layer 167. The discrete via cavities are herein referred to as bit-line-contact via cavities 169. According to an embodiment of the present disclosure, the bottommost portion of each of the bit-line-contact via cavities 169 may be formed entirely within the areas of the bottom surfaces of capping dielectric strips 130 and outside the areas of the top surface of the etch stop dielectric layer 120 by preventing formation of the bit-line-contact via cavities 169 through the material of the etch stop dielectric layer 120. In other words, the etch stop dielectric layer 120 provides sufficient etch resistance to the etch chemistry of the anisotropic etch process so that the bottommost portion of the bit-line-level via cavities 169 are formed outside the areas of the top surface of the etch stop dielectric layer 120.

In one embodiment, the overlay between the pattern of the discrete openings in the photoresist layer 167 and the bit lines 108 may have a finite overlay error such that not every bit-line-contact via cavity 169 is centered at a geometrical center of an underlying bit line 108. In this case, one or more of the bit-line-contact via cavities 169 may comprise a stepped bottom surface including a top surface of one of the bit lines 108, a sidewall segment of the etch stop dielectric layer 120, and a segment of a top surface of the etch stop dielectric layer 120. The width of the physically exposed segment of the top surface of a bit line 108 that underlies such a bit-line-contact via cavity 169 can be less than the full width of the bit line 108, and a capping dielectric strip 130 can cover another segment of the top surface of the bit line 108. A sidewall of the capping dielectric strip 130 may be physically exposed to such a bit-line-contact via cavity 169 in a vertical cross-sectional view that is perpendicular to the second horizontal direction hd2. In one embodiment, sidewalls of each bit-line-contact via cavity 169 may extend straight from the bottom surface of the at least one via-level dielectric layer 150 to the top surface of the BARC layer 166. The photoresist layer 167 can be subsequently removed, for example, by ashing.

Figure 17C:
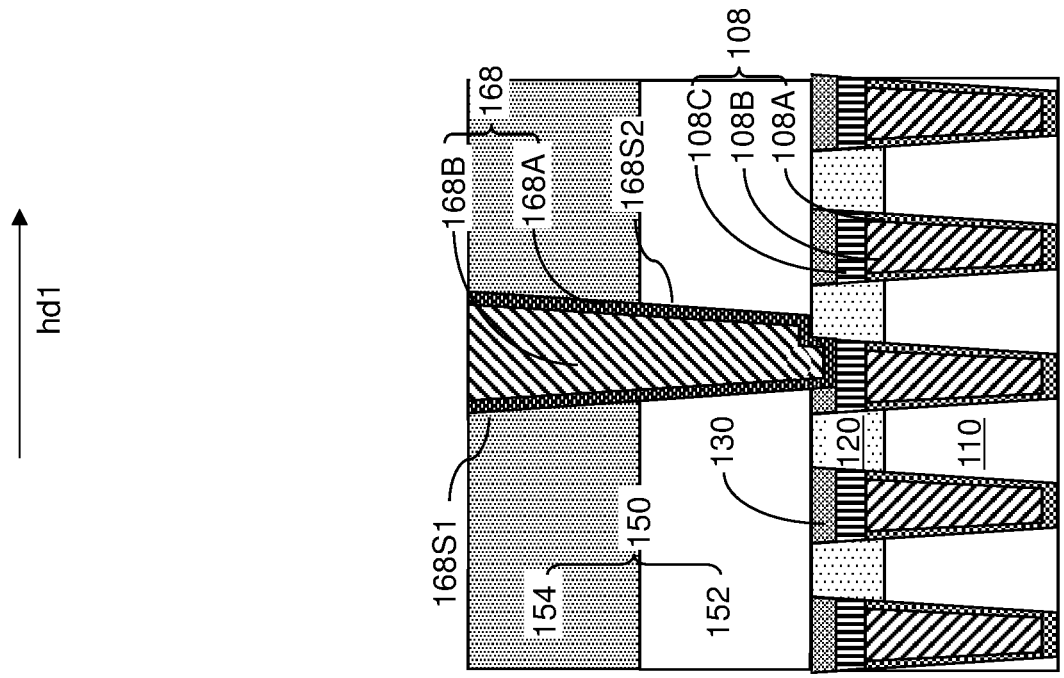

Referring to FIG. 17C, a continuous via metallic liner 168L comprising a metal, a metallic nitride material or a metallic carbide material can be deposited on physically exposed sidewalls of the at least one via-level dielectric layer 150, the carbon hard mask layer 162, the dielectric hard mask layer 164, and the BARC layer 166 and over the BARC layer 166. For example, the continuous via metallic liner 168L may include, and/or may consist essentially of, ruthenium, cobalt, nickel, titanium, tantalum, titanium nitride, tantalum nitride, tungsten nitride, titanium carbide, tantalum carbide, and/or tungsten carbide. The continuous via metallic liner 168L can be deposited by chemical vapor deposition or physical vapor deposition. The lateral thickness of portions of the continuous via metallic liner 168L over sidewalls of the at least one via-level dielectric layer 150 may be in a range from 2 nm to 20 nm, such as from 4 nm to 10 nm, although lesser and greater thicknesses may also be employed.

A via fill material layer 168F can be deposited over the continuous via metallic liner 168L. The via fill material layer 168F comprises, and/or consists essentially of, a material selected from tungsten, titanium, tantalum, molybdenum, ruthenium, cobalt, nickel, aluminum, copper, or alloys thereof. The via fill material layer 168F can be deposited by electroplating, electroless plating, physical vapor deposition, and/or chemical vapor deposition. The via fill material layer 168F can fill remaining unfilled volumes of the bit-line-contact via cavities 169.

Figure 17D:
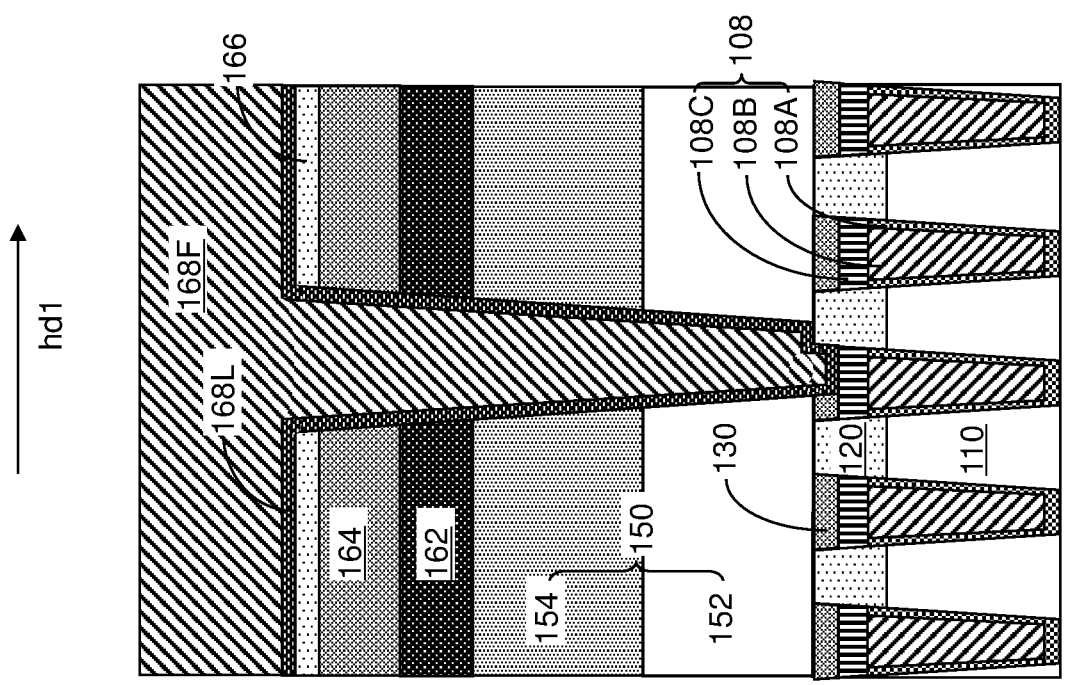
Figure 17E:
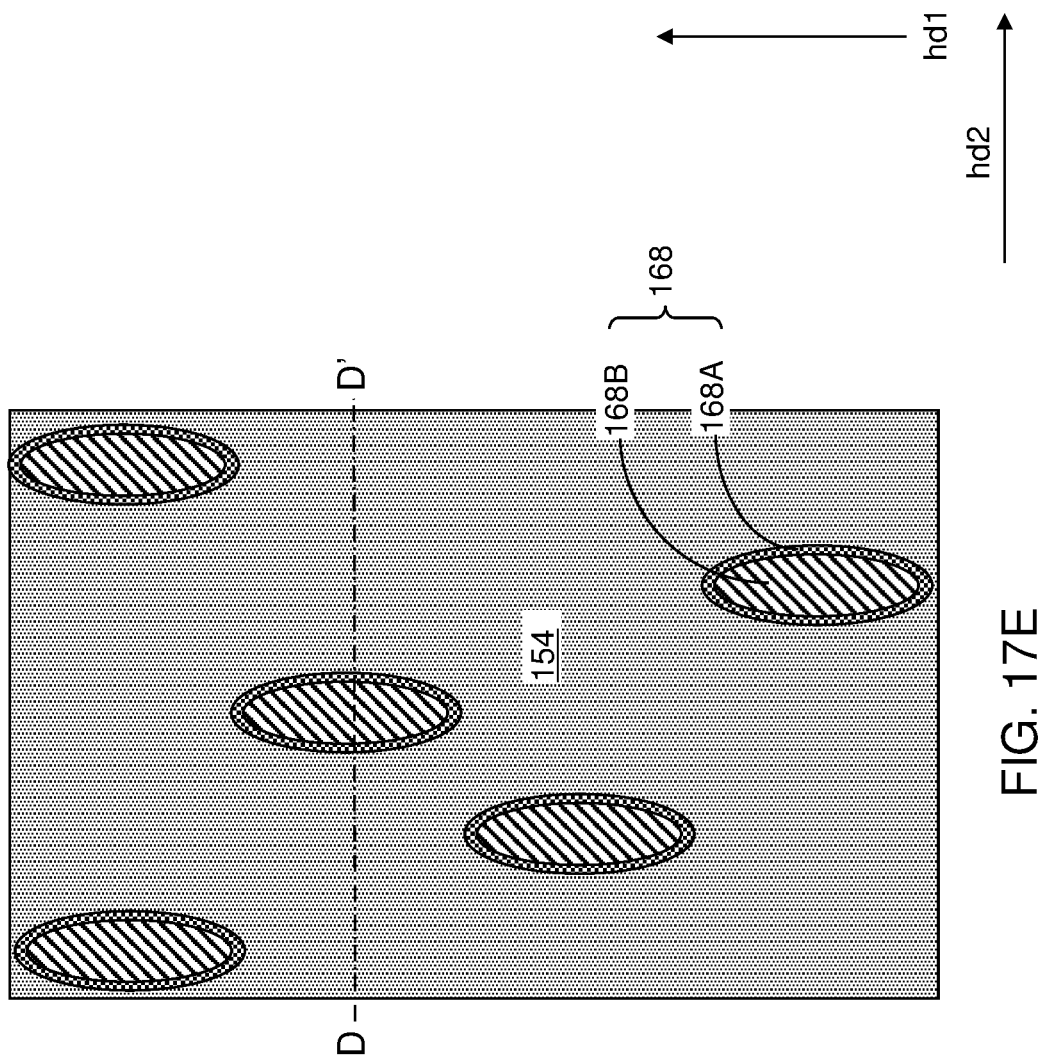
FIG. 17E is a top-down view of the region of the exemplary structure after formation of the bit-line-contact via structures. The vertical plane D-D' is the plane of the schematic vertical cross-sectional view of FIG. 17D.

Referring to FIGS. 17D and 17E, a chemical mechanical polishing process can be performed to remove portions of the via fill material layer 168F and the continuous via metallic liner 168L, the BARC layer 166, the dielectric hard mask layer 164, and the carbon hard mask layer 162 from above the horizontal plane including the top surface of the at least one via-level dielectric layer 150. Each remaining portion of the continuous via metallic liner 168L comprises a via metallic liner 168A. Each remaining portion of the via fill material layer 168F comprises a via fill material portion 168B. Each contiguous combination of a via metallic liner 168A and a via fill material portion 168B located within a same bit-line-contact via cavity 169 constitutes a bit-line-contact via structure 168. A two-dimensional array of bit-line-contact via structures 168 can be formed within the at least one via-level dielectric layer 150. The bit-line-contact via structures 168 can have top surfaces within the horizontal plane including the top surface of the at least one via-level dielectric layer 150.

In one embodiment, each bit-line-contact via structures 168 within a two-dimensional array of bit-line-contact via structures 168 comprises a via metallic liner 168A comprising a metal, a metallic nitride material or a metallic carbide material and contacting sidewalls of the at least one via-level dielectric layer 150, a sidewall of the etch stop dielectric layer 120, and a sidewall of a capping dielectric strip 130, and a via fill material portion 168B embedded within the via metallic liner 168A, contacting inner sidewalls and a stepped surface of a bottom portion of the via metallic liner 168A, and laterally spaced from the at least one via-level dielectric layer 150, the etch stop dielectric layer 120 and the capping dielectric strip 130. In one embodiment, the via metallic liner 168A comprises a conductive metallic barrier material and contacts the top surface of an underlying bit line 108 within the one-dimensional array of bit lines 108, contacts a sidewall segment of the etch stop dielectric layer 120, and contacts a segment of the top surface of the etch stop dielectric layer 120.

Generally, a bit-line-contact via structure 168 may vertically extend through the at least one via-level dielectric layer 150 and through one of the capping dielectric strips 130, and may contact a top surface of a bit line 108 within the one-dimensional array of bit lines 108, may contact a sidewall segment of the etch stop dielectric layer 120, and may contact a segment of a top surface of the etch stop dielectric layer 120. In one embodiment, a bit-line-contact via structure 168 may comprise a first straight sidewall 168S1 that vertically extends from a top surface of the at least one via-level dielectric layer 150 to the top surface of the bit line 108, and a second straight sidewall 168S2 that vertically extends from the top surface of the at least one via-level dielectric layer 150 to a periphery of a segment of the top surface of the etch stop dielectric layer 120 and not extending below the top surface of the etch stop dielectric layer 120.

In one embodiment, a bit line 108 within the one-dimensional array of bit lines 108 may comprise a top surface having a closed periphery (such as a rectangular periphery). A first segment of the closed periphery of the bit line 108 may coincide with a periphery of a bottom surface of one of the capping dielectric strips 130. A second segment of the closed periphery of the bit line 108 coincides with a segment of a bottom periphery of a bit-line-contact via structure 168 that laterally extends straight along a horizontal direction such as the second horizontal direction hd2.

FIG. 18 is a schematic side cross-sectional view of a bonded assembly according to an embodiment of the present disclosure. In this embodiment, the peripheral device region may comprise a peripheral die 200 in which the semiconductor devices 700 for the peripheral circuitry are formed on a separate substrate 209 from the substrate 9 of the three-dimensional memory device 400 containing the memory array region 100. The three-dimensional memory device (i.e., memory die) 400 is bonded to the peripheral die 200 along a bonding interface 402.

The peripheral die 200 includes the semiconductor devices 700 for the peripheral circuitry located on substrate 209, peripheral interconnects 278 embedded in a peripheral dielectric layer 260, peripheral die bonding pads 288 electrically connected to the semiconductor devices 700 through the peripheral interconnects. The memory die 400 includes memory interconnects 178 embedded in a memory dielectric layer 160. Memory die bonding pads 188 are bonded to the peripheral die bonding pads 288. The memory die bonding pads 188 are electrically connected to the drain regions 63 through the memory interconnects 178 and the structures 168, 108, 98 and 88 described above.

Referring to all drawings and according to various embodiments of the present disclosure, a memory device is provided, which comprises: an alternating stack of insulating layers 32 and word lines 46; memory opening fill structures 58 extending through the alternating stack, wherein each of the memory opening fill structures 58 comprises a memory element 54, a vertical semiconductor channel 60 and a drain region 63 connected to an upper end of the semiconductor channel; bit lines 108 electrically connected to a respective subset of the drain regions 63, wherein the bit lines are embedded within a vertical layer stack including a bit-line-level dielectric layer 110 and an etch stop dielectric layer 120, wherein each of the bit lines is contacted by a bottom surfaces of a respective capping dielectric strip 130; at least one via-level dielectric layer 150 overlying the vertical layer stack; and a bit-line-contact via structure 168 vertically extending through the at least one via-level dielectric layer 150 and through one of the capping dielectric strips 130 and contacting a top surface of a respective one of the bit lines 108, contacting a sidewall segment of the etch stop dielectric layer 120, and contacting a segment of a top surface of the etch stop dielectric layer 120.

In one embodiment, each of the capping dielectric strips 130 has a top surface located within a horizontal plane including a top surface of the etch stop dielectric layer 120.

In one embodiment, each of the capping dielectric strips 130 has a bottom surface located above a horizontal plane including a bottom surface of the etch stop dielectric layer 120.

In one embodiment, each of the bit lines 108 has a respective top surface located above a horizontal plane including a bottom surface of the etch stop dielectric layer 120. In one embodiment, each of the bit lines 108 comprises: a metallic liner 108A comprising a metal, a metallic nitride material or a metallic carbide material and contacting sidewalls of the bit-line-level dielectric layer 110 and sidewalls of the etch stop dielectric layer 120; and a metallic fill material portion 108B embedded within the metallic liner 108A and laterally spaced from the bit-line-level dielectric layer 110 and the etch stop dielectric layer 120.

In one embodiment, the metallic liner 108A and the metallic fill material portion 108B comprise a respective top surface located above the horizontal plane including the bottom surface of the etch stop dielectric layer 120.

In one embodiment, each of the bit lines 108 further comprises a metallic capping material strip 108C contacting top surfaces of the metallic liner 108A and the metallic fill material portion 108B and contacting the etch stop dielectric layer 120. The metallic fill material portion comprises copper 108; and the metallic capping material strip 108C comprises ruthenium, cobalt, nickel, aluminum, a nickel-aluminum alloy, a cobalt-tungsten-boron alloy, or a cobalt-tungsten-phosphorus alloy.

In one embodiment, the capping dielectric strips 130 comprise a same material as one of the at least one via-level dielectric layer 150; and the etch stop dielectric layer 120 comprises a material having a dielectric constant below 3.9 and that is different from any material within the at least one via-level dielectric layer 150.

In one embodiment, the at least one via-level dielectric layer 150 comprises at least one dielectric material selected from silicon oxide, silicon nitride, or silicon oxynitride; and the etch stop dielectric layer 120 comprises a material selected from nitrogen-doped organosilicate glass, silicon carbide nitride, or carbon-doped silicon oxide.

In one embodiment, the bit-line-contact via structure 168 comprises: a via metallic liner 168A comprising a conductive metallic barrier material and contacting the top surface of a respective one of the bit lines 108, contacting the sidewall segment of the etch stop dielectric layer 120, and contacting the segment of the top surface of the etch stop dielectric layer 120; and a via fill material portion 168B contacting an inner sidewall of the via metallic liner 168A and laterally spaced from the at least one via-level dielectric layer 15 by the via metallic liner 168A.

In one embodiment shown in FIG. 18, the memory device further comprises memory die bonding pads 178 which are electrically connected to the drain regions 63; and a peripheral die 200 containing peripheral semiconductor devices 700 for the memory device and peripheral die bonding pads 278 bonded to the memory die bonding pads 178 and electrically connected to the peripheral semiconductor devices 700.

The various embodiments of the present disclosure may be employed to provide bit-line-contact via structures 168 that are self-aligned to the underlying bit lines 108. A portion of each bit-line-contact via structure 168 that may have an areal overlap with an adjacent bit line 108 is vertically spaced from the adjacent bit line 108 by the etch stop dielectric layer 120, and only an area of the bit-line-contact via structure 168 that has an areal overlap with an underlying bit line 108 includes a downward-protruding portion of the bit-line-contact via structure 168 to provide electrical and physical contact with the underlying bit line 108. Thus, electrical shorts between the bit-line-contact via structure 168 and adjacent bit lines 108 can be reduced or prevented by increasing the vertical distance between the bit lines 108 and the bit-line-contact via structure 168 by inserting the etch stop dielectric layer 120 and the capping dielectric strips 130. This configuration may also decrease the bit line RC delay and leakage current. Furthermore, the electromigration resistance and contact resistance of the bit-line-contact via structure 168 may be improved by increasing the width of the opening 169.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device, comprising:
    an alternating stack of insulating layers and word lines;
    memory opening fill structures extending through the alternating stack, wherein each of the memory opening fill structures comprises a memory element, a vertical semiconductor channel and a drain region connected to an upper end of the semiconductor channel;
    bit lines electrically connected to a respective subset of the drain regions, wherein the bit lines are embedded within a vertical layer stack including a bit-line-level dielectric layer and an etch stop dielectric layer, wherein each of the bit lines is contacted by a bottom surfaces of a respective capping dielectric strip;
    at least one via-level dielectric layer overlying the vertical layer stack; and
    a bit-line-contact via structure vertically extending through the at least one via-level dielectric layer and through one of the capping dielectric strips and contacting a top surface of a respective one of the bit lines, contacting a sidewall segment of the etch stop dielectric layer, and contacting a segment of a top surface of the etch stop dielectric layer.

2. The memory device of claim 1, wherein each of the capping dielectric strips has a top surface located within a horizontal plane including a top surface of the etch stop dielectric layer.

3. The memory device of claim 1, wherein each of the capping dielectric strips has a bottom surface located above a horizontal plane including a bottom surface of the etch stop dielectric layer.

4. The memory device of claim 1, wherein each of the bit lines has a respective top surface located above a horizontal plane including a bottom surface of the etch stop dielectric layer.

5. The memory device of claim 4, wherein each of the bit lines comprises:
    a metallic liner comprising ruthenium, cobalt, nickel, titanium, tantalum, a metallic nitride material or a metallic carbide material and contacting sidewalls of the bit-line-level dielectric layer and sidewalls of the etch stop dielectric layer; and
    a metallic fill material portion embedded within the metallic liner and laterally spaced from the bit-line-level dielectric layer and the etch stop dielectric layer.

6. The memory device of claim 5, wherein the metallic liner and the metallic fill material portion comprise a respective top surface located above the horizontal plane including the bottom surface of the etch stop dielectric layer.

7. The memory device of claim 5, wherein:
    each of the bit lines further comprises a metallic capping material strip contacting top surfaces of the metallic liner and the metallic fill material portion and contacting the etch stop dielectric layer;
    the metallic fill material portion comprises copper; and
    the metallic capping material strip comprises ruthenium, cobalt, nickel, aluminum, a nickel-aluminum alloy, a cobalt-tungsten-boron alloy, or a cobalt-tungsten-phosphorus alloy.

8. The memory device of claim 1, wherein:
    the capping dielectric strips comprise a same material as one of the at least one via-level dielectric layer; and
    the etch stop dielectric layer comprises a material having a dielectric constant below 3.9 and that is different from any material within the at least one via-level dielectric layer.

9. The memory device of claim 8, wherein:
    the at least one via-level dielectric layer comprises at least one dielectric material selected from silicon oxide, silicon nitride or silicon oxynitride; and the etch stop dielectric layer comprises a material selected from nitrogen-doped organosilicate glass, silicon carbide nitride, or carbon-doped silicon oxide.

10. The memory device of claim 1, wherein the bit-line-contact via structure comprises:
a via metallic liner comprising a conductive metallic barrier material and contacting the top surface of a respective one of the bit lines, contacting the sidewall segment of the etch stop dielectric layer, and contacting the segment of the top surface of the etch stop dielectric layer; and
a via fill material portion contacting an inner sidewall of the via metallic liner and laterally spaced from the at least one via-level dielectric layer by the via metallic liner.

11. The memory device of claim 1, wherein the bit-line-contact via structure comprises:
a first straight sidewall that vertically extends from a top surface of the at least one via-level dielectric layer to the top surface of the bit line; and
a second straight sidewall that vertically extends from the top surface of the at least one via-level dielectric layer to a periphery of the segment of the top surface of the etch stop dielectric layer and not extending below the top surface of the etch stop dielectric layer.

12. The memory device of claim 1, wherein bottom surface of the bit lines is located within a horizontal plane including a bottom surface of the bit-line-level dielectric layer.

13. The memory device of claim 1, wherein:
one of the bit lines comprises a top surface having a closed periphery;
a first segment of the closed periphery of the bit line coincides with a periphery of the one of the capping dielectric strips; and
a second segment of the closed periphery of the bit line coincides with a segment of a bottom periphery of the bit-line-contact via structure that laterally extends straight along a horizontal direction.

14. The memory device of claim 1, further comprising:
memory die bonding pads which are electrically connected to the drain regions; and
a peripheral die containing peripheral semiconductor devices for the memory device and peripheral die bonding pads bonded to the memory die bonding pads and electrically connected to the peripheral semiconductor devices.

15. A method of forming a memory device, comprising:
forming a two-dimensional array of semiconductor channels and a two-dimensional array of drain regions connected to an end of a respective one of the semiconductor channels;
forming a vertical layer stack including a bit-line-level dielectric layer and an etch stop dielectric layer over the two-dimensional array of drain regions;
forming bit-line trenches through the vertical layer stack;
forming bit-line-trench fill structures in the bit-line trenches, wherein each of the bit-line-trench fill structures comprises a stack of a bit line and a capping dielectric strip within each of the bit-line trenches, wherein each of the bit lines is electrically connected to a respective subset of drain regions within the two-dimensional array of drain regions;
forming at least one via-level dielectric layer over the vertical layer stack;
forming a bit-line-contact via cavity through the at least one via-level dielectric layer and one of the capping dielectric strips, wherein the bit-line-contact via cavity comprises a stepped bottom surface including a top surface of one of the bit lines, a sidewall segment of the etch stop dielectric layer, and a segment of a top surface of the etch stop dielectric layer; and
forming a bit-line-contact via structure in the bit-line-contact via cavity.

16. The method of claim 15, wherein:
etch stop dielectric layer has a dielectric constant less than 3.9;
the bit lines are formed by depositing at least one metallic material in the bit-line trenches such that top surfaces of the bit lines are formed below a horizontal plane including a top surface of the etch stop dielectric layer; and
the capping dielectric strips are formed by depositing a dielectric material in volumes of the bit-line trenches that remain after formation of the bit lines.

17. The method of claim 16, further comprising planarizing the deposited dielectric material by removing portions of the deposited dielectric material from above a horizontal plane including a top surface of the etch stop dielectric layer by performing a chemical mechanical polishing process.

18. The method of claim 15, wherein forming the bit lines comprises:
depositing a continuous metallic liner comprising ruthenium, cobalt, nickel, titanium, tantalum, a metallic nitride material or a metallic carbide material on physically exposed sidewalls of the bit-line-level dielectric layer and the etch stop dielectric layer;
depositing a metallic fill material layer over the continuous metallic liner; and
removing upper portions of the metallic fill material layer and the continuous metallic liner such that remaining portions of the metallic fill material layer and the continuous metallic liner comprise combinations of a respective metallic liner and a respective metallic fill material portion having top surfaces below a horizontal plane including a top surface of the etch stop dielectric layer.

19. The method of claim 18, further comprising forming metallic capping material strips on physically exposed top surfaces of the combinations of the respective metallic liner and the respective metallic fill material portion by selective growth of a metallic capping material from metallic surfaces while suppressing growth of the metallic capping material from surfaces of the etch stop dielectric layer.

20. The method of claim 15, further comprising:
forming a memory film surrounding each of the vertical semiconductor channels;
forming a patterned photoresist layer over the at least one via-level dielectric layer, wherein the patterned photoresist layer comprises an opening therein; and
anisotropically etching a region of the at least one via-level dielectric layer and a region of the one of the capping dielectric strips that are located underneath the opening in the patterned photoresist layer by performing an anisotropic etch process, wherein the anisotropic etch process has an etch chemistry that etches each material within the at least one via-level dielectric layer and a material within the capping dielectric strips selective to a material of the etch stop dielectric layer.

* * * * *